(12) United States Patent
Nakazawa et al.

(10) Patent No.: US 7,999,345 B2
(45) Date of Patent: Aug. 16, 2011

(54) SEMICONDUCTOR DEVICE AND MANUFACTURING METHOD THEREOF

(75) Inventors: Yoshito Nakazawa, Tokyo (JP); Hitoshi Matsuura, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 212 days.

(21) Appl. No.: 12/400,436

(22) Filed: Mar. 9, 2009

(65) Prior Publication Data

US 2009/0256197 A1    Oct. 15, 2009

(30) Foreign Application Priority Data

Apr. 9, 2008 (JP) ................. 2008-101242

(51) Int. Cl.
*H01L 29/47* (2006.01)
(52) U.S. Cl. ......... 257/471; 257/E27.015; 257/E29.013; 257/E29.338; 257/21.41; 257/21.351
(58) Field of Classification Search .......... 257/334, 257/E27.016, E21.41, 471, E29.013, E29.338, 257/E21.351; 438/237, 259, 589
See application file for complete search history.

(56) References Cited

U.S. PATENT DOCUMENTS

| | | | | |
|---|---|---|---|---|
| 4,871,686 A * | 10/1989 | Davies | | 438/328 |
| 5,856,692 A | 1/1999 | Williams et al. | | |
| 6,262,460 B1 * | 7/2001 | Kalnitsky et al. | | 257/402 |
| 6,351,018 B1 | 2/2002 | Sapp | | |
| 2003/0080355 A1 | 5/2003 | Shirai et al. | | |
| 2005/0230745 A1 * | 10/2005 | Fatemizadeh et al. | | 257/330 |
| 2007/0221952 A1 * | 9/2007 | Thorup et al. | | 257/155 |

FOREIGN PATENT DOCUMENTS

| JP | 2997247 | 10/1999 |
|---|---|---|
| JP | 2003-133557 | 5/2003 |

OTHER PUBLICATIONS

Wolf et al., "Silicon Processing for the VLSI Era", 2000, Lattice Press, pp. 324-331.*
Kwok, "Complete guide to semiconductor devices", 2002, Wiley-Interscience, pp. 31-41.*

* cited by examiner

*Primary Examiner* — Thomas L Dickey
*Assistant Examiner* — Nikolay Yushin
(74) *Attorney, Agent, or Firm* — Mattingly & Malur, PC

(57) ABSTRACT

Provided is a technology, in a semiconductor device having a power MISFET and a Schottky barrier diode on one semiconductor substrate, capable of suppressing a drastic increase in the on-resistance of the power MISFET while making the avalanche breakdown voltage of the Schottky barrier diode greater than that of the power MISFET. In the present invention, two epitaxial layers, one having a high doping concentration and the other having a low doping concentration, are formed over a semiconductor substrate and the boundary between these two epitaxial layers is located in a region equal in depth to or shallower than the bottom portion of a trench.

24 Claims, 29 Drawing Sheets

FORWARD CHARACTERISTIC

REVERSE CHARACTERISTIC $\phi bn = 0.65 eV (TiW)$
$\phi bn = 0.65 eV (TiN/Ti)$

| POWER MISFET FORMATION REGION | SBD FORMATION REGION | POWER MISFET FORMATION REGION |

| POWER MISFET FORMATION REGION | SBD FORMATION REGION | POWER MISFET FORMATION REGION |

US 7,999,345 B2

SEMICONDUCTOR DEVICE AND MANUFACTURING METHOD THEREOF

CROSS-REFERENCE TO RELATED APPLICATIONS

The disclosure of Japanese Patent Application No. 2008-101242 filed on Apr. 9, 2008 including the specification, drawings and abstract is incorporated herein by reference in its entirety.

BACKGROUND OF THE INVENTION

The present invention relates to a semiconductor device and a manufacturing technology thereof. In particular, the invention pertains to a semiconductor device obtained by forming a trench gate type power MISFET (Metal Insulator Semiconductor Field Effect Transistor) and a Schottky barrier diode over one semiconductor substrate and a technology effective when applied to the manufacture of the semiconductor device.

Japanese Patent No. 2997247 (Patent Document 1) describes a technology of forming a trench gate type power MISFET, a clamping diode, and a Schottky diode over one semiconductor substrate. An object of this technology is to set the avalanche breakdown voltage of the clamping diode lower than the avalanche breakdown voltage of a body diode incorporated in the power MISFET, thereby improving the avalanche capability of the entire semiconductor device.

To fulfill the object, a heavily-doped epitaxial region (Nepi1) is formed over the semiconductor substrate (N+ substrate) and a lightly-doped epitaxial region (Nepi2) is formed over this heavily-doped epitaxial region (Nepi1) in Patent Document 1. A boundary between the heavily-doped epitaxial region (Nepi1) and the lightly-doped epitaxial region (Nepi2) is formed at a position deeper than the trench of the power MISFET. In a clamping diode formation region, a deep P+ layer (deep protective P+ diffusion portion 38) is formed and this deep P+ layer is brought into contact with the heavily-doped epitaxial region (Nepi1) to form a clamping diode having an avalanche breakdown voltage lower than the avalanche breakdown voltage of the body diode of the power MISFET.

In a Schottky barrier diode formation region, on the other hand, the Schottky barrier diode is made of the lightly-doped epitaxial region (Nepi2) and a metal layer (Schottky metal layer 41) formed over this lightly-doped epitaxial region (Nepi2). Also in this Schottky barrier diode formation region, a boundary between the lightly-doped epitaxial region (Nepi2) and the highly-doped epitaxial region (Nepi1) is formed at a position deeper than the trench of the power MISFET. Although the Schottky barrier diode is formed between trenches, the lightly-doped epitaxial region (Nepi2) formed between the trenches is fully depleted by decreasing the distance between these trenches. This improves the avalanche breakdown voltage of the Schottky barrier diode.

U.S. Pat. No. 6,351,018 (Patent Document 2) describes a technology of forming a trench-gate type power MISFET and a Schottky barrier diode over one semiconductor substrate. An object of the technology described in Patent Document 2 is to make an avalanche breakdown voltage of the Schottky barrier diode higher than the avalanche breakdown voltage of the power MISFET. In order to achieve this object, the distance between trenches having the Schottky barrier diode sandwiched therebetween narrower than the distance between the trenches having therebetween cells in which the power MISFET has been formed. Narrowing of the distance between trenches sandwiching the Schottky barrier diode therebetween is effective for reducing the field intensity on the surface of an epitaxial region in which a Schottky junction is formed (RESURF effect). This leads to improvement in avalanche capability of the Schottky barrier and as a result, enables to make the avalanche breakdown voltage of the Schottky barrier diode higher than the avalanche breakdown voltage of the power MISFET.

Japanese Patent Laid-Open No. 2003-133557 (Patent Document 3) describes a technology of forming a trench gate type power MISFET and a Schottky barrier diode over one semiconductor substrate. According to the technology described in this Patent Document 3, the avalanche breakdown voltage of the Schottky barrier diode is made higher than the avalanche breakdown voltage of the power MISFET. Described specifically, an n$^-$ type semiconductor layer (1b) is formed over a semiconductor substrate. In a Schottky barrier diode formation region, an electrode (14) is formed over this n$^-$ type semiconductor layer (1b) to form a Schottky barrier diode. In the power MISFET formation region, on the other hand, the n$^-$ type semiconductor layer (1b) and a p$^-$ type semiconductor region (4) which is a channel region are not brought into contact, but an n type semiconductor region (17) is formed so as to be brought into direct contact with the p$^-$ type semiconductor region (4) which is a channel region. This n type semiconductor region (17) is formed so as to have a doping concentration higher than that of the n$^-$ type semiconductor layer (1b). By employing such a configuration, the avalanche breakdown voltage of the power MISFET is determined by a pn junction between the n type semiconductor region (17) and the p$^-$ type semiconductor region (4) which is a channel region. Since the doping concentration of the n type semiconductor region (17) forming a pn junction with the channel region (p$^-$ type semiconductor region (4)) of the power MISFET is higher than that of the n$^-$ type semiconductor layer (1b) configuring the Schottky barrier diode, the avalanche breakdown voltage of the Schottky barrier diode can be made higher than the avalanche breakdown voltage of the power MISFET.

SUMMARY OF THE INVENTION

For example, electronic appliances such as personal computers use a DC/DC converter for converting the voltage of a DC power supply from one voltage level to another one. For this DC/DC converter, a power MISFET is used as a switching element, and a Schottky barrier diode is used from the standpoint of reducing a loss of circuit. For DC/DC converters, there is, for example, a semiconductor device having a power MISFET and a Schottky barrier diode on one semiconductor substrate. In such a semiconductor device, an epitaxial layer is formed on the semiconductor substrate, followed by the formation of the power MISFETE and the Schottky barrier diode on the epitaxial layer. Described specifically, a metal film is formed on the epitaxial layer in a first region (Schottky barrier diode formation region) of the semiconductor substrate and by a Schottky junction obtained by the contact between the epitaxial layer and the metal film, a Schottky barrier diode is formed. In a second region (power MISFET formation region) of the semiconductor substrate, on the other hand, a trench is formed in the epitaxial layer and the trench is filled with a conductor film to form a gate electrode. Further, a channel region is formed in the epitaxial layer and a source region is formed above this channel region. In the power MISFET having such a configuration, when a predetermined voltage is applied to the gate electrode, an inversion layer is formed in the channel region on the side surface of the trench in which the gate electrode has been formed and this inversion layer contributes to conduction between the source region and the epitaxial layer. In short, electrons from the source region pass through the inversion layer and the epitaxial layer and reach the semiconductor substrate and then, reach a drain electrode formed on the backside of the semiconductor substrate, whereby the power MISFET is turned ON.

From the above description, it is apparent that the epitaxial layer functions as a current-flowing drift layer from the viewpoint of the power MISFET, while it functions as a semiconductor layer forming a Schottky junction from the viewpoint of the Schottky barrier diode. Since an electric current of the power MISFET passes through the epitaxial layer, it is therefore desired to have low resistance (low on-resistance).

The power MISFET and the Schottky barrier diode have been formed on one semiconductor substrate and both of these elements have an avalanche breakdown voltage. For example, the avalanche breakdown voltage of the power MISFET is determined by a pn junction between the epitaxial layer and the channel region. The avalanche breakdown voltage of the Schottky barrier diode is, on the other hand, determined by the doping concentration of the epitaxial layer which is a semiconductor layer forming a Schottky junction. From the standpoint of obtaining a semiconductor device having improved reliability, the avalanche breakdown voltage of the Schottky barrier diode is desirably higher than the avalanche breakdown voltage of the power MISFET.

For example, when the avalanche breakdown voltage of the power MISFET is lower than the avalanche breakdown voltage of the Schottky barrier diode, breakdown occurs at the pn junction (between epitaxial layer and channel formation region) in the bulk, making it difficult to cause characteristics variations of the semiconductor device. On the other hand, when the avalanche breakdown voltage of the Schottky barrier diode is lower than the avalanche breakdown voltage of the power MISFET, characteristics variations of the semiconductor device are likely to occur due to carriers generated by avalanche breakdown which has occurred on the surface of the epitaxial layer because Schottky junction is present at the surface of the epitaxial layer. This means that characteristics variations have a greater influence on the entire semiconductor device when the avalanche breakdown occurs on the surface of the epitaxial layer than when the avalanche breakdown occurs inside the epitaxial layer, leading to deterioration in the reliability of the semiconductor device. It is therefore necessary to make the avalanche breakdown voltage of the Schottky barrier diode higher than the avalanche breakdown voltage of the power MISFET.

Improvement of avalanche capability of the Schottky barrier diode can be achieved by reducing the doping concentration of the epitaxial layer forming a Schottky junction. As described above, however, the epitaxial layer functions as a drift layer of the power MISFET so that the on-resistance of the power MISFET should be reduced. From the viewpoint of reducing the on-resistance of the power MISFET, the doping concentration of the epitaxial layer should be raised. This suggests that the improvement of avalanche capability of the Schottky barrier diode and reduction in the on-resistance of the power MISFET is in a trade-off relationship.

An object of the invention is to provide a technology, in a semiconductor device having a power MISFET and a Schottky barrier diode on one semiconductor substrate, of making the avalanche breakdown voltage of the Schottky barrier diode higher than the avalanche breakdown voltage of the power MISFET, while suppressing a drastic increase in the on-resistance of the power MISFET.

The above-described and the other objects, and novel features of the invention will be apparent from the description herein and accompanying drawings.

Of the inventions disclosed in the present application, summary of the representative ones will next be described briefly.

A semiconductor device according to a representative embodiment has a first region in which a Schottky barrier diode has been formed and a second region in which a power MISFET has been formed. In the first region, (a1) a semiconductor substrate of a first conductivity type having an upper surface and a lower surface on a side opposite thereto and (a2) a first semiconductor layer of the first conductivity type formed over the upper surface of the semiconductor substrate are formed. Moreover, (a3) a second semiconductor layer of the first conductivity type formed over the first semiconductor layer, (a4) a first metal film formed over the second semiconductor layer, and (a5) a second metal film formed over the lower surface of the semiconductor substrate are formed. The second semiconductor layer forms a Schottky junction with the first metal film.

In the second region, (b1) the semiconductor substrate, (b2) the first semiconductor layer formed over the semiconductor substrate, and (b3) a channel region formed in the first semiconductor layer and having a second conductivity type opposite to the first conductivity type are formed. Moreover, (b4) a trench penetrating the channel region and reaching the first semiconductor layer; (b5) a gate insulating film formed over an inner wall of the trench, and (b6) a gate electrode formed over the gate insulating film, and filled in the trench are formed. Further, (b7) a source region of the first conductivity type contiguous to the trench and formed over the channel region, (b8) the first metal film formed over the source region and electrically coupled to the source region, and (b9) the second metal film formed over the lower surface of the semiconductor substrate are formed.

The first metal film functions as an anode electrode of the Schottky barrier diode in the first region and as a source electrode of the power MISFET in the second region, while the second metal film functions as a cathode electrode of the Schottky barrier diode in the first region and as a drain electrode of the power MISFET in the second region.

The doping concentration of the second semiconductor layer is lower than that of the first semiconductor layer, and the boundary between the first semiconductor layer and the second semiconductor layer is formed in a region as deep as the bottom portion of the trench or shallower than the bottom portion of the trench.

A manufacturing method of a semiconductor device according to a representative embodiment has the step of (a) preparing a multilayer substrate having a semiconductor substrate of a first conductivity type, a first semiconductor layer of the first conductivity type formed over the semiconductor substrate, and a second semiconductor layer of the first conductivity type formed over the first semiconductor layer and having a doping concentration lower than that of the first semiconductor layer. It has further the steps of (b) forming a trench in a second region of the multilayer substrate in which a power MISFET is to be formed, (c) forming a gate insulating film over an inner wall of the trench, and (d) forming a gate electrode over the gate insulating film so as to fill the trench. It has still further steps of (e) forming a channel region of a second conductivity type opposite to the first conductivity type in the second region of the multilayer substrate, and (f) forming, in the second region of the multilayer substrate, a source region contiguous to the trench and composed of a semiconductor region of the first conductivity type. It has then the steps of (g) forming a first metal film which comes in contact with the source region in the second region of the multilayer substrate and comes in contact with the second semiconductor layer to form a Schottky junction in a first region of the multilayer substrate forming a Schottky barrier diode and (h) forming a second metal film over the lower surface of the semiconductor substrate included in the multilayer substrate.

At this time, the first metal film serves as a source electrode of the power MISFET in the second region, and an anode electrode of the Schottky barrier diode in the first region, while the second metal film serves as a drain electrode of the power MISFET in the second region, and a cathode electrode of the Schottky barrier diode in the first region.

After completion of the power MISFET and the Schottky barrier diode, the boundary between the first semiconductor layer and the second semiconductor layer is present in a region as deep as or shallower than the bottom portion of the trench.

Of the inventions disclosed by the present application, advantages available by the representative inventions will hereinafter be described briefly.

According to the representative embodiments of the invention, in a semiconductor device having a power MISFET and a Schottky barrier diode on one semiconductor substrate, the avalanche breakdown voltage of the Schottky barrier diode can be made higher than the avalanche breakdown voltage of the power MISFET and a drastic increase in the on-resistance of the power MISFET can be suppressed.

DETAILED DESCRIPTION OF THE PREFERRED EMBODIMENTS

Figure 1:
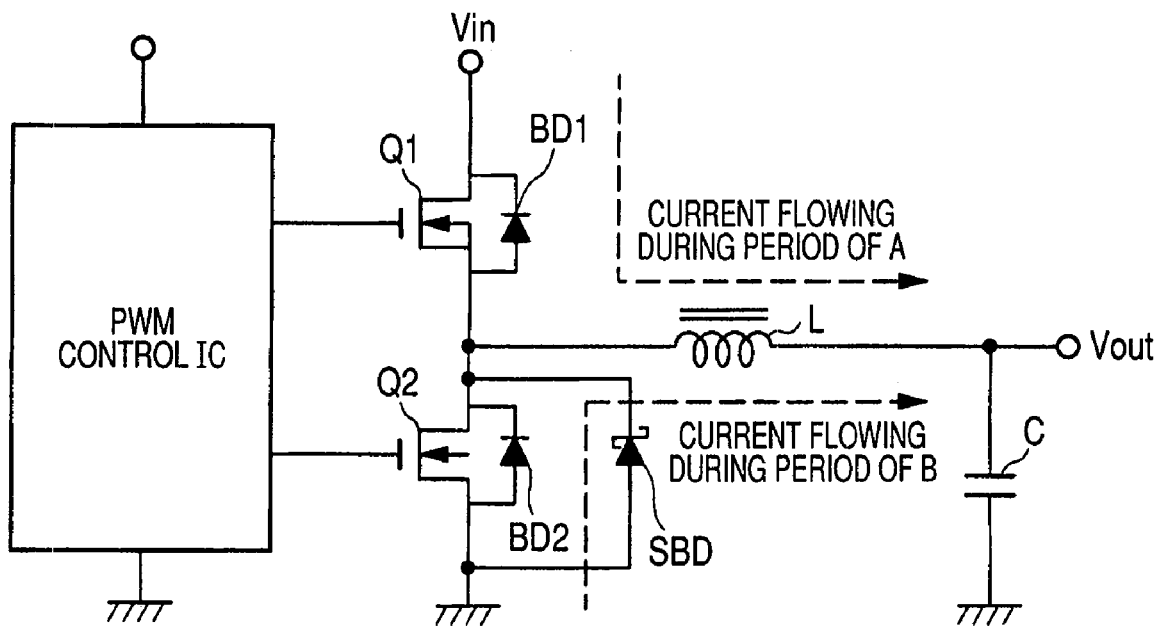
FIG. 1 is a circuit diagram of a general synchronous rectifier type DC/DC converter using a power MISFET.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated.

In the below-described embodiments, when a reference is made to the number of elements (including the number, value, amount, and range), the number of elements is not limited to a specific number but can be greater than or less than the specific number unless otherwise specifically indicated or principally apparent that the number is limited to the specific number.

Moreover in the below-described embodiments, it is needless to say that the constituent elements (including element steps) are not always essential unless otherwise specifically indicated or principally apparent that they are essential.

Similarly, in the below-described embodiments, when a reference is made to the shape or positional relationship of the constituent elements, that substantially analogous or similar to it is also embraced unless otherwise specifically indicated or obviously different in principle. This also applies to the above-described value and range.

In all the drawings for describing the below-described embodiments, members having like function will be identified by like reference numerals and overlapping descriptions will be omitted. In the drawings used in these embodiments, even a plan view is sometimes hatched to facilitate understanding of the drawing.

Embodiment 1

In this embodiment 1, an application example of a technology of forming a power MISFET and a Schottky barrier diode over one semiconductor chip to the present invention will be described.

Figure 2:
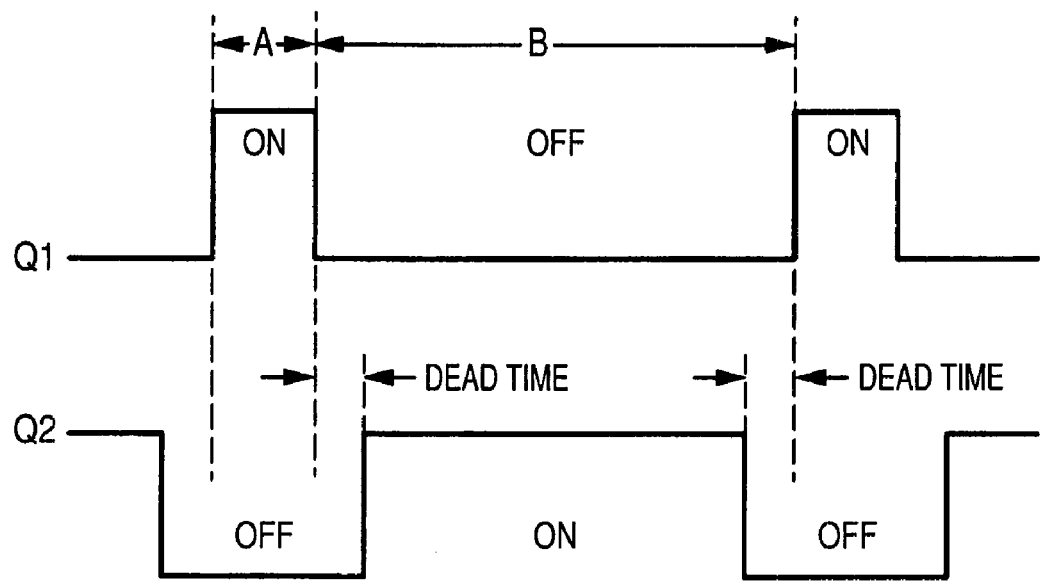
FIG. 2 is a timing chart of the power MISFET Q1 for main switch and the power MISFET Q2 for synchronous rectification, each illustrated in FIG. 1.

FIG. 1 is a circuit diagram of a general synchronous rectifier type DC/DC converter using a power MISFET and FIG. 2 is a timing chart of a power MISFET Q1 for main switch and a power MISFET Q2 for synchronous rectification, each MISFET illustrated in FIG. 1. In FIG. 1, the Q1 is a power MISFET for main switch, the Q2 is a power MISFET for synchronous rectification, BD1 and BD2 are body diodes, and SBD is a Schottky barrier diode. In addition, L means inductance and C means a capacitor element. The body diode BD1 and the body diode BD2 are incorporated in the power MISFET Q1 for main switch and the power MISFET Q2 for synchronous rectification, respectively and they are coupled to each other in parallel. The Schottky barrier diode SBD is coupled in parallel to the power MISFET Q2 for synchronous rectification.

The main-switch MISFET Q1 functions as a switching element, while the synchronous-rectification power MISFET Q2 functions as an element for synchronous rectification. When the main-switch power MISFET Q1 is turned on, electric current flows from the side of an input voltage Vin to the side of inductance L and the capacitor element C through the main-switch power MISFET Q1, as shown in FIG. 1 (current flowing during period A). Then, when the main-switch power MISFET Q1 is turned off and the synchronous-rectification power MISFET Q2 is turned on, the inductance L acts to permit electric current to flow in a direction so as not to cause current reduction. Electric current therefore flows from the synchronous-rectification power MISFET Q2 to the side of the inductance L and the capacitor element C, as shown in FIG. 1 (current flowing during period B). By repeating these operations, a predetermined output voltage Vout is output from the input voltage.

The DC/DC converter is used, for example, in personal computers (PCs). The trends in the operating voltage of CPUs integrated in personal computers have been toward lower voltage and larger current. In particular, in the case of power supplies for notebook PCs, size reduction is considered important so that the operating frequency also tends to be high. As the trends toward lower voltage, larger current, and higher frequency progress in this way, it is necessary to extremely narrow the switching pulse width of the main-switch power MISFET in the on/off operation. Conversely, the on time of the synchronous-rectification power MISFET becomes about 90% of one period. Such usage requires a low switching loss for the main-switch power MISFET and a low on-resistance for the synchronous rectification power MISFET.

In the synchronous rectifier type DC/DC converter illustrated in FIG. 1, the main-switch power MISFET Q1 and the synchronous-rectification power MISFET Q2 need to be alternately turned on and off. In order to prevent the through-current because of the simultaneous turn-on of the main-switch power MISFET Q1 and the synchronous-rectification power MISFET Q2, a period called "dead time," in which both MISFETs are turned off, is provided as illustrated in FIG. 2. The current during that period flows in the direction indicated as the current flowing during period B in FIG. 1. Described specifically, by turning off the synchronous-rectification power MISFET Q2, the current flowing during the period B is blocked so that the current flows so as to keep the current flowing during the period of B by the inductance L. During this period, the current flows through the body diode BD2 integrated in the synchronous-rectification power MISFET Q2, so a drop of forward voltage (VF) becomes large, about 0.8V. In view of this, the Schottky barrier diode SBD which has a smaller voltage than the forward voltage (VF) of the body diode BD2 is coupled in parallel to the synchronous-rectification power MISFET Q2 to reduce the circuit loss. In other words, the circuit loss during the dead time is reduced by making use of a small drop in forward voltage (VF) of the Schottky barrier diode SBD.

Accordingly, the use of a Schottky barrier diode is necessary from the viewpoint of reducing the circuit loss. In view of this, there is a semiconductor device in which a semiconductor chip having a power MISFET and a semiconductor chip having a Schottky barrier diode are encapsulated in a single package. In this semiconductor device, the electrical coupling between the power MISFET and the Schottky barrier diode is performed using a bonding wire so that an increase in a parasitic inductance and deterioration in circuit efficiency of the DC/DC converter occur. Described specifically, owing to the parasitic inductance of a wire and the like present between the power MISFET and the Schottky barrier diode, electric current temporarily flows through the body diode after the power MISFET is turned off, and then commutates to the Schottky barrier diode with a delay. If this parasitic inductance is large, it not only retards the commutation speed but also becomes a cause of noise and ripples.

In order to reduce this parasitic inductance, there has been a technology of incorporating a Schottky barrier diode in a semiconductor chip having a power MISFET. According to this technique, the number of coupling wires between the power MISFET and the Schottky barrier diode can be reduced, which leads to a reduction in the parasitic inductance. As a result, the time of a current flowing through the body diode of the power MISFET can be controlled, and a circuit loss during a dead time can be considerably reduced in a DC/DC converter controlled by PWM (Pulse Width Modulation). For these reasons, a power MISFET and a Schottky barrier diode are incorporated together in one semiconductor chip.

Figure 3:
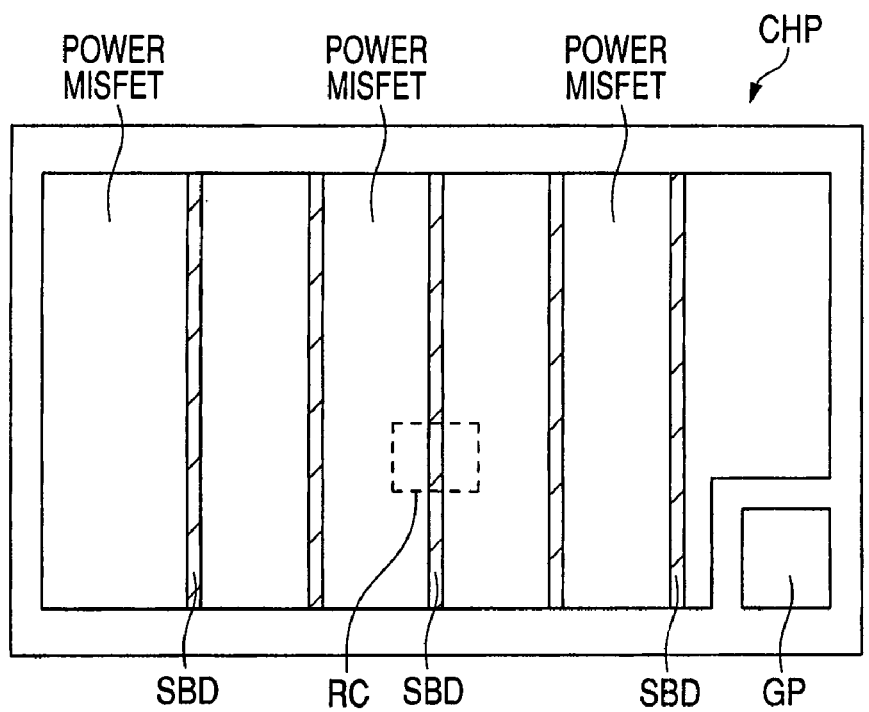
FIG. 3 is a plan view illustrating an upper surface of a semiconductor chip having therein a power MISFET and a Schottky barrier diode.

FIG. 3 is a plan view illustrating an upper surface of a semiconductor chip in which a power MISFET and a Schottky barrier diode are incorporated. In FIG. 3, the semiconductor chip CHP has a rectangular shape and it has, at one corner thereof, a gate pad GP. Element formation regions are formed in a major part of the semiconductor chip CHP. These element formation regions have a plurality of power MISFETs and between these power MISFETs, Schottky barrier diodes SBDs are placed. In short, the semiconductor chip has a structure in which linear Schottky barrier diodes SBDs are formed between the power MISFETs.

A drop in the forward voltage (VF) of the Schottky barrier diode SBD is determined by the area of the Schottky barrier diode SBD so that the area of the Schottky barrier diode SBD is determined in order to obtain a predetermined drop in forward voltage (VF). For example, a drop in forward voltage (VF) can be reduced by widening the total area of the plural Schottky barrier diodes SBDs. FIG. 3 illustrates a plurality of linear Schottky barrier diodes inserted in order to increase the total area of the Schottky barrier diodes. The total area of the plural Schottky barrier diodes SBDs can also be increased by widening the line width of the linear Schottky barrier diodes SBDs.

Figure 4:
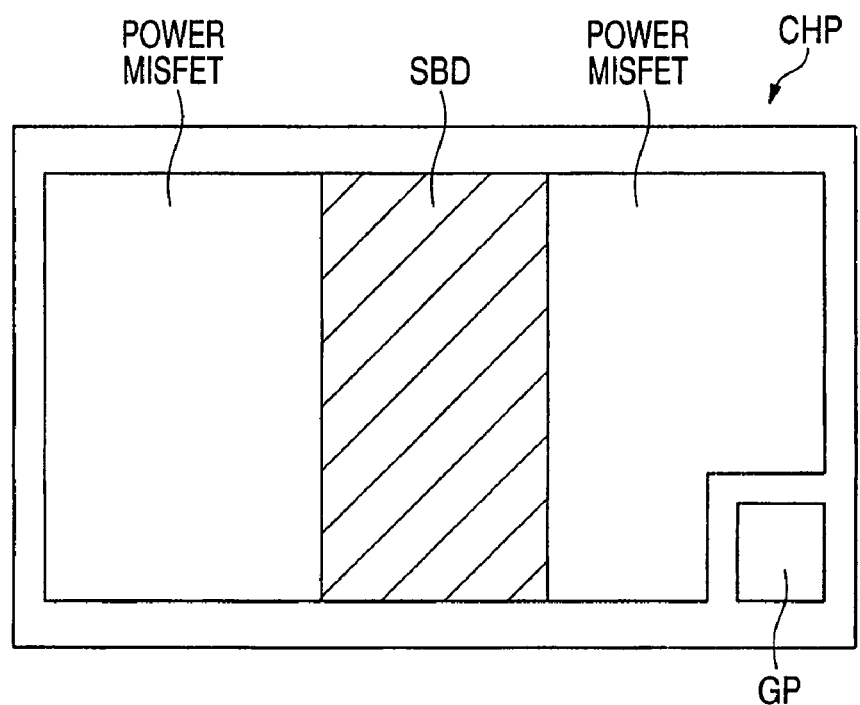
FIG. 4 is a plan view illustrating another method of adjusting the area of a Schottky barrier diode.

FIG. 4 is a plan view illustrating another method of adjusting the area of a Schottky barrier diode SBD. FIG. 4 illustrates a Schottky barrier diode SBD sandwiched between power MISFETs. A drop in forward voltage (VF) of the Schottky barrier diode SBD is adjusted by increasing the area of this Schottky barrier diode. In FIG. 3, the total area of the plural Schottky barrier diodes SBDs is increased by inserting a plurality of Schottky barrier diodes having a linear form. In FIG. 4, on the other hand, only one thick Schottky barrier diode SBD having a linear form is inserted and by widening the line width of the thus-inserted Schottky barrier diode, an area of the Schottky barrier diode SBD is increased.

Thus, for adjusting the area of the Schottky barrier diode SBD, the above-described two means can be considered, that is, a means of forming a plurality of thin and linear Schottky barrier diodes SBDs to increase the total area of the Schottky barrier diodes SBDs and a means of forming one thick and linear Schottky barrier diode SBD and increasing the line width thereof to increase the total area of the Schottky barrier diode SBD. Either one can be employed for adjusting the total area of the Schottky barrier diode SBD. As a result, a drop in forward voltage (VF) of the Schottky barrier diode SBD can be adjusted.

Formation of a plurality of thin and linear Schottky barrier diodes SBDs as illustrated in FIG. 3 has however the following advantage over formation of one thick and linear Schottky barrier diode SBD as illustrated in FIG. 4. This advantage will hereinafter be described. Although not illustrated in FIGS. 3 and 4, a source electrode is formed over the power MISFET and the Schottky barrier diode SBD, while a drain electrode is formed on the back side of the semiconductor chip CHP. In the power MISEFT, current therefore flows in a direction vertical to the paper surface (thickness direction of the semiconductor chip CHP). At this time, the formation region of the Schottky barrier diode SBD is not used as a pathway for the current flowing through the power MISFET. More specifically, in the structure illustrated in FIG. 4, since the Schottky barrier diode SBD has a very large line width, this region is not used as a pathway for the current flowing through the power MISFET. In the structure illustrated in FIG. 3, on the other hand, since the Schottky barrier diode SBD has a small line width, a pathway for current flowing through the power MISFET is formed so that it enters the formation region of the Schottky barrier diode SBD from both sides. The formation regions of Schottky barrier diodes SBDs having a small line width can also be used as a current pathway. This means an increase in the number of pathways for the current flowing through the power MISFET. As a result, the on-resistance of the power MISFET can be reduced.

Described specifically, even in the structure illustrated in FIG. 4, a current pathway for the current flowing through the power MISFET enters the formation region of the Schottky barrier diode SBD but the current pathway does not reach the center region of the Schottky barrier diode SBD because the Schottky barrier diode SBD has a very large line width. In the structure illustrated in FIG. 3, on the other hand, since the Schottky barrier diode SBD has a very small line width, current pathways enter the Schottky barrier diode SBD from boundary regions on both sides of the power MISFETs having the Schottky barrier diode SBD therebetween and the current pathways from the boundary regions on both sides thereof merge together. In short, all the formation regions of the Schottky barrier diode SBD are used as a current pathway for the current flowing through the power MISFET. This phenomenon occurs in the plural Schottky barrier diodes SBDs in the linear form so that the whole region of the plural linear Schottky barrier diodes SBDs can be used as a current pathway for the current flowing through the power MISFET.

By forming a plurality of thin and linear Schottky barrier diodes SBDs, thereby increasing the total area of the Schottky barrier diodes SBDs as illustrated in FIG. 3, the on-resistance of the power MISFET can be made lower than by widening the line width of the Schottky barrier diode SBD, thereby increasing the total area thereof as illustrated in FIG. 4.

In Embodiment 1, two means are described as a means for adjusting the area of the Schottky barrier diode, that is, a means of forming a plurality of linear Schottky barrier diodes SBDs to increase the total area of the Schottky barrier diodes SBDs and a means of forming a thick and linear Schottky barrier diode SBD and widening this line width to increase the total area of the Schottky barrier diode SBD. It is also possible to use these two means in combination in order to adjust the area of the Schottky barrier diodes SBDs. Described specifically, a plurality of linear Schottky barrier diodes SBDs is formed and the width of each of the lines of the Schottky barrier diodes SBDs is increased, whereby the area of the Schottky barrier diodes SBDs can be adjusted.

In Patent Document 2, for example, the distance between trenches having a Schottky barrier diode SBR sandwiched therebetween is made narrower than the distance between trenches of cells in which a power MISFET has been formed. Narrowing of the distance between trenches having the Schottky barrier diode SBR sandwiched therebetween is effective for reducing a field intensity on the surface of an epitaxial region in which a Schottky junction is formed (RE-SURF effect). In Patent Document 2, this RESURF effect is utilized to improve the avalanche breakdown voltage of the Schottky barrier diode. In this case, the area of the Schottky barrier diode formation region can be adjusted only by forming a plurality of thin and linear Schottky barrier diodes SBDs, because the RESURF effect cannot be achieved when the area of Schottky barrier diode SBD is adjusted by increasing the line width. This leads to a loss of freedom to adjust the area of the Schottky barrier diode.

In Embodiment 1, on the other hand, the Schottky barrier diode can have an improved avalanche breakdown voltage without utilizing a RESURF effect as described later so that for the semiconductor device of this Embodiment 1, a means of increasing the line width, thereby adjusting the area of the Schottky barrier diode SBD can be employed. In this Embodiment 1, it is also possible to adjust the area of the Schottky barrier diode SBD by forming a plurality of Schottky barrier diodes SBDs in line form and increasing the line width of the Schottky barrier diodes SBDs formed in line form. In short, this Embodiment 1 can provide an advantage of enhancing the freedom to adjust the area of the Schottky barrier diode.

Figure 5:
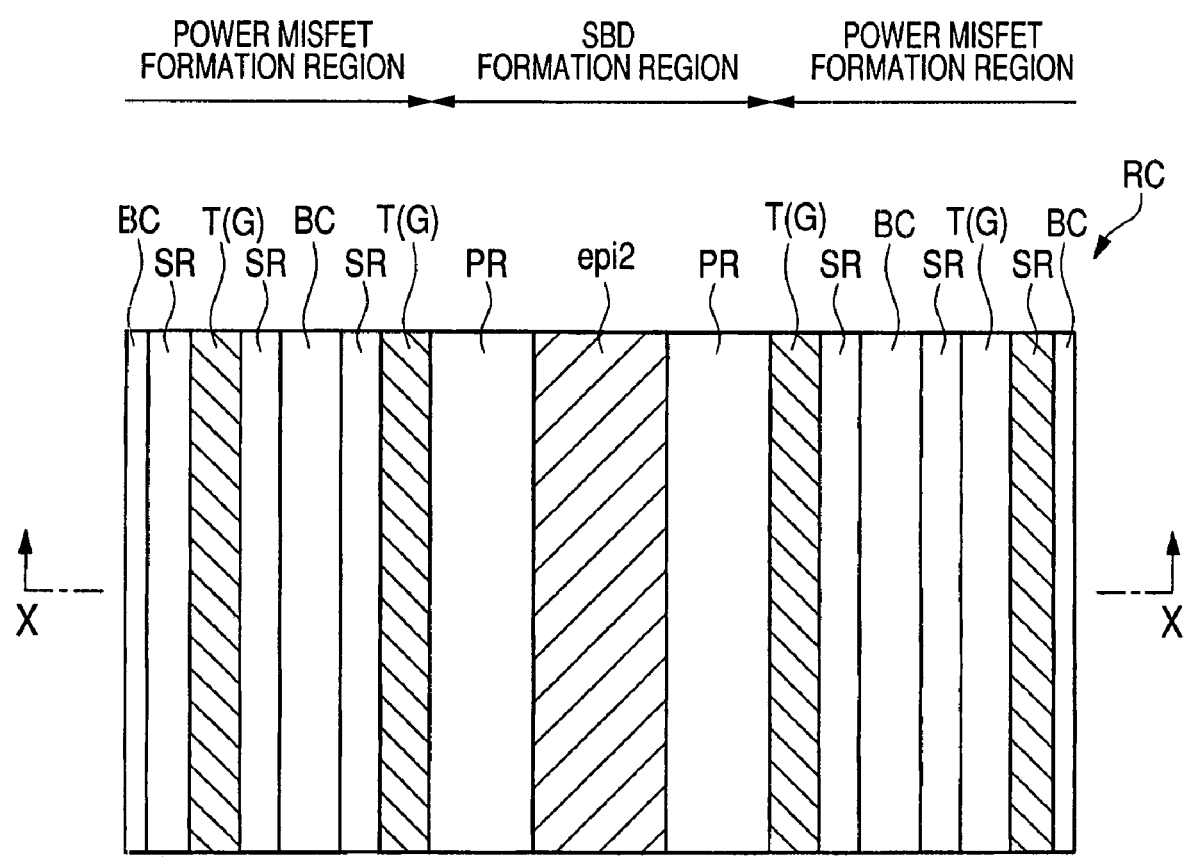
FIG. 5 is an enlarged plan view of a partial region of FIG. 3.

FIG. 5 is an enlarged plan view of the region RC of FIG. 3. As illustrated in FIG. 5, the Schottky barrier diode SBD formation region is sandwiched between the power MISFET formation regions. The Schottky barrier diode SBD formation region has therein an epitaxial layer (second semiconductor) epi2. This epitaxial layer epi2 is an n type (first conductivity type) semiconductor layer doped with n type impurities such as phosphorus or arsenic and the epitaxial layer epi2 is sandwiched by p rings PRs. The p rings PRs are made of, for example, a p type (second conductivity type) semiconductor layer doped with p type impurities such as boron.

The p rings PRs are sandwiched between trenches Ts and a conductive film such as a polysilicon film is filled in the trenches Ts to serve as a gate electrode G of the power MISFET. The Schottky barrier diode formation region SBD is a region sandwiched between these trenches T and the Schottky barrier diode SBD formation region includes the epitaxial layer epi2 and the p rings PRs having the epitaxial layer epi2 sandwiched therebetween. Regions outside the trenches Ts but including the trenches Ts are power MISFET formation regions.

The power MISFET formation regions have therein source regions SRs formed outside the trenches Ts and adjacent to the trenches Ts. These source regions SRs are made of an n type semiconductor region and function as source regions of the power MISFET. The source regions SRs have, outside and adjacent thereto, body contact regions BCs. The body contact regions BCs are made of a p type semiconductor region. The body contact regions BCs have, outside thereof, source regions SRs and these source regions ST have, outside thereof, trenches T. Similarly, the trenches Ts have, outside thereof, source regions SRs and body contact regions BCs. In short, the power MISFET formation region has therein a cell (one power MISFET) including the trench T (gate electrode G), the source region SR, and the body contact region BC and with this structure as a unit, the power MISFET formation region has a plurality of cells arranged therein.

Figure 6:
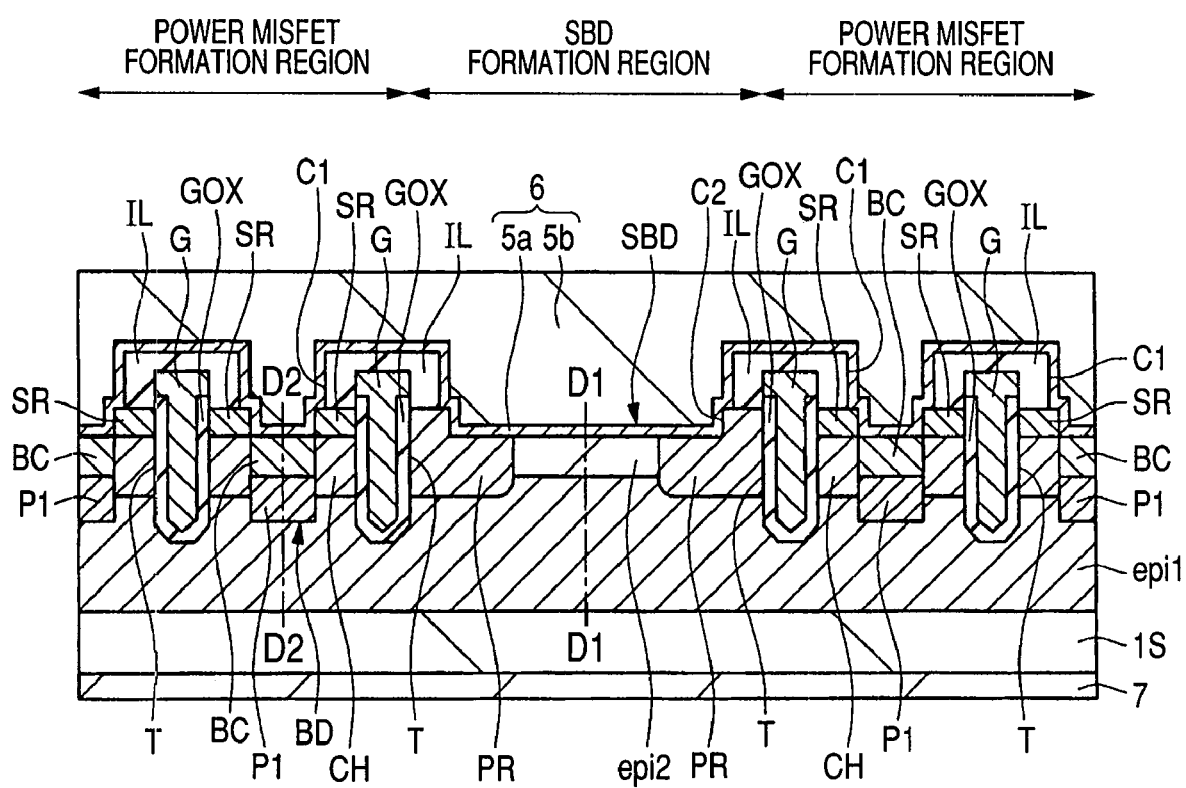
FIG. 6 is a cross-sectional view taken along a line X-X of FIG. 5.

FIG. 6 is a cross-sectional view taken along a line X-X of FIG. 5. Referring to FIG. 6, the configuration of the power MISFET formed in the power MISFET formation region and the Schottky barrier diode SBD formed in the Schottky barrier diode formation region will next be described in further detail.

First, the configuration of the power MISFET formed in the power MISFET formation region is described referring to FIG. 6. As illustrated in FIG. 6, the power MISFET formation region has therein a semiconductor substrate 1S doped with, for example, n type impurities and this semiconductor substrate 1S has thereover an epitaxial layer epi1. This epitaxial layer epi1 is an n type semiconductor layer doped with n type impurities. The epitaxial layer epi1 has thereover a channel region CH. The channel region CH is a p type semiconductor region doped with p type impurities.

Further, the power MISFET formation region has therein a trench T penetrating through the channel region CH and reaching the epitaxial layer epi1. The trench T has, over the inner wall of the trench T, a gate insulating film GOX made of, for example, a silicon oxide film and a gate electrode G is filled in the trench T via this gate insulating film GOX. The gate electrode G is made of, for example, a polysilicon film.

A region above the channel region CH and adjacent to the trench T has therein a source region SR. Upper portions of the source region SR and the trench T are covered with an interlayer insulating film IL. Although the gate electrode G protrudes from the trench T, the interlayer insulating film IL covers even this gate electrode G therewith.

The interlayer insulating film 1L has therein a contact hole C1 and this contact hole C1 penetrates through the interlayer insulating film IL and the source region SR. Due to the presence of the contact hole C1, the source region SR is located in a region between the contact hole C1 and the trench T and is adjacent to both the contact hole C1 and the trench T.

The contact hole C1 has, therebelow, a body contact region BC. This means that the body contact region BC comes in contact with the bottom portion of the contact hole C1 and below the bottom portion. The body contact region BC is made of a p type semiconductor region doped with p type impurities and it is more heavily doped with p-type impurities than the channel region CH also made of the p type semiconductor region. The body contact region BC has a function of ensuring an ohmic contact with a source electrode formed by filling a conductive film in the contact hole C1 and a function of suppressing the on-operation of a parasitic bipolar transistor at the power MISFET. Described specifically, in a trench gate type power MISFET, an npn parasitic bipolar transistor is formed from the source region SR (which will be an emitter) which is an n type semiconductor region, the channel region CH (which will be a base) which is a p type semiconductor region, and the epitaxial layer epi1 (which will be a collector) which is an n type semiconductor region. By the on-operation of this npn parasitic bipolar transistor, a current too large to be controlled by the gate electrode G of the power MISFET flows under some operation environments. As a result, the power MISFET generates excessive heat, leading to destruction. It is therefore necessary to prevent the on-operation of the npn parasitic bipolar transistor. A base resistance should be minimized in order to suppress the on-operation of the npn parasitic bipolar transistor. In view of this, the base resistance is reduced by forming the body contact region BC having a higher doping concentration than that of the channel region CH.

The body contact region BC has therebelow a first semiconductor region P1. This first semiconductor region P1 is made of a p type semiconductor region and it is doped with p type impurities at a doping concentration so as to have a lower doping concentration than that of the body contact region BC but a higher doping concentration than that of the channel region CH. The first semiconductor region P1 extends even in a region deeper than the boundary between the channel region CH and the epitaxial layer epi1.

The first semiconductor region P1 thus formed can relax field concentration at a pn junction formed at the boundary between the channel region CH and the epitaxial layer epi1 and increase an avalanche breakdown voltage of the power MISFET. In other words, it is possible to improve the breakdown voltage of the power MISFET. The "breakdown voltage" (BVdss) of the power MISFET as used herein is determined by a voltage at which avalanche breakdown occurs when a voltage is applied to the drain region while the gate electrode G and the source region SR are grounded. Thus, the first semiconductor region P1 formed below the body contact region BC has a function of improving the breakdown voltage of the power MISFET.

The term "avalanche breakdown voltage" as used herein means a voltage at which an avalanche breakdown phenomenon occurs when a reverse voltage (a voltage applied in a direction for increasing a potential barrier formed at a junction) is applied to a pn junction or a Schottky junction. The avalanche breakdown phenomenon occurs via the following mechanism. Described specifically, in a depletion layer formed in a junction, electrons and holes accelerated by a high electric field are caused to collide with crystal lattices. By the collision, covalent bonds which couple the crystal lattices therewith are broken and generate new pairs of an electron and a hole (impact ionization). These new electron-hole pairs gain energy from the high electric field, collide with crystal lattices, and generate new electron-hole pairs again. This multiplication phenomenon leads to flow of a large current through the depletion layer. This phenomenon is called "avalanche breakdown phenomenon".

The interlayer insulating film IL containing the inside of the contact hole C1 has thereover a titanium tungsten film 5a and the titanium tungsten film 5a has thereover an aluminum film 5b. The titanium tungsten film 5a and the aluminum film 5b configure a first metal film 6. The first metal film 6 is filled in the contact hole C1 and electrically coupled to the source region SR and the body contact region BC. This suggests that the first metal film 6 therefore functions as a source electrode of the power MISFET in the power MISFET formation region.

The semiconductor substrate 1S has, over the back side thereof, a second metal film 7. This second metal film 7 is made of, for example, a gold film and it functions, in the power MISFET formation region, as a drain electrode of the power MISFET.

In such a manner, the power MISFET formation region has therein the power MISFET. In the power MISFET having the above-described structure, the structure requires formation of a body diode BD. As described above, the first metal film 6 is filled in the contact hole C1 and the first metal film 6 filled in the contact hole C1 is electrically coupled to the body contact region BC. The body contact region BC and a first semiconductor region P1 formed below the body contact region BC are both p type semiconductor layers so that the body contact region BC is electrically coupled to the first semiconductor region P1. The first semiconductor region P1 is therefore coupled to the first metal film 6 which will be a source electrode.

The epitaxial layer epi1 which is an n type semiconductor region is contiguous to the bottom layer of the first semiconductor region P1 so that a pn junction is formed at a boundary between the first semiconductor region P1 and the epitaxial layer epi1. The epitaxial layer epi1 lies over the semiconductor substrate 1S which is an n type similarly. This semiconductor substrate 1S has, on the back side thereof, a second metal film 7. The epitaxial layer epi1 is therefore electrically coupled to the second metal film 7 which will be a drain electrode.

This means that the first semiconductor region P1 and the epitaxial layer epi1 configure a pn junction, the first semiconductor region P1 is coupled to the source electrode and the epitaxial layer epi1 is coupled to the drain electrode. This suggests that a body diode BD which is a pn junction diode is formed between the source electrode and the drain electrode. In this body diode BD, the source electrode serves as an anode electrode and the drain electrode serves as a cathode electrode so that a current flows from the source electrode to the drain electrode.

The power MISFET has the configuration as described above. Its operation will hereinafter be described briefly. For example, a voltage equal to or greater than the threshold voltage of the gate electrode G is applied while giving a potential difference between the source electrode and the drain electrode. Then, an inversion layer is formed in the channel region CH contiguous to the side surface of the trench T filled with the gate electrode G. In other words, an inversion layer which is an n type semiconductor region is formed in a region of the channel region CH, which is a p type semiconductor region, contiguous to the trench T. Then, the source region SR which is an n type semiconductor region and the epitaxial layer epi1 which is an n type semiconductor layer are electrically coupled to each other via the inversion layer. A potential difference is therefore applied to the source electrode and the drain electrode, whereby a current flows between the source electrode and the drain electrode.

For example, when the power MISFET is the synchronous-rectification power MISFET Q2 illustrated in FIG. 1, the direction of the current flowing during the term of B is the direction of the arrow of FIG. 1 so that a current flows from the source electrode of the power MISFET to the drain electrode thereof. In other words, when a voltage equal to or greater than the threshold voltage is applied to the gate electrode G while setting the potential of the source electrode greater than the potential of the drain electrode, the current flows from the source electrode, passes through the source region and the inversion layer, passes further through the epitaxial layer epi1 which is a drift layer and the semiconductor substrate 1S, and reaches the drain electrode. In such a manner, the power MISFET is turned on. At this time, the epitaxial layer epi1 becomes a drift layer, suggesting that the epitaxial layer epi1 preferably has a high doping concentration from the standpoint of reducing the on-resistance of the power MISFET.

When a voltage to be applied to the gate electrode G is set not greater than the threshold voltage while turning on the power MISFET, the inversion layer disappears. The power MISFET is therefore turned off. In the case as illustrated in FIG. 1, however, the inductance L tries to keep the current flowing during the term of B. Since the body diode BD can pass a current from the source electrode to the drain electrode, the body diode BD formed for the structural reason of the power MISFET enables a current flow from the source electrode to the drain electrode even if the power MISFET is turned off. In the DC/DC converter illustrated in FIG. 1 having such a mechanism, the body diode BD contributes to the flow of current even during a dead time.

A voltage drop when forward current flows through the body diode BD is not a negligible level. A circuit loss caused by a current flowing through the body diode BD during a dead time cannot therefore be neglected.

A Schottky barrier diode SBD is therefore formed over the semiconductor substrate 1S over which the power MISFET is formed. The Schottky barrier diode SBD can reduce a circuit loss during a dead time, because a drop of a forward voltage (VF) is lower than that of a pn junction diode (body diode BD).

Referring to FIG. 6, the configuration of the Schottky barrier diode SBD formed in the Schottky barrier diode SBD formation region will next be described. As illustrated in FIG. 6, the Schottky barrier diode SBD formation region has therein a semiconductor substrate 1S doped with, for example, n type impurities and this semiconductor substrate 1S has, thereover, an epitaxial layer epi1. The epitaxial layer epi1 has thereover an epitaxial layer epi2. The epitaxial layer epi1 and the epitaxial layer epi2 are each an n type semiconductor layer doped with n type impurities and the doping concentration of the epitaxial layer epi2 is lower than that of the epitaxial layer epi1.

The epitaxial layer epi2 has, thereover, a contact hole C2 which is formed by partially opening the interlayer insulating film IL and epitaxial layer epi2. This means that the contact hole C2 has therebelow the epitaxial layer epi2. The contact hole C2 has therein a first metal film 6 made of a titanium tungsten film (barrier conductor film) 5a and an aluminum film 5b. Such a configuration brings the epitaxial layer epi2 into contact with the first metal film 6 at the bottom portion of the contact hole C2. More specifically, the epitaxial layer epi2 comes into direct contact with the titanium tungsten film 5a configuring the first metal film 6, meaning that a semiconductor layer comes into contact with a metal film, whereby a Schottky junction is formed.

Not only the interlayer insulating film IL but also a portion of the epitaxial layer 2 from the surface to a predetermined depth has an opening as the contact hole C2, because the contact hole C2 is formed in a similar step to that employed for the formation of the contact hole C1 to be formed in the power MISFET formation region. This means that the contact hole C1 to be formed in the power MISFET formation region should penetrate through the source region SR and the semiconductor layer having therein the source region SR should be opened to a predetermined depth. Also in the contact hole C2 formed in a similar step to that of the contact hole C1, the epitaxial layer epi2 is therefore opened to a predetermined depth.

Since the epitaxial layer epi2 is opened to a predetermined depth by the contact hole C2, phosphorus segregated to the surface of the epitaxial layer epi2 can be removed by a heat treatment step. This means that when the epitaxial layer epi2 is not opened to a predetermined depth by the contact hole C2, a Schottky junction is formed in a region of the epitaxial layer epi2 having phosphorus segregated thereto. Due to phosphorus thus segregated, the doping concentration of the semiconductor layer forming a Schottky junction becomes high. This inconveniently causes a reduction in an avalanche breakdown voltage of the Schottky barrier diode SBD. It is therefore possible to suppress a reduction in the avalanche breakdown voltage of the Schottky barrier diode SBD by removing a phosphorus segregated region of the epitaxial layer epi2 by the contact hole C2.

The first metal film 6 filled in the contact hole C2 contains the titanium tungsten film 5a configuring one (metal film side) of the Schottky junction so that it functions as an anode electrode of the Schottky barrier diode SBD. In other words, the first metal film 6 is formed over the power MISFET formation region and the Schottky barrier diode SBD formation region so that it functions as a source electrode in the power MISFET formation region and as an anode electrode in the Schottky barrier diode SBD formation region.

The semiconductor substrate 1S has, over the back side thereof, a second metal film 7 made of, for example, a gold film. This second metal film 7 is electrically coupled to the epitaxial layer epi2 via the n type semiconductor substrate 1S and the epitaxial layer epi1 which is an n type semiconductor layer. The second metal film 7 therefore functions as a cathode electrode of the Schottky barrier diode SBD. This means that the second metal film 7 is formed over the power MISFET formation region and the Schottky barrier diode SBD formation region and it functions as a drain electrode in the power MISFET formation region and as a cathode electrode in the Schottky barrier diode SBD formation region.

The Schottky barrier diode SBD according to Embodiment 1 has the above-described configuration and it is coupled in parallel to the power MISFET. A drop of forward voltage (VF) of the Schottky barrier diode is lower than a drop of forward voltage (VF) of the body diode BD formed parasitically in the power MISFET so that parallel coupling between the Schottky barrier diode SBD and the power MISFET enables to reduce a circuit loss during the dead time of a DC/DC converter.

The Schottky barrier diode SBD formation region has p rings PRs between the epitaxial layer epi2 and trenches on both sides. It is formed because contact between the epitaxial layer epi2 and the trenches T on both sides increases a leakage current flowing through the Schottky barrier diode SBD. In other words, the amount of a leakage current caused by the application of a reverse voltage to the Schottky barrier diode SBD increases when the epitaxial layer epi2 is brought into contact with the trench T. In Embodiment 1, the p rings PRs made of a p type semiconductor region is therefore formed between the epitaxial layer epi2 and the trenches T on both sides. This enables to reduce a leakage current which occurs when a reverse voltage is applied to the Schottky barrier diode SBD.

The semiconductor device according to Embodiment 1 has the above-described configuration and characteristics of it will next be described. One of the characteristics of Embodiment 1 is that the epitaxial layer formed over the semiconductor substrate 1S is composed of two layers, that is, a heavily-doped epitaxial layer epi1 and a lightly-doped epitaxial layer epi2 and the boundary between the epitaxial layer epi1 and the epitaxial layer epi2 is located at a position as deep as the bottom portion of the trench T or shallower than the bottom portion of the trench T.

Supposing that the epitaxial layer formed over the semiconductor substrate 1S is composed of only the epitaxial layer epi1 having a high doping concentration. In this case, in the power MISFET formation region, the doping concentration of the epitaxial layer epi1 formed in a region deeper than the trench T becomes high. When the power MISFET is turned on, the epitaxial layer epi1 located lower than the trench T becomes a drift layer. The doping concentration of this drift layer becomes high so that the on-resistance of the power MISFET can be reduced.

The Schottky junction of the Schottky barrier diode SBD is, on the other hand, formed by the epitaxial layer epi1 having a high doping concentration and the titanium tungsten film 5a. When the epitaxial layer epi1 forming a Schottky junction has a high doping concentration, the field intensity in the vicinity of the Schottky junction increases, leading to a reduction in the breakdown voltage of the Schottky barrier diode SBD. The reduction in the breakdown voltage of the Schottky barrier diode SBD means a reduction in the avalanche breakdown voltage of the Schottky barrier diode SBD.

When the avalanche breakdown voltage of the Schottky barrier diode SBD reduces, the avalanche breakdown voltage of the Schottky barrier diode SBD becomes lower than the avalanche breakdown voltage (breakdown voltage) of the power MISFET. Described specifically, when both the Schottky barrier diode SBD and the power MISFET are formed over the semiconductor substrate 1S, the Schottky barrier diode SBD causes avalanche breakdown at a voltage lower than the power MISFET. In other words, the avalanche breakdown of the Schottky barrier diode SBD occurs prior to the avalanche breakdown of the power MISFET. This means that the breakdown voltage of a semiconductor device having the power MISFET and the Schottky barrier diode over the same semiconductor substrate 1S becomes lower than the breakdown voltage of the semiconductor device having only the power MISFET over the semiconductor substrate 1S and the semiconductor device has deteriorated reliability by having the power MISFET and Schottky barrier diode over the same semiconductor substrate 1S. Formation of the power MISFET and the Schottky barrier diode SBD over the epitaxial layer epi1 having a high doping concentration leads to reduction in the on-resistance of the power MISFET, but it also leads to reduction in the avalanche breakdown voltage of the Schottky barrier diode inconveniently.

Supposing that the epitaxial layer formed over the semiconductor substrate 1S is composed only of the epitaxial layer epi2 having a low doping concentration. In this case, the Schottky junction of the Schottky barrier diode SBD is formed by the epitaxial layer epi2 having a low doping concentration and the titanium tungsten film 5a. When the doping concentration of the epitaxial layer epi2 configuring the Schottky junction is low, a field intensity in the vicinity of the Schottky junction can be relaxed, leading to an increase in the avalanche breakdown voltage of the Schottky barrier diode SBD. The avalanche breakdown voltage of the Schottky barrier diode SBD can therefore be made higher than the avalanche breakdown voltage of the power MISFET. This means that even if both the power MISFET and the Schottky barrier diode SBD are formed over the same semiconductor substrate 1S, the breakdown voltage is on an equal level to that attained by the formation of only the power MISFET over the semiconductor substrate 1S. As a result, deterioration in reliability of the semiconductor device can be suppressed.

In the power MISFET formation region, however, the doping concentration of the epitaxial layer epi2 formed in a region deeper than the trench T becomes low. When the power MISFET is turned on, the epitaxial layer epi2 formed lower than the trench T becomes a drift layer. The impurity concentration of this drift layer becomes low so that the on-resistance of the power MISFET increases inconveniently.

Although an increase in the doping concentration of the epitaxial layer causes a reduction in the on-resistance of the power MISFET, it also causes a reduction in the avalanche breakdown voltage of the Schottky barrier diode SBD, resulting in that the avalanche breakdown voltage of the Schottky barrier diode SBD becomes lower than the avalanche breakdown voltage of the power MISFET. A decrease in the doping concentration of the epitaxial layer, on the other hand, can raise the avalanche breakdown voltage of the Schottky barrier diode SBD, resulting in that the avalanche breakdown voltage of the Schottky barrier diode SBD can be made higher than the avalanche breakdown voltage of the power MISFET. It however increases the on-resistance of the power MISFET. This means that with regards to the doping concentration of the epitaxial layer, a decrease in the on-resistance of the power MISFET and an increase in the avalanche breakdown voltage of the Schottky barrier diode are in a trade-off relationship.

Embodiment 1 takes both an advantage of an epitaxial layer whose doping concentration is made high and an advantage of another epitaxial layer whose doping concentration is made low. Described specifically, two epitaxial layers, that is, the epitaxial layer epi1 having a high doping concentration and the epitaxial layer epi2 having a low doping concentration are formed over the semiconductor substrate 1S and a boundary between the epitaxial layer epi1 and the epitaxial layer epi2 is formed in a region equal to the bottom portion of the trench T or shallower than the bottom portion of the trench T.

According to such a configuration, the epitaxial layer epi2 having a low doping concentration and the titanium tungsten film 5a form a Schottky junction in the Schottky barrier diode SBD formation region. Described specifically, since the epitaxial layer epi2 is formed in a region equal to or above the bottom portion of the trench, the epitaxial layer epi2 does not become a drift layer of the power MISFET and has no influence on the on-resistance of the power MISFET. This means that the doping concentration of the epitaxial layer epi2 can be determined only from the standpoint of raising the avalanche breakdown voltage of the Schottky barrier diode SBD. Embodiment 1, therefore, enables to increase the avalanche breakdown voltage of the Schottky barrier diode SBD, resulting in that the avalanche breakdown voltage of the Schottky barrier diode SBD can be made higher than the avalanche breakdown voltage of the power MISFET.

Moreover, in Embodiment 1, the epitaxial layer epitaxial layer epi2 has, therebelow, the epitaxial layer epi1 having a high doping concentration. This epitaxial layer epi1 is formed in a region equal to or deeper than the depth of the trench T and it therefore functions as a drift layer of the power MISFET in the power MISFET formation region. At this time, the epitaxial layer epi1 does not function as a semiconductor layer for forming the Schottky junction of the Schottky barrier diode SBD. It is therefore possible to determine the epitaxial layer epi1 from the standpoint of reducing the on-resistance of the power MISFET without considering an increase in the avalanche breakdown voltage of the Schottky barrier diode SBD. The impurity concentration of the epitaxial layer epi1 can be made high enough to reduce the on-resistance of the power MISFET sufficiently.

The epitaxial layer epi1 having a high doping concentration has thereover the epitaxial layer epi2 having a low doping concentration, but as illustrated in FIG. 6, in the power MISFET formation region, it seems that no epitaxial layer epi2 is formed. The reason is that, in the power MISFET formation region, a channel region CH which is a p type semiconductor region is formed by introducing, into the epitaxial layer epi2 which is an n type semiconductor layer, p type impurities having a conductivity type opposite thereto. It is therefore presumed that in the power MISFET formation region, the epitaxial layer epi2 having a low doping concentration completely becomes the channel region CH which is a p type semiconductor region. Thus, in the power MISFET formation region, by changing the epitaxial layer epi2 having a low doping concentration to the channel region CH, the influence of the epitaxial layer epi2 on the on-resistance of the power MISFET can be omitted. In order to completely change the epitaxial layer epi2 to the channel region CH, it is desirable to make the boundary between the epitaxial layer epi1 and the epitaxial layer epi2 shallower than the depth of the channel region CH from the standpoint of reducing the on-resistance of the power MISFET. In Embodiment 1, it is necessary to form the boundary between the epitaxial layer epi1 and the epitaxial layer epi2 in a region equal in depth to the bottom portion of the trench T or shallower than the bottom portion of the trench T. Even in this case, however, when the boundary between the epitaxial layer epi1 and the epitaxial layer epi2 is present in a region deeper than the channel region CH, the epitaxial layer epi2 configures a portion of a drift layer and contributes to the on-resistance.

In Embodiment 1, two epitaxial layers, that is, the epitaxial layer epi1 having a high doping concentration and the epitaxial layer epi2 having a low doping concentration are formed over the semiconductor substrate 1S and the boundary between the epitaxial layer epi1 and the epitaxial layer epi2 is formed in a region equal in depth to the bottom portion of the trench T or shallower than the bottom portion of the trench T. Embodiment 1 therefore has a marked effect for realizing both reduction in the on-resistance of the power MISFET and improvement in the avalanche breakdown voltage of the Schottky barrier diode SBD which are in a trade-off relationship.

In this embodiment, the epitaxial layer epi1 having a high doping concentration has thereover the epitaxial layer epi2 having a low doping concentration. The definition of the boundary between the epitaxial layer epi1 and the epitaxial layer epi2 will next be described.

For example, immediately after the formation of the epitaxial layer epi1 and the epitaxial layer epi2, the boundary between the epitaxial layer epi1 and the epitaxial layer epi2 is relatively definite because the doping concentration varies in a relatively stepwise manner between the epitaxial layer epi1 and the epitaxial layer epi2. Manufacturing steps of the semiconductor device include various heat treatment steps thereafter so that impurities diffuse in the epitaxial layer epi2 having a low doping concentration from the epitaxial layer epi1 having a high doping concentration. As a result, there occurs a gradual change in the doping concentration at the boundary between the epitaxial layer epi1 and the epitaxial layer epi2 and the boundary between the epi semiconductor substrate 1 and the epitaxial layer epi2 becomes indefinite. The boundary between the epitaxial layer epi1 and the epitaxial layer epi2 will therefore be defined in order to clarify the boundary between the epitaxial layer epi1 and epitaxial layer epi2 even after completion of the semiconductor device. This definition will hereinafter be described.

Figure 7:
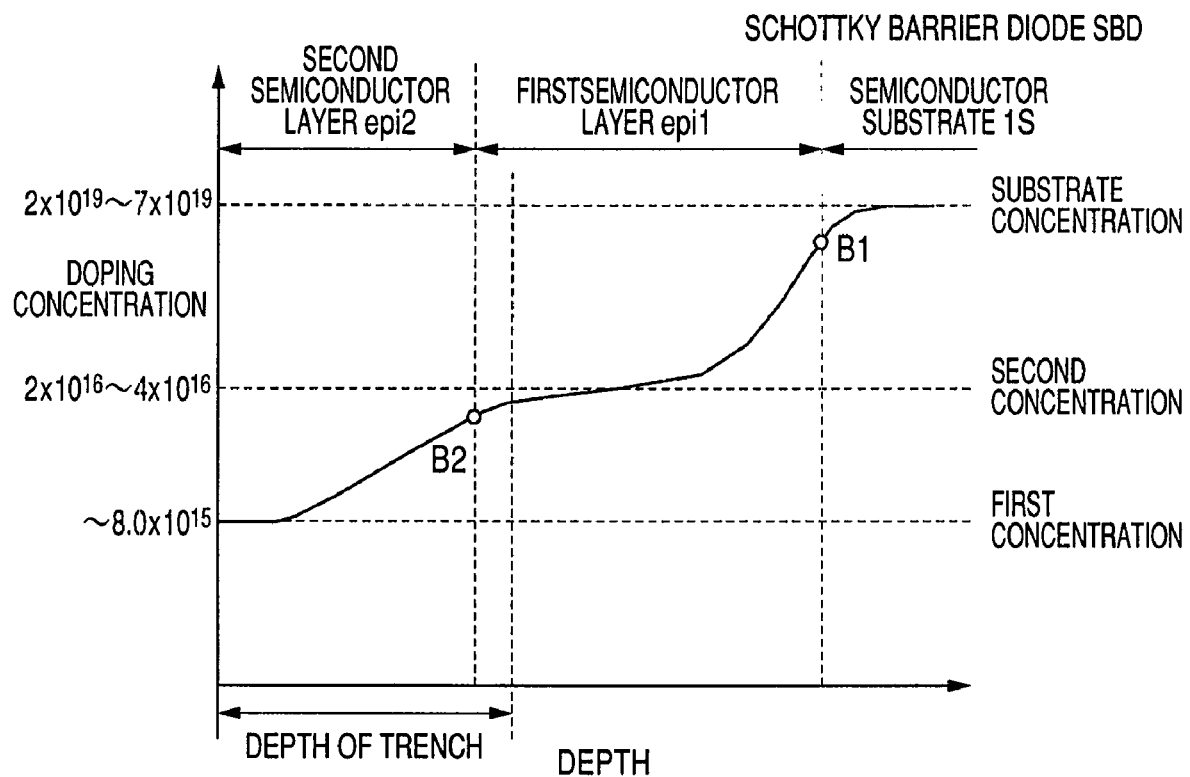
FIG. 7 is a graph showing a change in the doping concentration along the line D1-D1 of FIG. 6.

FIG. 7 is a graph showing a change in the doping concentration along the line D1-D1 of FIG. 6. The change in the doping concentration shown in this graph is a change from the surface of the epitaxial layer epi2 to the semiconductor substrate 1S in the structure (complete structure) of FIG. 6 obtained by forming the epitaxial layer epi1 over the semiconductor substrate 1S and then forming the epitaxial layer epi2 over the epitaxial layer epi1.

In FIG. 7, the doping concentration of n type impurities in a region where the depth from the surface of the epitaxial layer epi2 is shallow is designated as a first concentration. The first doping concentration is kept almost fixed until a predetermined depth. As the depth becomes greater, the doping concentration gradually increases from the first concentration to a second concentration. As the depth becomes greater, the doping concentration shows a further increase from the second concentration and becomes a substrate concentration.

The substrate concentration at this time is, for example, from $2 \times 10^{19}$ ($1/cm^3$) to $7 \times 10^{19}$ ($1/cm^3$) and it is the concentration of the semiconductor substrate 1S. This substrate concentration is determined by the maximum possible concentration of the doping concentration and according to the present crystal technology, the concentration is about $4 \times 10^{19}$ ($1/cm^3$) when the impurity is arsenic, while it is about $7 \times 10^{19}$ ($1/cm^3$) when the impurity is phosphorus.

The boundary between the semiconductor substrate 1S and the epitaxial layer epi1 is represented by B1. The substrate concentration decreases by half at the position B1. This means that the boundary between the semiconductor substrate 1S and the epitaxial layer epi1 is defined as a position where the doping concentration decreases to half (½) of the substrate concentration.

The second concentration is from $2 \times 10^{16}$ ($1/cm^3$) to $4 \times 10^{16}$ ($1/cm^3$) and it is the concentration in the epitaxial layer epi1. This epitaxial layer epi1 has a width and concentration necessary for keeping the avalanche breakdown voltage of the power MISFET at 30V or greater. The second concentration corresponds to a doping concentration at which the concentration gradient (obtained by differentiating a doping concentration with respect to depth) becomes the minimum between the position corresponding to the depth of the trench T to the boundary with the semiconductor substrate 1S. The boundary between the epitaxial layer epi1 and the epitaxial layer epi2 is defined as a position at which the doping concentration decreases by half (½) of the second concentration. The position of the boundary is indicated as B2 in FIG. 7. The epitaxial layer epi1 having a high doping concentration can be defined as a region formed in a region deeper than the position B2 but shallower than the position B1. Although the width of this epitaxial layer epi1 depends on the impurities rising up from the semiconductor substrate 1S, it can be set at from about 2.0 to 3.0 μm for adjusting the avalanche breakdown voltage of the power MISFET to 30V or greater. Care should be taken so as not to excessively increase the width of the epitaxial layer epi1, because it may raise a series resistance of the Schottky barrier diode or the on-resistance of the power MISFET.

Next, the first concentration is a doping concentration in the vicinity of the surface of the epitaxial layer epi2. The first concentration is a concentration for making the avalanche breakdown voltage of the Schottky barrier diode SBD higher than the avalanche breakdown voltage of the power MISFET. More specifically, the first concentration is preferably adjusted to $8.0 \times 10^{15}$ (1/cm$^3$) or less. The boundary between the epitaxial layer epi1 and the epitaxial layer epi2 is defined as the position of B2. In Embodiment 1, the position of B2 is set equal to or shallower than the depth of the trench T.

In FIG. 7, the doping concentration from the vicinity of the surface of the epitaxial layer epi2 to a predetermined depth is almost fixed at the first concentration. This is because the rising-up of the impurities from the epitaxial layer epi1 does not reach a region of a fixed doping concentration. When the doping concentration of the epitaxial layer epi2 in the vicinity of the surface thereof is not higher than the first concentration ($8.0 \times 10^{15}$ (1/cm$^3$)) even if the impurities from the epitaxial layer epi1 rise up and reach the vicinity of the surface of the epitaxial layer epi2, the avalanche breakdown voltage of the Schottky barrier diode SBD can be made higher than the avalanche breakdown voltage of the power MISFET. In other words, when the doping concentration of the epitaxial layer epi2 in the vicinity of the surface thereof is the first concentration or less, the avalanche breakdown voltage of the Schottky barrier diode SBD can be made higher than the avalanche breakdown voltage of the power MISFET irrespective of the presence of a region where the doping concentration is almost fixed.

In Embodiment 1, the doping concentration of the epitaxial layer epi2 in the vicinity of the surface thereof is set at $8.0 \times 10^{15}$ (1/cm$^3$) or less. The reason why it is set at this value will next be described referring to FIG. 8.

Figure 8:
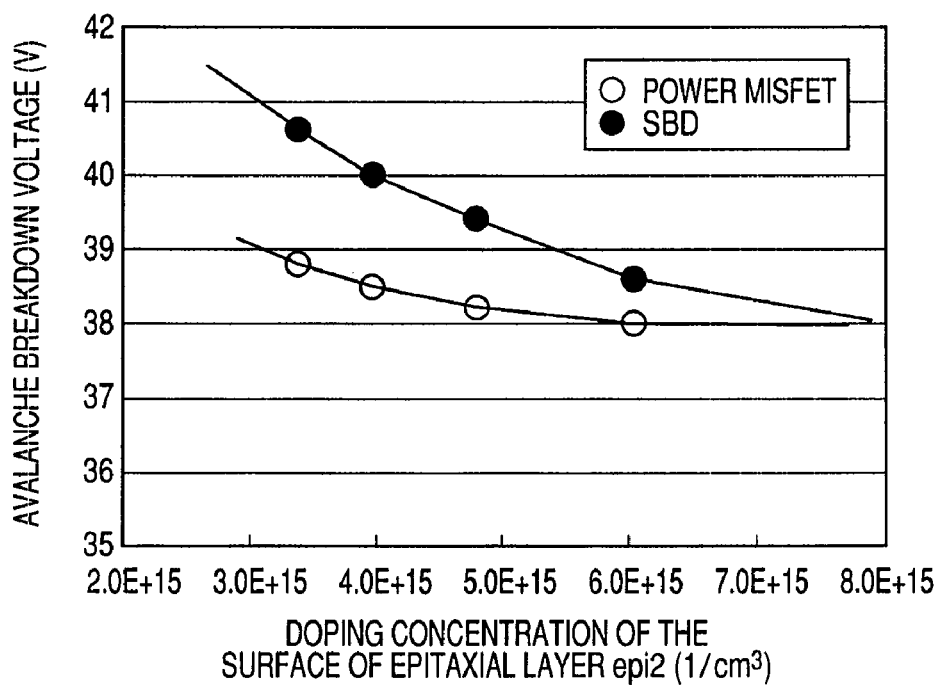
FIG. 8 is a graph showing the relationship between a doping concentration of the surface of an epitaxial layer (second semiconductor layer) and an avalanche breakdown voltage.

FIG. 8 is a graph showing a relationship between a doping concentration of the surface of the epitaxial layer epi2 (second semiconductor layer) and an avalanche breakdown voltage. In FIG. 8, the doping concentration of the epitaxial layer epi2 (second semiconductor layer) is plotted on the abscissa and the avalanche breakdown voltage is plotted on the ordinate. The solid circle of FIG. 8 represents a Schottky barrier diode SBD and a blank circle of FIG. 8 represents a power MISFET. The graph of FIG. 8 is based on a structure obtained by forming an epitaxial layer epi1 and an epitaxial layer epi2 over a semiconductor substrate 1S and placing the boundary between the epitaxial layer epi1 and the epitaxial layer epi2 in a region equal to or shallower than the depth of a trench T, as illustrated in FIG. 6, and it plots an avalanche breakdown voltage of the Schottky barrier diode SBD and an avalanche breakdown voltage of the power MISFET at varied doping concentrations of the epitaxial layer epi2.

As is apparent from FIG. 8, the avalanche breakdown voltage of the Schottky barrier diode SBD and the avalanche breakdown voltage of the power MISFET each increases with a reduction in the doping concentration of the epitaxial layer epi2. The avalanche breakdown voltage of the Schottky barrier diode SBD and the avalanche breakdown voltage of the power MISFET substantially coincide with each other at a doping concentration of the epitaxial layer epi2 of about $8.0 \times 10^{15}$ (1/cm$^3$). Further, FIG. 8 has revealed that the avalanche breakdown voltage of the Schottky barrier diode SBD becomes higher than the avalanche breakdown voltage of the power MISFET at a doping concentration of the epitaxial layer epi2 lower than $8.0 \times 10^{15}$ (1/cm$^3$). As a result, it is possible to make the avalanche breakdown voltage of the Schottky barrier diode SBD higher than the avalanche breakdown voltage of the power MISFET by adjusting the doping concentration of the epitaxial layer epi2 in the vicinity of the surface thereof to not higher than $8.0 \times 10^{15}$ (1/cm$^3$).

Figure 9:
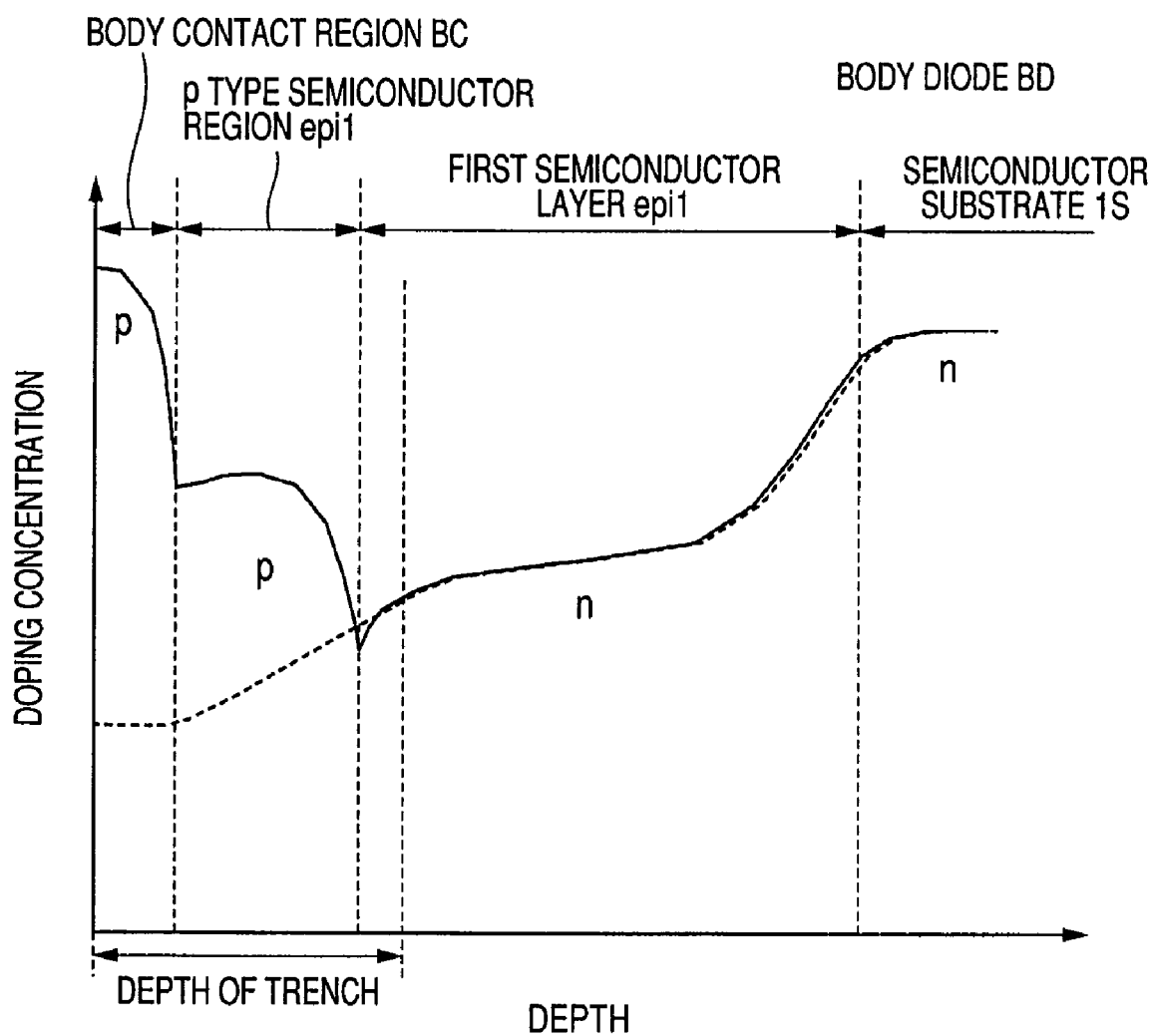
FIG. 9 is a graph showing a change in doping concentration along a line D2-D2 of FIG. 6.

FIG. 9 is a graph showing a change in doping concentration along a line D2-D2 of FIG. 6. This change in doping concentration shows a change from the surface of the body contact region BC to the semiconductor substrate 1S in a structure (complete structure) obtained by forming an epitaxial layer epi1 over a semiconductor substrate 1S and forming a p type semiconductor region (first semiconductor region) P1 and a body contact region BC over the epitaxial layer epi1. FIG. 9 is therefore a graph showing an impurity profile in a body diode BD.

As illustrated in FIG. 9, the body contact region BC is doped with p type impurities and a p type semiconductor region P1 formed below the body contact region BC is also doped with p type impurities. As is apparent from FIG. 9, the concentration of the impurities introduced into the body contact region BC is much higher than the concentration of the impurities introduced into the p type semiconductor region P1 so that the boundary between the body contact region BC and the p type semiconductor region P1 is relatively clear. The p type semiconductor region P1 has therebelow the epitaxial layer epi1 and the epitaxial layer epi1 is doped with n type impurities different from the p type impurities. The boundary between the p type semiconductor region P1 and the epitaxial layer epi1 is therefore relatively clear.

The epitaxial layer epi1 has therebelow the semiconductor substrate 1S. The boundary between the epitaxial layer epi1 and the semiconductor substrate 1S can be defined as a position at which the doping concentration decreases by half (½) of the concentration of the semiconductor substrate 1S as described referring to FIG. 7. The impurity profile in the body diode BD is thus described. In the body diode BD formation region, the boundary between the epitaxial layer epi1 and epitaxial layer epi2 which is one of the characteristics of Embodiment 1 has no direct relationship.

Embodiment 1 is characterized by that the boundary between the epitaxial layer epi1 and the epitaxial layer epi2 is formed in a region equal to or shallower than the depth of the trench T and the boundary between the epitaxial layer epi1 and the epitaxial layer epi2 should be defined clearly. From this viewpoint, as illustrated in FIG. 7, an impurity profile of the Schottky barrier diode SBD in which the boundary between the epitaxial layer epi1 and the epitaxial layer epi2 appears directly is important and the boundary between the epitaxial layer epi1 and the epitaxial layer epi2 is defined clearly by using this impurity profile. On the other hand, the impurity profile of the body diode BD illustrated in FIG. 9 has no direct relationship with the characteristic of Embodiment 1 but is shown in FIG. 9 for reference.

As described above, Embodiment 1 is characterized by that two epitaxial layers, that is, the epitaxial layer epi1 having a high doping concentration and the epitaxial layer epi2 having a low doping concentration are formed over the semiconductor substrate 1S and the boundary between the epitaxial layer epi1 and the epitaxial layer epi2 is formed in a region equal in depth to the bottom portion of the trench T or shallower than the bottom portion of the trench T. As already described above, such a configuration enables to simultaneously realize suppression of a drastic increase in the on-resistance of the power MISFET and improvement in the avalanche breakdown voltage in the Schottky barrier diode SBD, which are in a trade-off relationship. Simulation is performed to confirm such an effect. The simulation will hereinafter be described.

The first simulation is performed based on, for example, the structure, as illustrated in FIG. 6, obtained by forming an epitaxial layer epi1 having a high doping concentration over a semiconductor substrate 1S and then forming an epitaxial layer epi2 over the epitaxial layer epi1 having a high doping concentration. With this structure, the power MISFET and the Schottky barrier diode SBD are formed. The object of the first simulation is to study the relationship between an avalanche breakdown voltage of the Schottky barrier diode SBD and an on-resistance of the power MISFET while changing the resistivity ρepi2 and the film thickness tepi2 of the epitaxial layer epi2 (low doping concentration) formed as an upper layer. This simulation is performed while setting the resistivity of the first epitaxial layer epi1 at 0.3 Ocm. The resistivity is similar to that of an epitaxial layer composed of only a single layer formed over the semiconductor substrate 1S (conventional structure). Evaluation is made while fixing the total film thickness of the tepi1, that is, the thickness of the epitaxial layer epi1 and the tepi2, that is, the thickness of the epitaxial layer epi2 at 3.5 μm.

Figure 10:
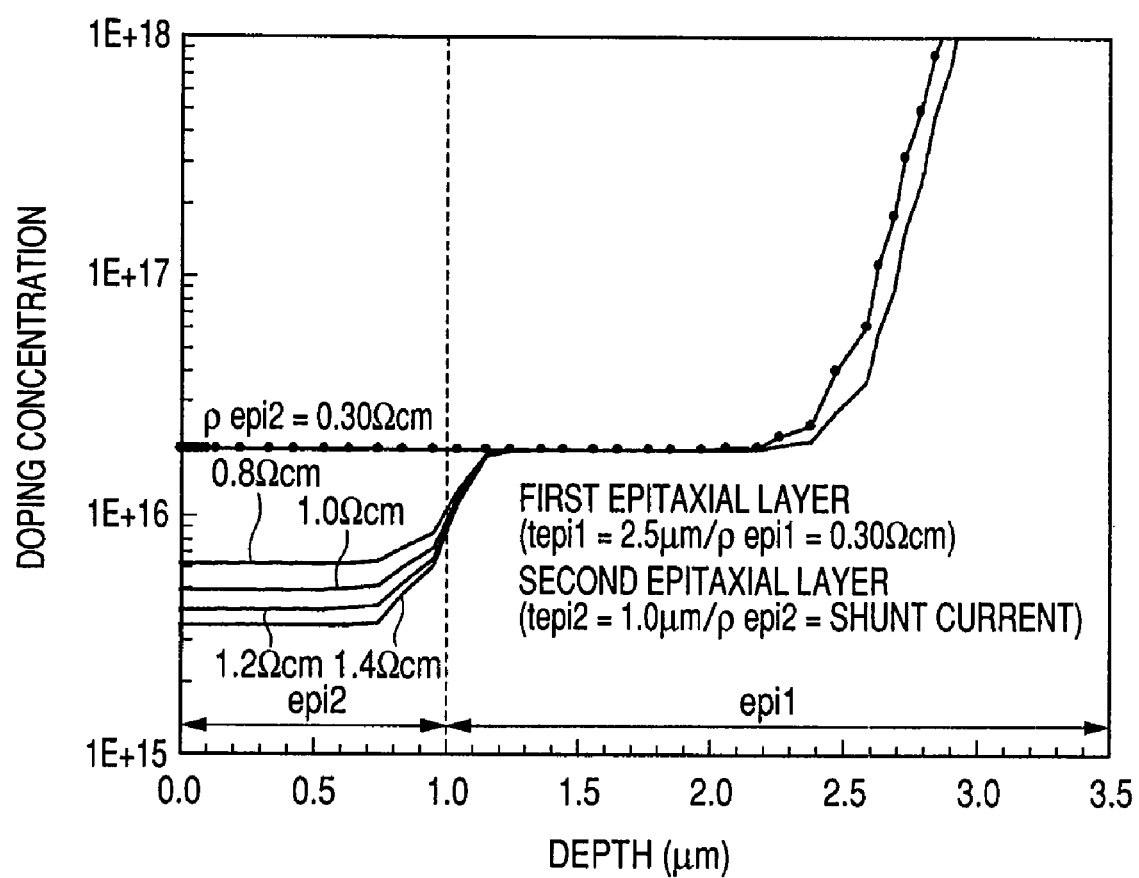
FIG. 10 is a graph, in the first simulation, showing the relationship between a depth from the surface of a second epitaxial layer and a doping concentration after formation of a first epitaxial layer and the second epitaxial layer over the semiconductor substrate.

FIG. 10 is a graph showing the relationship between a depth from the surface of the epitaxial layer epi2 and a doping concentration after formation of the epitaxial layer epi1 and the epitaxial layer epi2 over the semiconductor substrate 1S. It illustrates the semiconductor substrate 1S having thereover only the epitaxial layer epi1 and the epitaxial layer epi2. As illustrated in FIG. 10, the resistivity ρepi2 of the epitaxial layer epi2 is changed from 0.3 Ocm, 0.8 Ocm, 1.0 Ocm, 1.2 Ocm, to 1.4 Ocm. In this case, as FIG. 10 shows, with an increase in the resistivity ρepi2, the doping concentration becomes low. In other words, with a decrease in the resistivity ρepi2, the doping concentration becomes high. In FIG. 10, the boundary between the epitaxial layer epi2 and the epitaxial layer epi1 is present at 1.0 μm deep from the surface of the epitaxial layer epi2 and the trench has a depth of 0.8 μm. In view of this, after only the epitaxial layer epi1 and the epitaxial layer epi2 are formed over the semiconductor substrate 1S (the state of FIG. 10), the boundary between the epitaxial layer epi2 and the epitaxial layer epi1 is present at a position deeper than the depth of the trench.

Figure 11:
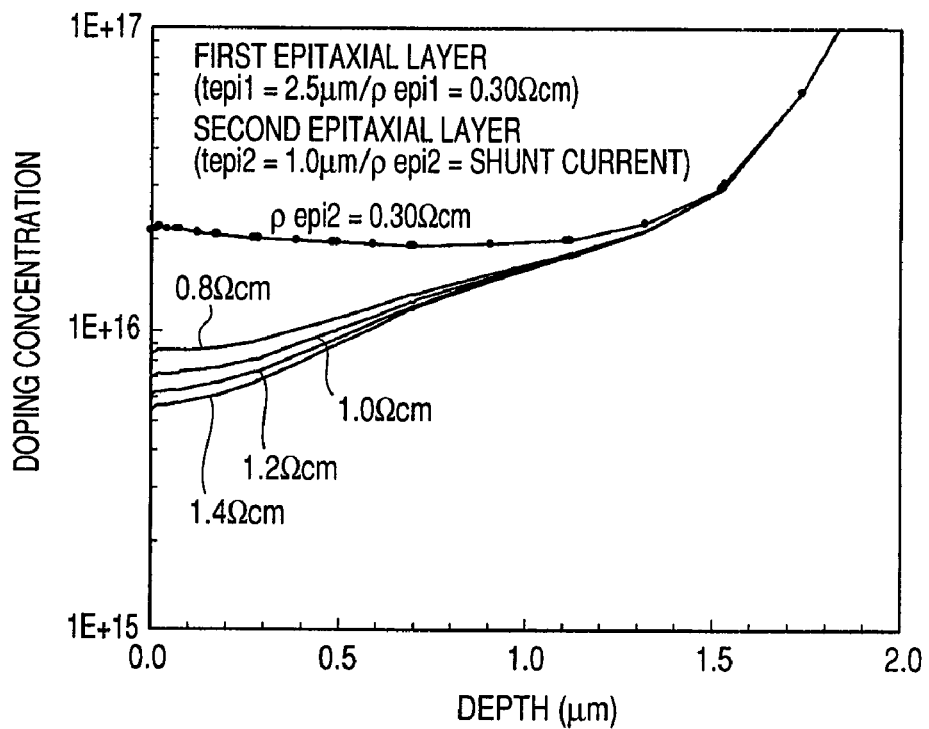
FIG. 11 is a graph showing the relationship between a depth from the surface of the second epitaxial layer and a doping concentration after completion of a semiconductor device having a power MISFET and a Schottky barrier diode SBD (first simulation)

FIG. 11 is a graph showing the relationship between a depth from the surface of the epitaxial layer epi2 and a doping concentration after completion of a semiconductor device having a power MISFET and a Schottky barrier diode SBD. In other words, FIG. 11 is a graph showing the relationship between the depth from the surface of the epitaxial layer epi2 and the doping concentration after various heat treatments.

As illustrated in FIG. 11, the boundary between the epitaxial layer epi2 and the epitaxial layer epi1 shows a mild change due to diffusion of impurities by the heat treatment. It has revealed that the boundary between the epitaxial layer epi2 and the epitaxial layer epi1 transfers to a region shallower than that shown in FIG. 10 and is present in a region shallower than the depth (0.8 μm) of the trench.

Even if the boundary between the epitaxial layer epi2 and the epitaxial layer epi1 shows a mild change due to diffusion of impurities by the heat treatment, the doping concentration decreases with an increase in the resistivity ρepi2. In other words, even after completion of the semiconductor device, the doping concentration on the surface of the epitaxial layer epi2 can be reduced as the resistivity ρepi2 becomes higher. This suggests that as the resistivity ρepi2 of the epitaxial layer epi2 becomes higher, the avalanche breakdown voltage of the Schottky barrier diode SBD formed over the surface of the epitaxial layer epi2 can be made greater.

Figure 12:
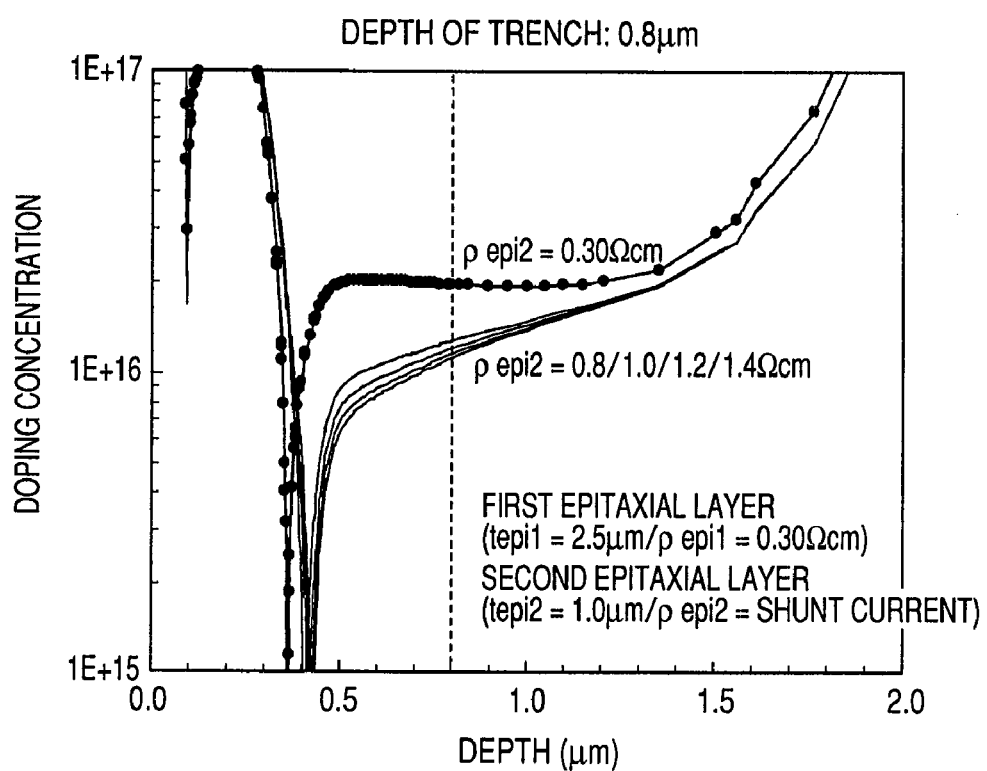
FIG. 12 is a graph showing the relationship between a depth from the surface of the second epitaxial layer and a doping concentration in the power MISFET formation region (first simulation)

FIG. 12 is a graph showing the relationship between a depth from the surface of the epitaxial layer epi2 in the power MISFET formation region and a doping concentration. As is apparent from FIG. 12, the doping concentration decreases even in a region deeper than the trench depth when the resistivity ρepi2 is 0.8 Ocm, 1.0 Ocm, 1.2 Ocm, or 1.4 Ocm compared with when the resistivity ρepi2 is 0.3 Ocm. This means that when the resistivity ρepi2 of the epitaxial layer epi2 is 0.3 Ocm, the resistivity ρepi1 of the epitaxial layer epi1 is equal to the resistivity ρepi2 of the epitaxial layer epi2. This structure is substantially similar to the conventional structure composed of a single epitaxial layer having a resistivity of 0.3 Ocm. When the resistivity ρepi2 of the epitaxial layer epi2 is 0.8 Ocm, 1.0 Ocm, 1.2 Ocm, or 1.4 Ocm, the doping concentration becomes lower than that of the conventional structure even in a region deeper than the depth of the trench. Even in the first simulation, the epitaxial layer epi1 having a resistivity equal to that of the conventional structure is formed in a region deeper than the depth of the trench, but when the resistivity ρepi2 of the epitaxial layer epi2 is 0.8 Ocm, 1.0 Ocm, 1.2 Ocm, or 1.4 Ocm, the doping concentration becomes lower than that of the conventional structure in a region deeper than the depth of the trench. This suggests that an increase in the resistivity ρepi2 of the epitaxial layer epi2 leads to an increase in the on-resistance of the power MISFET even if the resistivity ρepi1 of the epitaxial layer epi1 is equal to that of the conventional structure. In other words, even if, after completion of the semiconductor device having the epitaxial layer epi2 and the epitaxial layer epi1 stacked one after another, the boundary between the epitaxial layer epi1 and the epitaxial layer epi2 is present in a region shallower than the depth of the trench, the doping concentration decreases in a region deeper than the depth of the trench. A decrease in the doping concentration of the epitaxial layer epi1 is presumed to occur because when the doping concentration of the epitaxial layer epi2 is reduced, impurity diffusion to the side of the epitaxial layer epi2 occurs from the heavily-doped epitaxial layer epi1 rather than from the epitaxial layer epi2. This suggests that in order to decrease the doping concentration of the epitaxial layer epi2, the doping concentration of the epitaxial layer epi1 should be set higher than that of the conventional structure.

Figure 13:
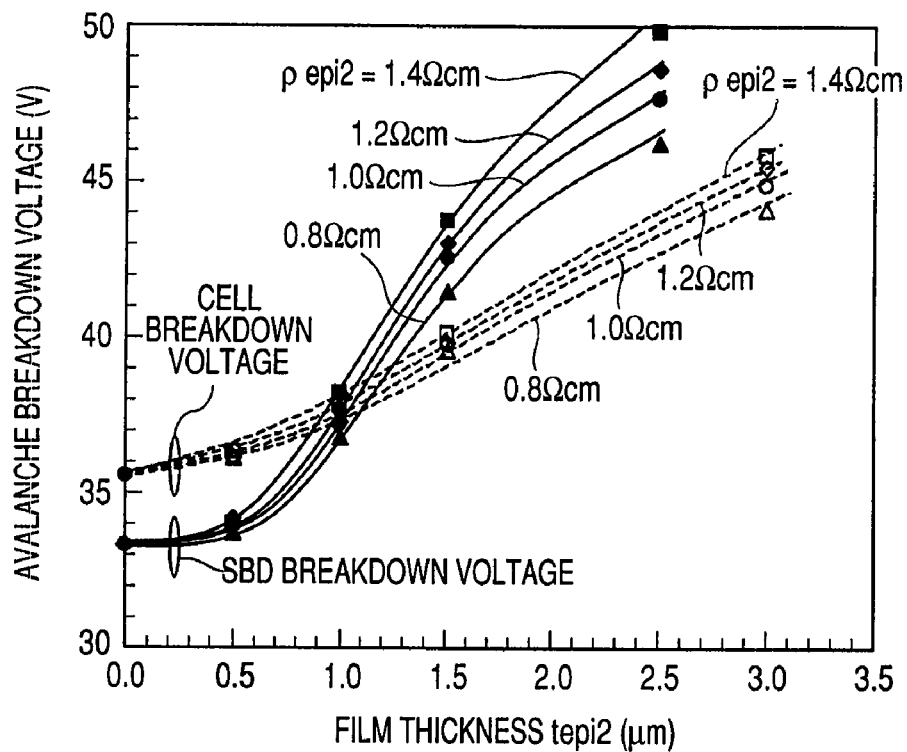
FIG. 13 is a graph showing the relationship between a thickness of the second epitaxial layer and an avalanche breakdown voltage of the Schottky barrier diode SBD and between a thickness of the second epitaxial layer and an avalanche breakdown voltage of the power MISFET.

The above-described first simulation is repeated while changing the thickness tepi2 of the epitaxial layer epi2. The results are shown below. FIG. 13 is a graph showing the relationship between a thickness tepi2 of the epitaxial layer epi2 and an avalanche breakdown voltage of the Schottky barrier diode SBD and between a thickness tepi2 of the epitaxial layer epi2 and an avalanche breakdown voltage of the power MISFET. It should be noted that FIG. 13 simultaneously shows the relationships when the resistivities ρepi2 of the epitaxial layer epi2 are 0.8 Ocm, 1.0 Ocm, 1.2 Ocm, and 1.4 Ocm, respectively. In FIG. 13, the thickness tepi2 of the epitaxial layer epi2 is plotted on the abscissa, while the avalanche breakdown voltage is plotted on the ordinate. A solid line in the graph indicates the Schottky barrier diode SBD and a broken line in the graph indicates the power MISFET. The thickness tepi2 of the epitaxial layer epi2 is not a film thickness upon completion of the semiconductor device but that upon formation of the epitaxial layer epi2.

As illustrated in FIG. 13, the avalanche breakdown voltage of the Schottky barrier diode SBD becomes greater than the avalanche breakdown voltage of the power MISFET at the thickness tepi2 of the epitaxial layer epi2 exceeding 1.0 μm. It is therefore at least necessary to adjust the thickness tepi2 of the epitaxial layer epi2 to about 1 μm in order to make the avalanche breakdown voltage of the Schottky barrier diode SBD higher than the avalanche breakdown voltage of the power MISFET.

Figure 14:
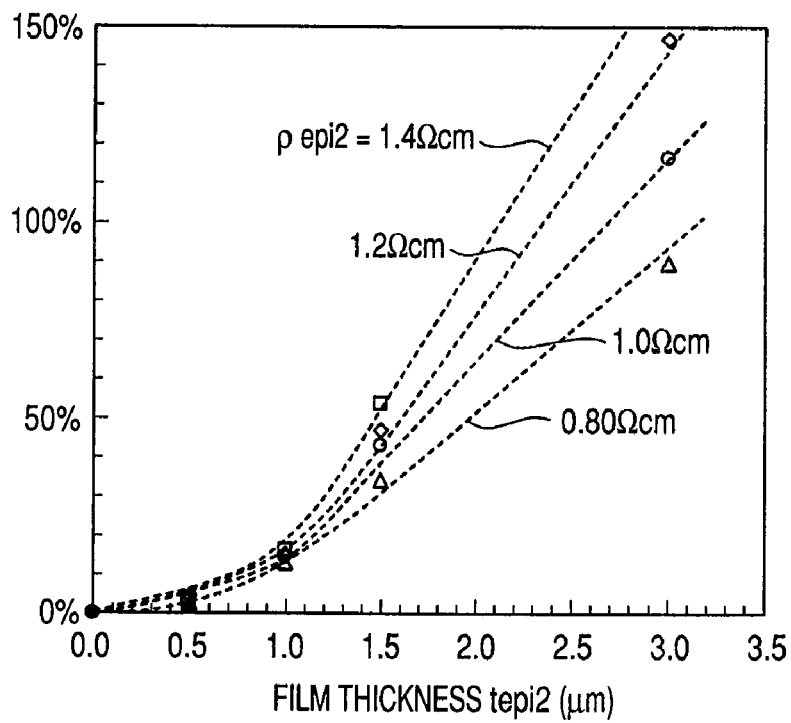
FIG. 14 is a graph, in the first simulation, showing the relationship between a thickness of the second epitaxial layer and a relative on-resistance of the power MISFET.

FIG. 14 is a graph showing the relationship between a thickness tepi2 of the epitaxial layer epi2 and a relative on-resistance of the power MISFET. The thickness tepi2 of the epitaxial layer epi2 is plotted on the abscissa of FIG. 14, while the relative on-resistance of the power MISFET is plotted on the ordinate of FIG. 14. The on-resistance of the power MISFET is a value relative to the on-resistance of the conventional structure composed of a single epitaxial layer having a resistivity of 0.3 Ocm. FIG. 14 simultaneously shows the relationships when the resistivities ρepi2 of the epitaxial layer epi2 are 0.8 Ocm, 1.0 Ocm, 1.2 Ocm, and 1.4 Ocm, respectively.

As derived from FIG. 13, the thickness tepi2 of the epitaxial layer epi2 should be set at about 1 μm in order to make the avalanche breakdown voltage of the Schottky barrier diode SBD greater than the avalanche breakdown voltage of the power MISFET. Application of this result to FIG. 14 reveals that the on-resistance at this time is higher than the on-resistance of the conventional structure. More specifically, the on-resistance shows a 15% to 20% increase compared with that of the conventional structure. It is therefore understood that under the conditions of the first simulation, the avalanche breakdown voltage of the Schottky barrier diode SBD can be raised, but a drastic increase of the on-resistance cannot be suppressed.

As described in FIG. 12, even when the boundary between the epitaxial layer epi1 and the epitaxial layer epi2 after completion of the semiconductor device by stacking the epitaxial layer epi2 over the epitaxial layer epi1 is present in a region shallower than the depth of the trench, the doping concentration of the epitaxial layer epi1 reduces in a region deeper than the depth of the trench. It is presumed that when the doping concentration of the epitaxial layer epi2 is reduced, diffusion of impurities from the epitaxial layer epi1 having a higher concentration than that of the epitaxial layer epi2 occurs by heat treatment and a reduction in the doping concentration of the epitaxial layer epi1 occurs. This suggests that the doping concentration of the epitaxial layer epi1 formed below the epitaxial layer epi2 should be made higher than that of the conventional structure in order to reduce the doping concentration of the epitaxial layer epi2. In view of this, a second simulation is performed. The second simulation will hereinafter be described.

Based on the results of the first simulation, the resistivity of the first epitaxial layer epi1 is changed from resistivity ρepi1 of 0.3 Ocm to resistivity ρepi1 of 0.2 Ocm in the second simulation. This means that the doping concentration of the first epitaxial layer epi1 is made higher than that of the first simulation. Conditions other than the above-described one are similar to those of the first simulation. For example, the total thickness of the thickness tepi1 of the epitaxial layer epi1 and the thickness tepi2 of the epitaxial layer epi2 is fixed at 3.5 μm.

Figure 15:
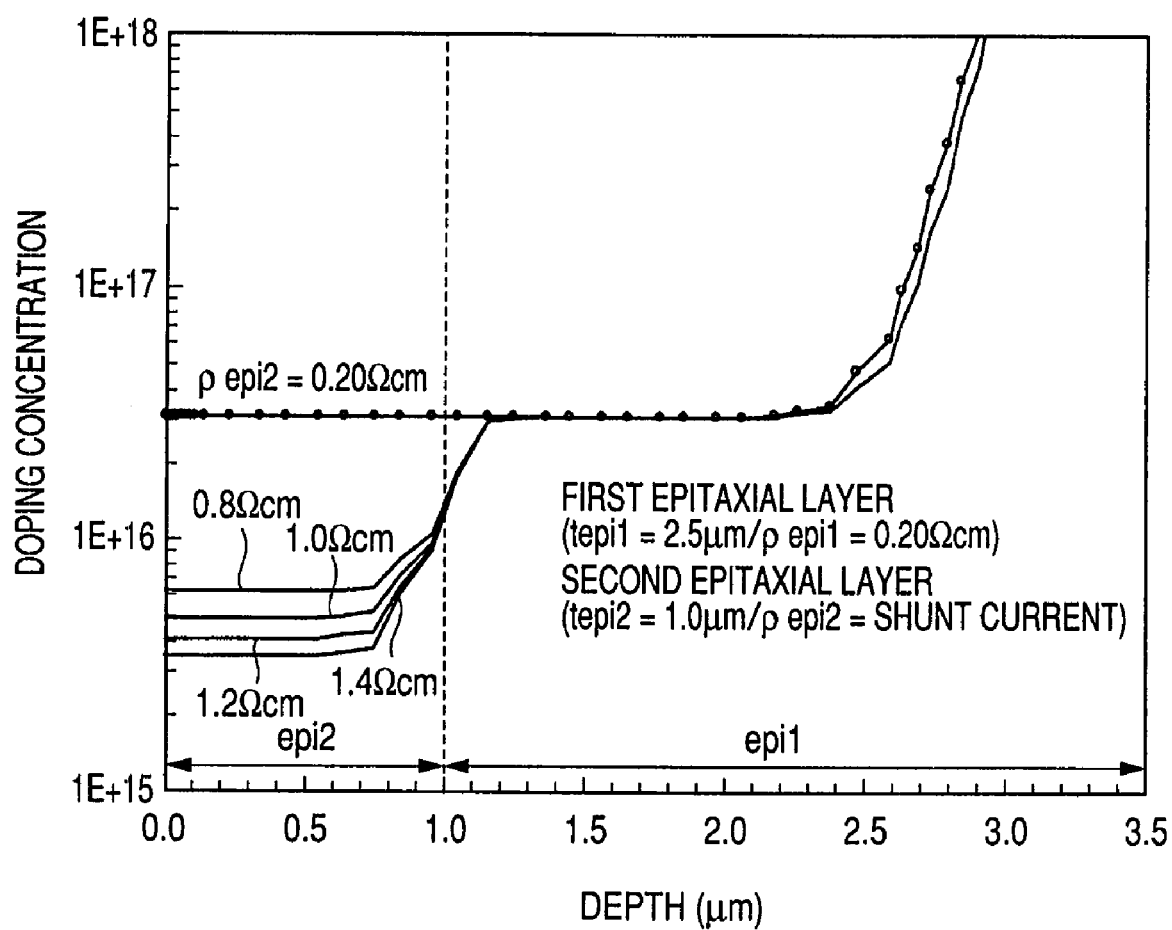
FIG. 15 is a graph, in the second simulation, showing the relationship between a depth from the surface of the second epitaxial layer and a doping concentration after formation of the first epitaxial layer and the second epitaxial layer over the semiconductor substrate.

FIG. 15 is a graph showing the relationship between a depth from the surface of the epitaxial layer epi2 and a doping concentration after formation of the epitaxial layer epi1 and the epitaxial layer epi2 over the semiconductor substrate 1S. In short, this graph shows the semiconductor substrate 1S having thereover only the epitaxial layer epi1 and the epitaxial layer epi2. As shown in FIG. 15, the resistivity of the epitaxial layer epi2 is varied from the resistivity ρepi2 of from 0.2 Ocm, 0.8 Ocm, 1.0 Ocm, 1.2 Ocm, and 1.4 Ocm. As is apparent from FIG. 15, the higher the resistivity ρepi2, the lower the doping concentration, which is similar to the first simulation shown in FIG. 10.

Also in the state shown by FIG. 15, similar to FIG. 10, the boundary between the epitaxial layer epi2 and the epitaxial layer epi1 is present 1.0 μm deep from the surface of the epitaxial layer epi2. The depth of the trench is 0.8 μm. In consideration of this, the boundary between the epitaxial layer epi2 and the epitaxial layer epi1 is present in a region deeper than the depth of the trench when only the epitaxial layer epi1 and the epitaxial layer epi2 are formed over the semiconductor substrate 1S (the state of FIG. 15).

Figure 16:
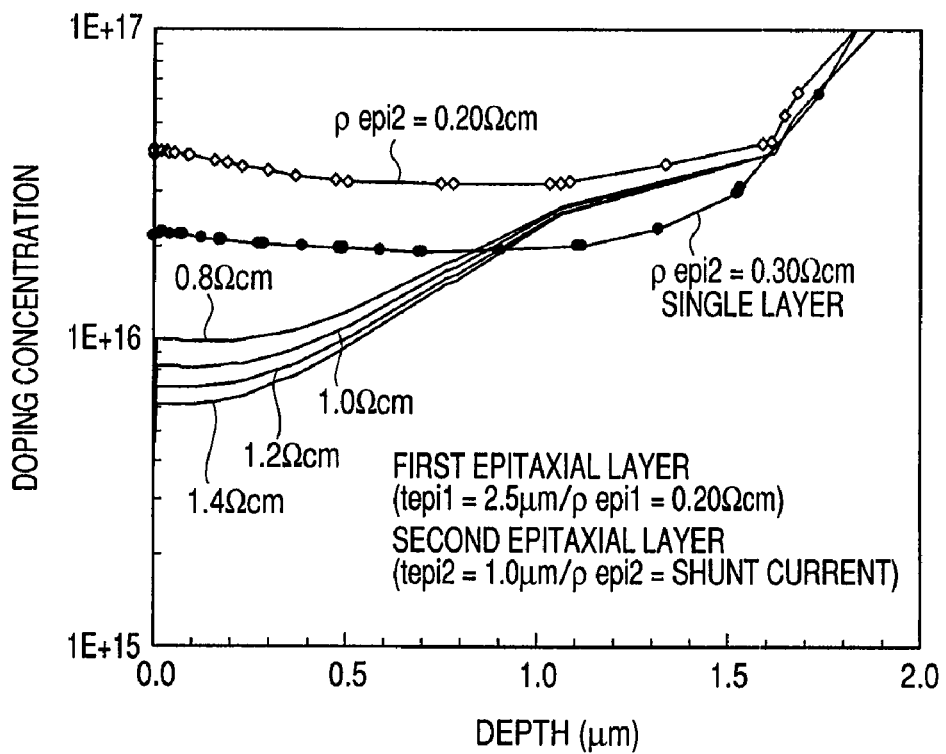
FIG. 16 is a graph showing the relationship between a depth from the surface of the second epitaxial layer and a doping concentration after completion of the semiconductor device having a power MISFET and a Schottky barrier diode SBD (second simulation)

FIG. 16 is a graph showing the relationship between a depth from the surface of the epitaxial layer epi2 and a doping concentration after completion of the semiconductor device having a power MISFET and a Schottky barrier diode SBD. In short, FIG. 16 is a graph showing the relationship between a depth from the surface of the epitaxial layer epi2 and a doping concentration after various heat treatment steps.

As shown in FIG. 16, at the boundary between the epitaxial layer epi2 and the epitaxial layer epi1, the doping concentration shows a gradual change due to diffusion of impurities by the heat treatment. The boundary between the epitaxial layer epi2 and the epitaxial layer epi1 transfers to a region shallower than that shown in FIG. 15 and is present in a region shallower than the depth (0.8 μm) of the trench.

Even after completion of the semiconductor device, the doping concentration in the surface of the epitaxial layer epi2 can be made lower as the resistivity ρepi2 becomes higher. This suggests that as the resistivity ρepi2 of the epitaxial layer epi2 becomes higher, the avalanche breakdown voltage of the Schottky barrier diode SBD formed on the surface of the epitaxial layer epi2 can be made higher.

Figure 17:
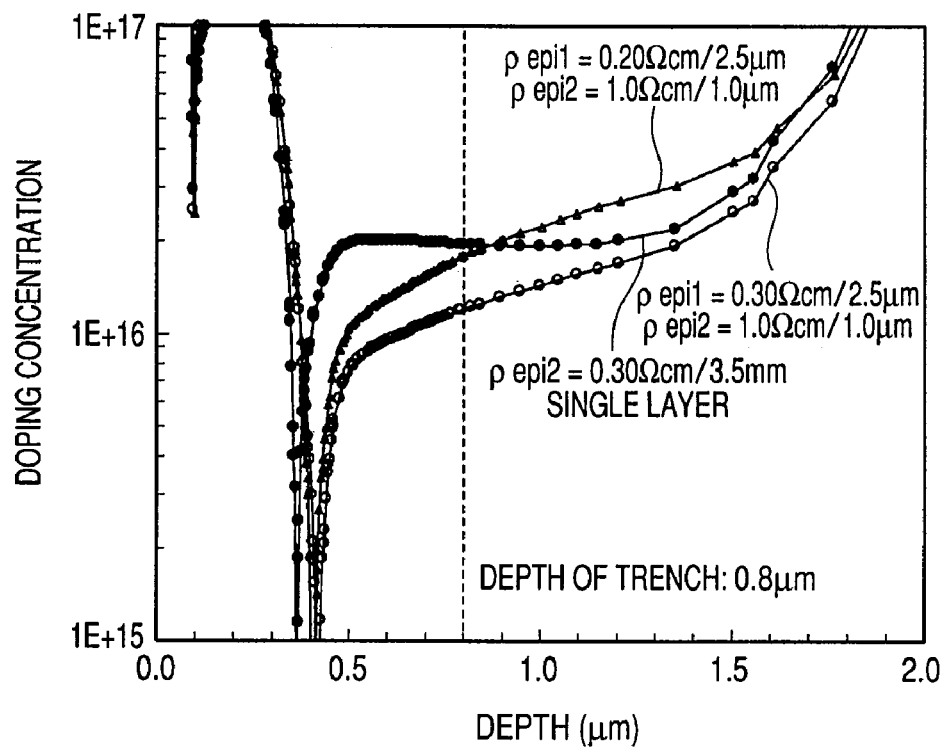
FIG. 17 is a graph showing a depth from the surface of the second epitaxial layer and a doping concentration in the power MISFET formation region (second simulation)

FIG. 17 is a graph showing the depth from the surface of the epitaxial layer epi2 and the doping concentration in the power MISFET formation region. In FIG. 17, a graph plotted with triangles shows the results of the second simulation. In the graph (line) plotted with triangles, the resistivity ρepi1 of the first epitaxial layer epi1 is 0.2 Ocm and the resistivity ρepi2 of the second epitaxial layer epi2 is 1.0 Ocm. At this time, the thickness tepi1 of the epitaxial layer epi1 is 2.5 μm and the thickness tepi2 of the second epitaxial layer is 1.0 μm.

As illustrated in FIG. 17, in a region deeper than the depth (0.8 μm) of the trench, the graph showing the results of the second simulation and plotted with triangles shows a higher doping concentration than the graph showing the conventional structure and plotted with solid circles. The conventional structure employs a single epitaxial layer and this single epitaxial layer has a resistivity of 0.3 Ocm. This suggests that the resistance in a region deeper than the trench and will serve as a drift region of the power MISFET can be made lower than that of the conventional structure. The graph plotted with blank circles shows the results of the first simulation. In this case, similar to FIG. 12, the doping concentration becomes lower than that of the conventional structure in a drift region deeper than the trench. According to the results of the first simulation, the resistance therefore becomes higher than that of the conventional structure. It is therefore expected that in the second simulation, a drastic increase in the on-resistance of the power MISFET can be suppressed by changing the resistivity ρepi1 of the first epitaxial layer epi1 from 0.3 Ocm to 0.2 Ocm.

Figure 18:
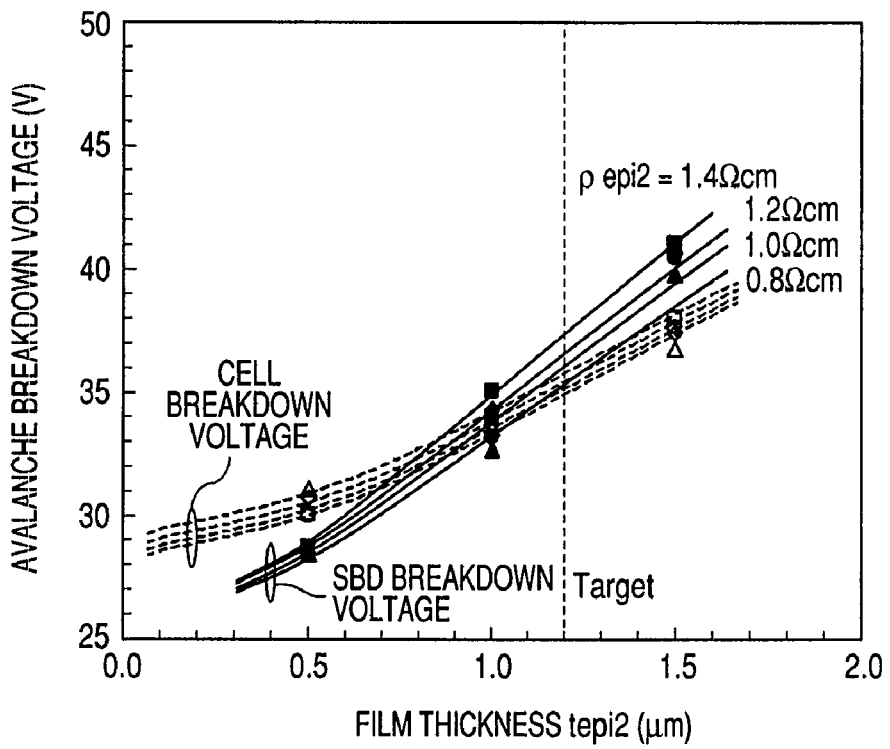
FIG. 18 is a graph showing the relationship between a thickness of the second epitaxial layer and an avalanche breakdown voltage of the Schottky barrier diode SBD and a thickness of the second epitaxial layer and an avalanche breakdown voltage of the power MISFET.

Repetition of the second simulation while changing the thickness tepi2 of the epitaxial layer epi2 results in the following. FIG. 18 is a graph showing the relationship between a thickness tepi2 of the epitaxial layer epi2 and an avalanche breakdown voltage of the Schottky barrier diode SBD and the relationship between a thickness tepi2 of the epitaxial layer epi2 and an avalanche breakdown voltage of the power MISFET. FIG. 18 shows simultaneously the relationships when the resistivities ρepi2 of the epitaxial layer epi2 are 0.8 Ocm, 1.0 Ocm, 1.2 Ocm, and 1.4 Ocm, respectively. The thickness tepi2 of the epitaxial layer epi2 is plotted on the abscissa of FIG. 18, while the avalanche breakdown voltage is plotted on the ordinate of FIG. 18. A solid line in the graph indicates the Schottky barrier diode SBD and a broken line in the graph indicates the power MISFET. The thickness tepi2 of the epitaxial layer epi2 is not a film thickness upon completion of the semiconductor device but that upon formation of the epitaxial layer epi2.

As illustrated in FIG. 18, the avalanche breakdown voltage of the Schottky barrier diode SBD becomes higher than the avalanche breakdown voltage of the power MISFET at the thickness tepi2 of the epitaxial layer epi2 exceeding 1.0 μm. It is therefore possible to adjust the thickness tepi2 of the epitaxial layer epi2 to about 1.2 μm in order to make the avalanche breakdown voltage of the Schottky barrier diode SBD higher than the avalanche breakdown voltage of the power MISFET.

Figure 19:
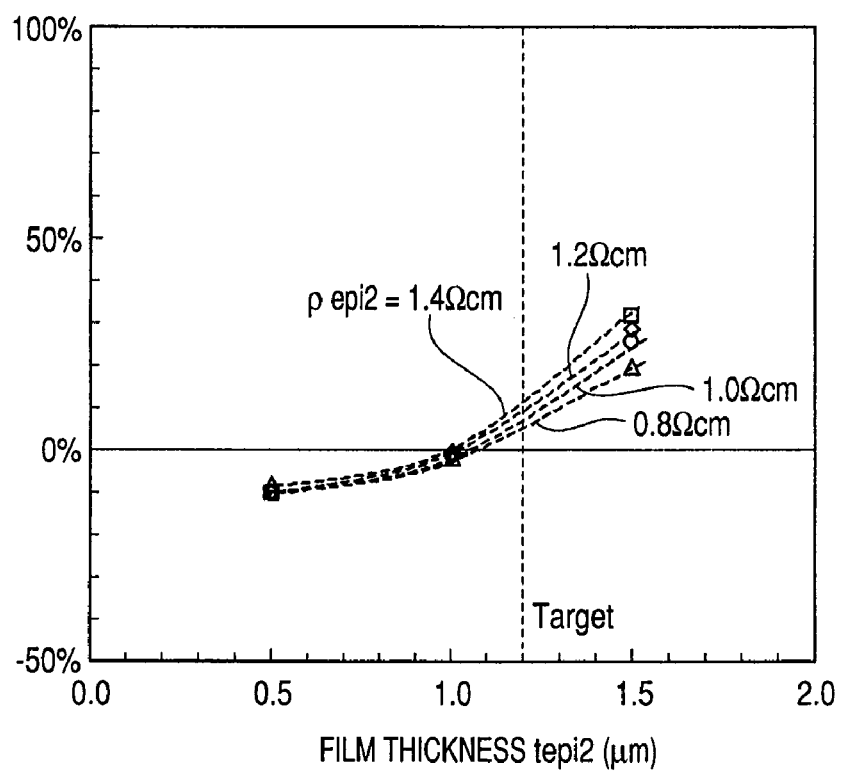
FIG. 19 is a graph, in the second simulation, showing the relationship between a thickness of the second epitaxial layer and a relative on-resistance of the power MISFET.

FIG. 19 is a graph showing the relationship between a thickness tepi2 of the epitaxial layer epi2 and a relative on-resistance of the power MISFET. The thickness tepi2 of the epitaxial layer epi2 is plotted on the abscissa of FIG. 19, while the relative on-resistance of the power MISFET is plotted on the ordinate of FIG. 19. The on-resistance of the power MISFET is a value relative to the on-resistance of the conventional structure composed of a single epitaxial layer having a resistivity of 0.3 Ocm. FIG. 19 shows simultaneously the relationships when the resistivities of the epitaxial layer epi2 are 0.8 Ocm, 1.0 Ocm, 1.2 Ocm, and 1.4 Ocm, respectively.

As derived from FIG. 18, it is presumed to set the thickness tepi2 of the epitaxial layer epi2 to about 1.2 μm in order to make the avalanche breakdown voltage of the Schottky barrier diode SBD higher than the avalanche breakdown voltage of the power MISFET. Application of this result to FIG. 19 reveals that although the on-resistance at this time is higher than the on-resistance of the conventional structure, an increase in the on-resistance can be suppressed at from about 5% to 10% compared with that of the conventional structure. It is therefore understood that under the conditions of the second simulation, the avalanche breakdown voltage of the Schottky barrier diode SBD can be raised and a drastic increase of the on-resistance can be suppressed.

Based on the results of the second simulation, by reducing the resistivity ρepi1 of the first epitaxial layer epi1 to 0.2 Ocm (corresponding to an increase in the doping concentration) and optimizing a ratio of the second epitaxial layer epi2 to the first epitaxial layer epi2 (tepi2/tepi1=1.2 μm/2.3 μm), the resistivity ρepi2 of the second epitaxial layer epi2 can be adjusted to from 0.8 to 1.4 Ocm. This enables to make the avalanche breakdown voltage of the Schottky barrier diode SBD higher than the avalanche breakdown voltage of the power MISFET and to suppress an increase in the on-resistance of the power MISFET to from about 5 to 10%.

As the results of the second simulation suggest, the doping concentration of the second epitaxial layer epi2 can be reduced and therefore, the field intensity on the surface of the epitaxial layer epi2 where a Schottky junction is to be formed can be relaxed, which will hereinafter be described, referring to FIG. 20.

Figure 20:
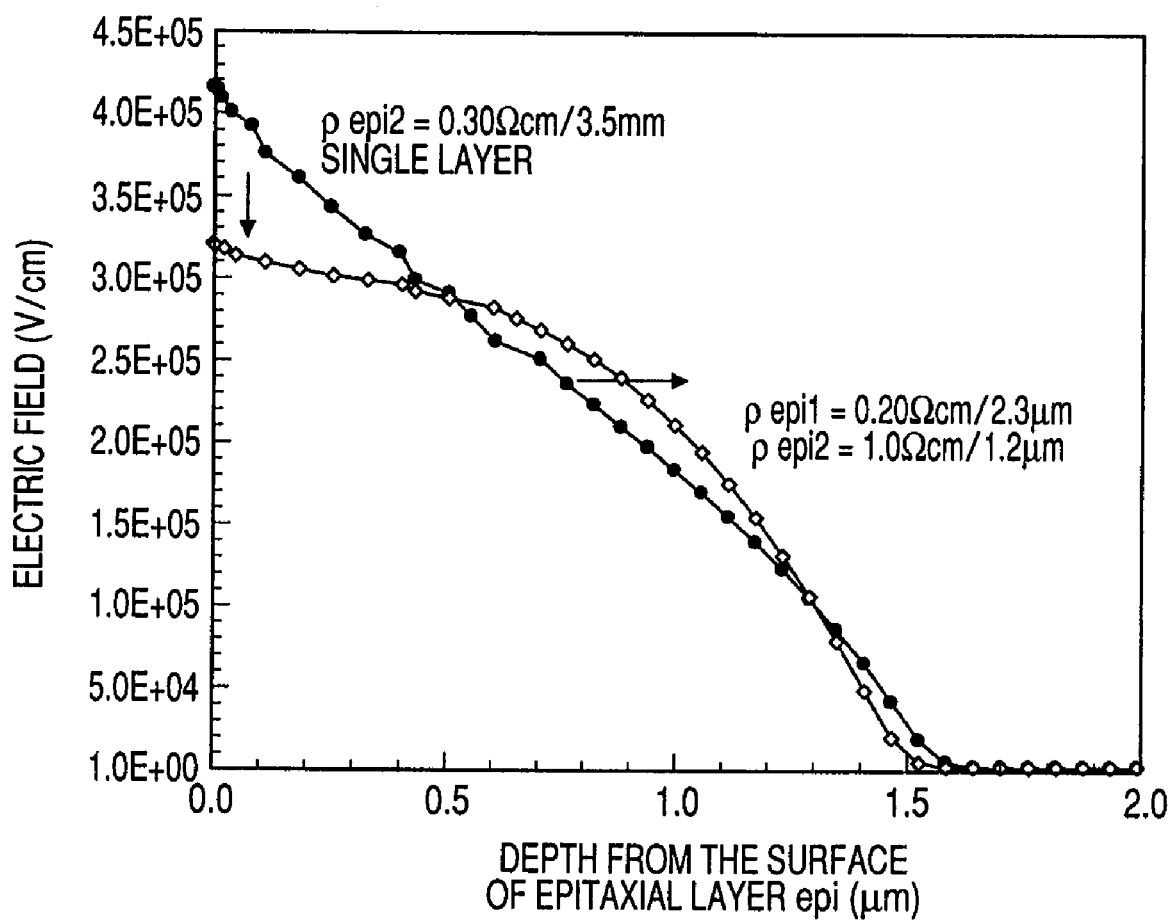
FIG. 20 is a graph showing the relationship between a depth from the surface of the second epitaxial layer and a field intensity.

FIG. 20 is a graph showing the relationship between a depth from the surface of the epitaxial layer epi2 and a field intensity. In FIG. 20, the depth from the surface of the epitaxial layer epi2 is plotted on the abscissa, while the field intensity is plotted on the ordinate. The graph plotted with solid circles shows the conventional structure using a single epitaxial layer, while the graph plotted with squares shows the structure of the second simulation. In the conventional structure, the epitaxial layer has a thickness of 3.5 μm and has a resistivity ρepi1 of 0.3 Ocm. In the structure of the second simulation, on the other hand, the first epitaxial layer epi1 has a thickness of 2.3 μm and a resistivity ρepi1 of 0.2 Ocm and the second epitaxial layer epi2 has a thickness of 1.2 μm and a resistivity ρepi2 of 1.0 Ocm.

As illustrated in FIG. 20, in the conventional structure (solid circles), the field intensity on the surface where a Schottky junction is formed exceeds 4.0E+05 (V/cm). In the structure of the second simulation, on the other hand, the field intensity on the surface of the epitaxial layer epi2 where a Schottky junction is formed is relaxed to about 3.2E+05 (V/cm). This suggests that the avalanche breakdown voltage of the Schottky barrier diode SBD can be made higher in the structure of the second simulation than in the conventional structure. In other words, in the structure of the second simulation, the Schottky barrier diode can have an improved breakdown voltage.

Based on the results of the second simulation, it is possible to quantitatively predict that the semiconductor device of Embodiment 1 can achieve improvement in the avalanche breakdown voltage of the Schottky barrier diode SBD and suppression of a drastic increase in the on-resistance of the power MISFET. Based on the second simulation, a semiconductor device having a Schottky barrier diode SBD and a power MISFET over one semiconductor chip (semiconductor substrate) and having the characteristics of Embodiment 1 was manufactured. It is verified that a DC/DC converter using the resulting semiconductor device can reduce a circuit loss during dead time.

Figure 21:
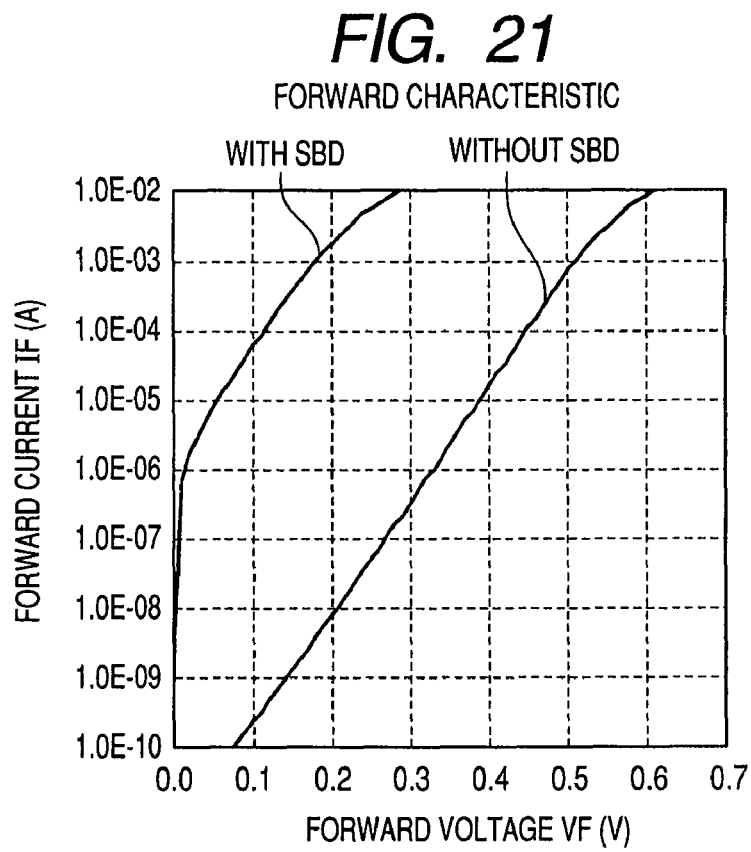
FIG. 21 is a graph showing the relationship between a forward voltage and a forward current in a structure in which a Schottky barrier diode and a power MISFET are formed over one semiconductor substrate and they are coupled to each other in parallel.

FIG. 21 is a graph showing the relationship between a forward voltage VF and a forward current IF in a structure in which a Schottky barrier diode SBD and a power MISFET are formed over one semiconductor substrate and they are coupled to each other in parallel. For comparison, FIG. 21 includes a graph showing the relationship between a forward voltage VF and a forward current IF in a structure without not equipped with a Schottky barrier diode. The structure having no Schottky barrier diode SBD is a structure in which a forward current is provided for a body diode parasitically formed in the power MISFET. In FIG. 21, a forward current IF is plotted on the ordinate, while a drop of a forward voltage VF is plotted on the abscissa.

As illustrated in FIG. 21, when, for example, a forward current IF flows only at 1.0E−0.3 (A), a drop of a forward voltage VF is about 0.2V in a structure equipped with the Schottky barrier diode SBD. On the other hand, in a structure not equipped with the Schottky barrier diode SBD, a drop of the forward voltage VF is even about 0.5V. This means that when the forward current IF is equal, a drop of the forward voltage VF becomes smaller than in the structure equipped with the Schottky barrier diode SBD. This suggests that a loss energy becomes smaller in the structure equipped with the Schottky barrier diode SBD than in the structure not equipped with the Schottky barrier diode SBD. Application of the semiconductor device (structure equipped with the Schottky barrier diode SBD) of Embodiment 1 to a DC/DC converter enables to reduce a circuit loss during a dead time, resulting in reduction in the power consumption of the DC/DC converter.

Figure 22:
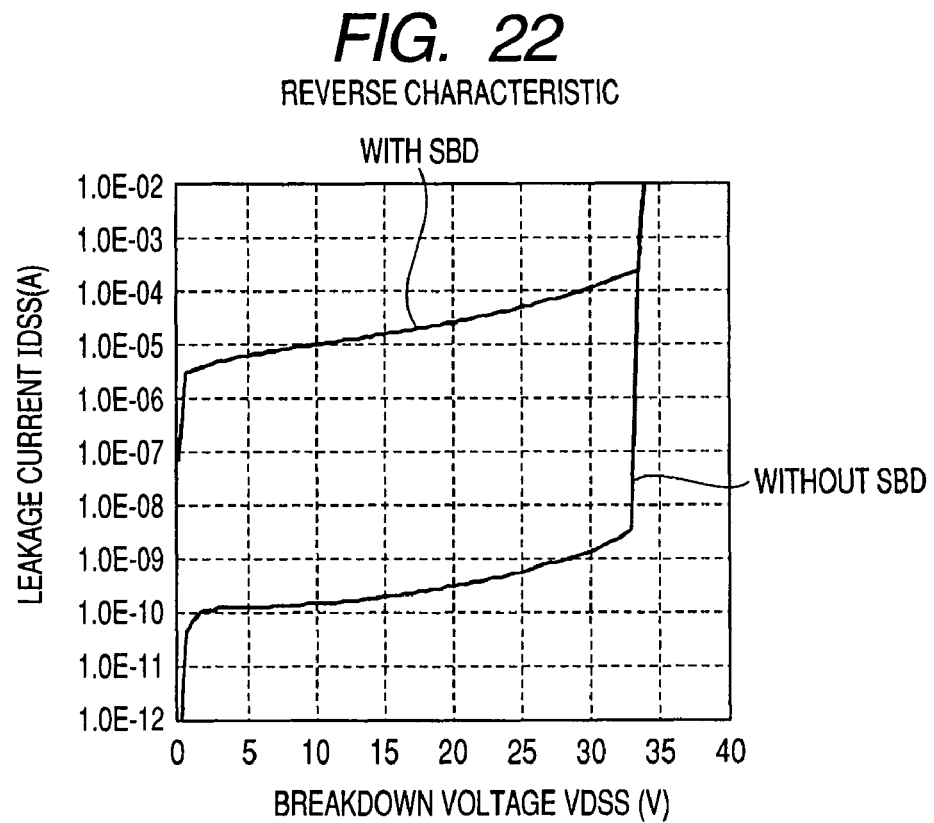
FIG. 22 is a graph showing the relationship between a breakdown voltage (reverse voltage) and a leakage current.

In addition, the semiconductor device according to Embodiment 1 enables to improve the breakdown voltage of the Schottky barrier diode SBD. This advantage will hereinafter be described. FIG. 22 is a graph showing the relationship between a breakdown voltage VDSS (reverse voltage) and a leakage current IDSS. More specifically, FIG. 22 shows the relationship between a breakdown voltage VDSS (reverse voltage) and a leakage current IDSS both in the semiconductor device of Embodiment 1 having, over one semiconductor substrate thereof, a Schottky barrier diode SBD and a power MISFET arranged in parallel and a structure not equipped with a Schottky barrier diode SBD. In FIG. 22, the breakdown voltage VDSS is plotted on the abscissa and the leakage current is plotted on the ordinate.

As is apparent from FIG. 22, the semiconductor device (having a structure equipped with the Schottky barrier diode SBD) according to Embodiment 1 has a breakdown voltage VDSS (about 33V) similar to the breakdown voltage (VDSS) of the structure (body diode) not equipped with a Schottky barrier diode SBD. In other words, in a structure obtained by forming a power MISFET and a Schottky barrier diode SBD over a single epitaxial layer, the Schottky barrier diode SBD has inevitably a reduced breakdown voltage (avalanche breakdown voltage). According to Embodiment 1, however, two epitaxial layers, that is, the epitaxial layer epi1 having a high doping concentration and the epitaxial layer epi2 having a low doping concentration are formed over the semiconductor substrate 1S and the boundary between the epitaxial layer epi1 and the epitaxial layer epi2 is formed in a region as deep as the bottom portion of the trench T or shallower than the bottom portion of the trench T. The Schottky barrier diode SBD is therefore formed using a Schottky junction between the lightly-doped epitaxial layer epi2 and the first metal film 6. As illustrated in FIG. 22, the breakdown voltage in Embodiment 1 can be kept equal to that of the structure (body diode) not equipped with the Schottky barrier diode.

With regards to the characteristics of the Schottky barrier diode SBD, as illustrated in FIGS. 21 and 22, a drop of the forward voltage VF can be reduced, but the leakage current increases when a reverse voltage is applied. Although the leakage current of the Schottky barrier diode is greater than that of the body diode (a structure not equipped with a Schottky barrier diode SBD) using a pn junction, it does not substantially affect the practical use.

The Schottky barrier diode has an increased leakage current IDSS when a drop of the forward voltage VF is reduced. This means that the area of the Schottky barrier diode SBD should be increased in order to reduce a drop of the forward voltage VF. The increase in the area of the Schottky barrier diode SBD however leads to an increase in the leakage current IDSS. Between the drop of the forward voltage VF and the leakage current IDSS, there is therefore a trade-off relationship from the standpoint of the area of the Schottky barrier diode SBD. The magnitude of the leakage current IDSS however depends on not only the area of the Schottky barrier diode SBD but also the kind of a metal film forming the Schottky junction.

Figure 23:
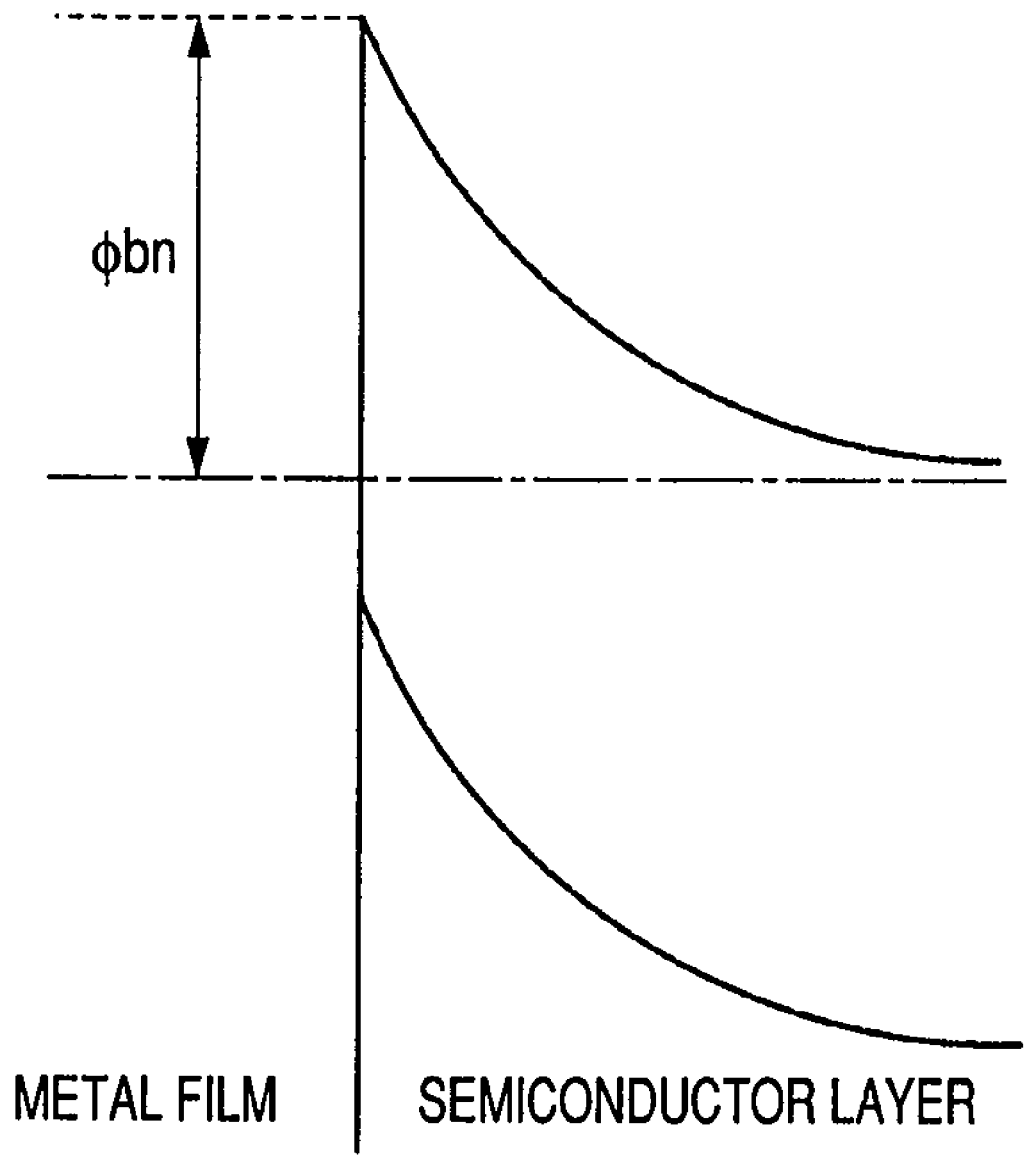
FIG. 23 illustrates a band structure of a metal film and a semiconductor layer forming a Schottky junction.

For example, FIG. 23 illustrates a band structure of a metal film and a semiconductor layer forming a Schottky junction. In FIG. 23, φbn represents a Schottky barrier height and the magnitude of the leakage current IDSS varies, depending on the Schottky barrier height φbn. At this time, the Schottky barrier height φbn varies, depending on the kind of the metal film. The magnitude of the leakage current IDSS can therefore be adjusted by changing the kind of a metal film used for the formation of a Schottky junction. More specifically, with an increase in the Schottky barrier height φbn, the leakage current IDSS can be reduced. In other words, with a decrease in the Schottky barrier height φbn, the leakage current IDSS increases.

This suggests that a metal film having a relatively low Schottky barrier height φbn may be used when some increase in the leakage current IDSS is allowed, while a metal film having a relatively high Schottky barrier height φbn may be used when the leakage current IDSS should be decreased. For example, a titanium tungsten (TiW) film has a Schottky barrier height φbn of 0.65 eV and a titanium nitride/titanium (TiN/Ti) film has a Schottky barrier height φbn of 0.60 eV. This means that use of a titanium tungsten film as the metal film can reduce the leakage current IDSS. Use of a titanium nitride/titanium film as the metal film, on the other hand, provides some increase in the leakage current IDSS.

Thus, the leakage current IDSS increases by expanding the area of the Schottky barrier diode SBD in order to reduce a drop of the forward voltage VF of the Schottky barrier diode SBD. The increase in the leakage current IDSS can however be suppressed by selecting, as the metal film forming a Schottky junction, a material having a high Schottky barrier height φbn such as a titanium tungsten film. If some increase in the leakage current is allowed, on the other hand, a material having a low Schottky barrier height φbn such as titanium nitride/titanium film can be selected. A cobalt (Co) film popularly used in the process (salicide) of simultaneously forming a silicide over a gate electrode and a diffusion layer (such as source region) has a Schottky barrier height φbn of from 0.64 to 0.68 eV. Use of this film enables to make the leakage current IDSS smaller than that when titanium is used as the metal film.

A manufacturing method of the semiconductor device according to Embodiment 1 will hereinafter be described referring to some drawings.

Figure 24:
FIG. 24 is a cross-sectional view illustrating a manufacturing step of a semiconductor device according to Embodiment 1 of the present invention.
Figure 24:
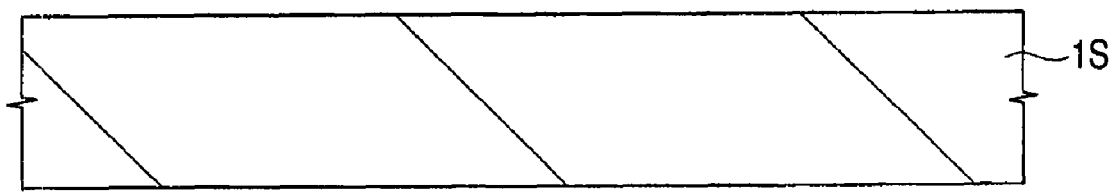

As illustrated in FIG. 24, a semiconductor substrate 1S doped with n type impurities such as phosphorus or arsenic is prepared. FIG. 24 illustrates power MISFET formation regions and an SBD formation region (Schottky barrier diode SBD formation region) of the semiconductor substrate 1S. Described specifically, the SBD formation region is sandwiched between the power MISFET formation regions formed on both sides thereof.

Figure 25:
FIG. 25 is a cross-sectional view illustrating a manufacturing step of the semiconductor device following that of FIG. 24.
Figure 25:
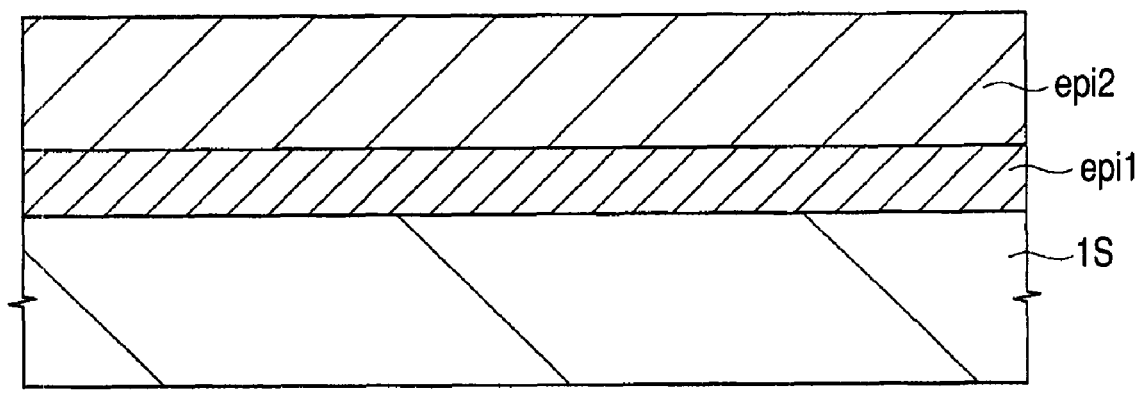

As illustrated in FIG. 25, an epitaxial layer epi1 is then formed over the semiconductor substrate 1S, followed by the formation of an epitaxial layer epi2 over the epitaxial layer epi1. The epitaxial layer epi1 and the epitaxial layer epi2 are each formed by the epitaxial growth, but they are different from each other in the amount of n type impurities introduced therein. More specifically, the n type impurities are introduced heavily into the epitaxial layer epi1 formed as a first layer, while the n type impurities are introduced lightly into the epitaxial layer epi2 formed as the second layer. In Embodiment 1, the semiconductor substrate 1S, the epitaxial layer epi1, and the epitaxial layer epi2 will hereinafter be called "multilayer substrate", collectively.

Figure 26:
FIG. 26 is a cross-sectional view illustrating another method for forming a multilayer substrate.
Figure 26:
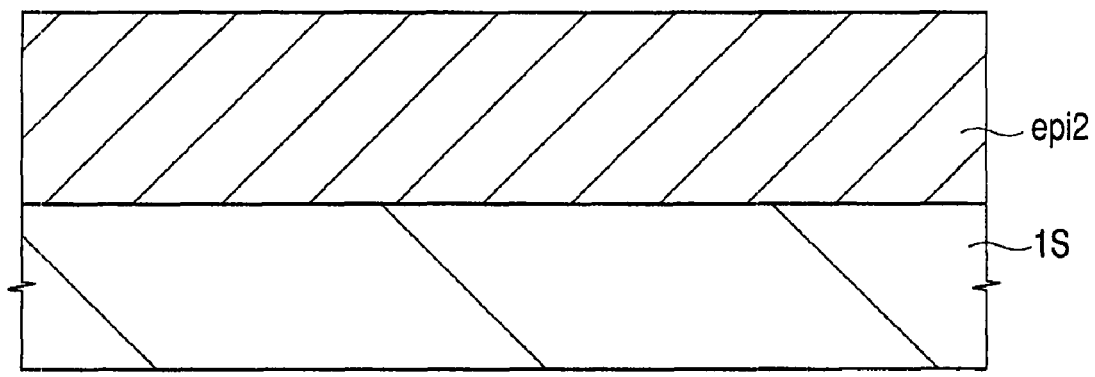
Figure 27:
FIG. 27 is a cross-sectional view illustrating a manufacturing step of the semiconductor device following that of FIG. 26.
Figure 27:
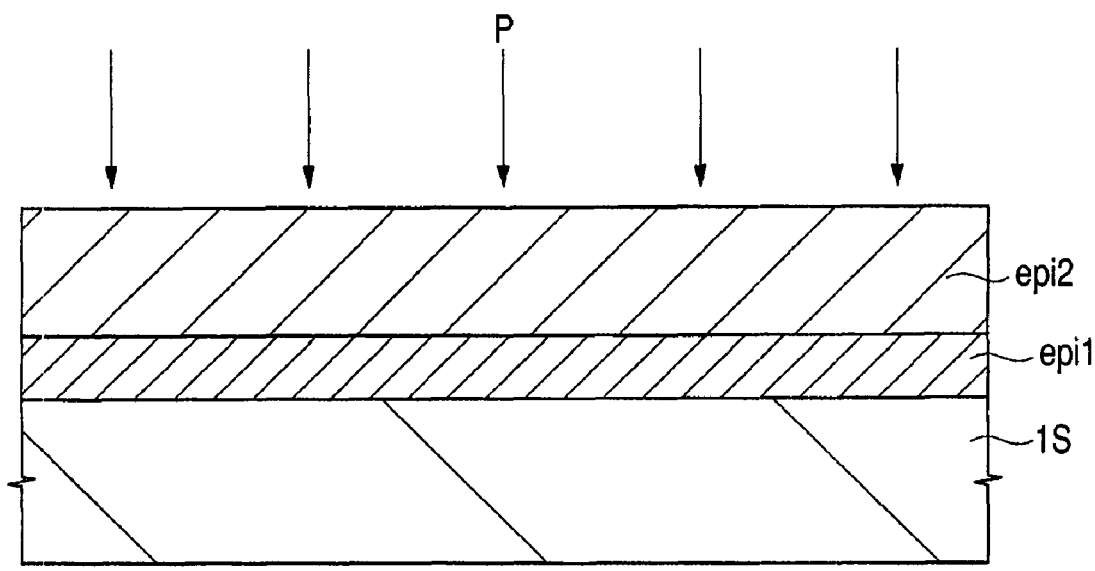

Another method for forming the multilayer substrate will next be described. As illustrated in FIG. 26, a lightly doped epitaxial layer epi2 is formed over the semiconductor substrate 1S. The lightly doped epitaxial layer epi2 is formed, for example, by the epitaxial growth. Then, as illustrated in FIG. 27, n type impurities such as phosphorus are introduced into a deep region contiguous to the semiconductor substrate 1S by employing ion implantation for the entire surface of the semiconductor substrate 1S. This enables to form a heavily doped epitaxial layer epi1 having a higher doping concentration than that of the epitaxial layer epi2 between the semiconductor substrate 1S and the epitaxial layer epi2. As a result, a multilayer substrate having, on the semiconductor substrate 1S thereof, the heavily doped epitaxial layer epi1 and the lightly doped epitaxial layer epi1 can be formed.

Figure 28:
FIG. 28 is a cross-sectional view illustrating a further method for forming a multilayer substrate.
Figure 28:
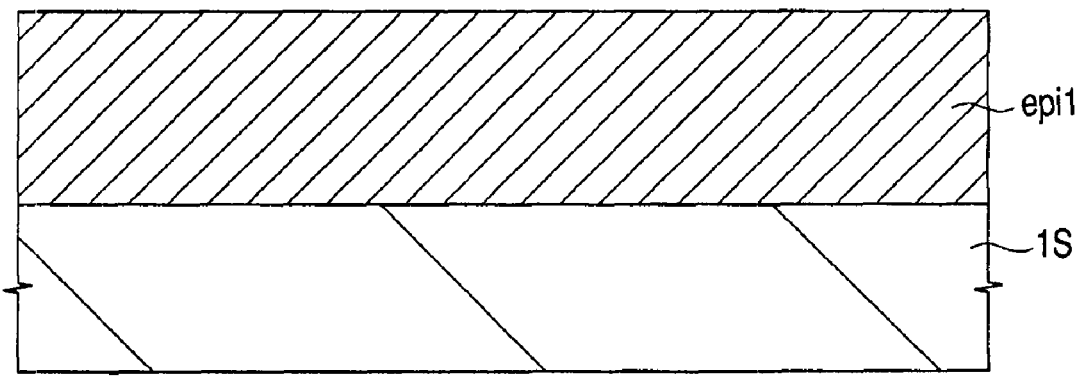
Figure 29:
FIG. 29 is a cross-sectional view illustrating a manufacturing step of the semiconductor device following that of FIG. 28.
Figure 29:
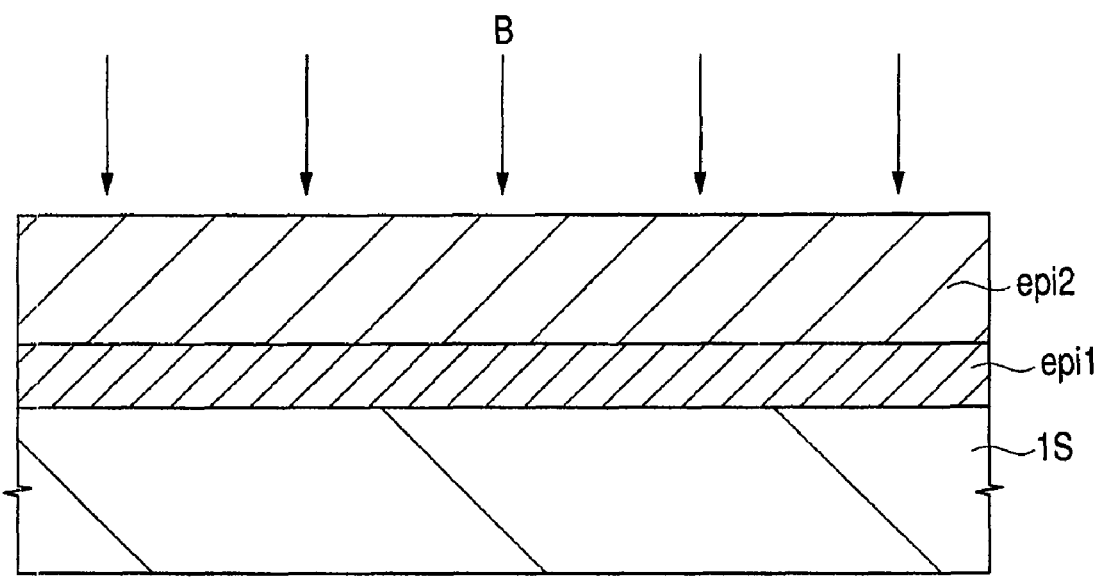

A further method for forming the multilayer substrate will next be described. As illustrated in FIG. 28, a heavily doped epitaxial layer (n type semiconductor layer) epi1 is formed over the semiconductor substrate 1S. This heavily doped epitaxial layer epi1 can be formed using, for example, the epitaxial growth. Then, as illustrated in FIG. 29, p type impurities such as boron are introduced into a shallow region of the epitaxial layer epi1 by using ion implantation for the entire surface of the semiconductor substrate 1S. This enables to form an epitaxial layer epi2 having a low doping concentration than that of the epitaxial layer epi1 in the shallow region of the epitaxial layer epi1. This means that introduction of p type impurities having a conductivity type opposite to that of the n type impurities into the shallow region of the epitaxial layer epi1 offsets the n type impurities of the epitaxial layer epi1 into which the p type impurities have been introduced, whereby the concentration of the n type impurities becomes low. As a result, a multilayer substrate having, over the semiconductor substrate 1S thereof, the heavily doped epitaxial layer epi1 and the lightly doped epitaxial layer epi2 can be formed.

As described above, there are three methods for forming a multilayer substrate. Of these, the first one is the most inexpensive method. The second method and the third method are also usable, but the second one is preferred, because the doping concentration of the lightly doped epitaxial layer epi2 can be made uniform more easily in the second method. The lightly doped epitaxial layer epi2 is a layer to be used for forming a Schottky barrier diode and a doping concentration should be realized as designed in order to ensure the breakdown voltage of the Schottky barrier diode. In the second method, the lightly doped epitaxial layer epi2 is formed by the epitaxial growth so that its doping concentration tends to be constant with less variation. In the third method, on the other hand, the lightly doped epitaxial layer epi2 is formed by ion implantation so that the doping concentration of the epitaxial layer epi2 tends to vary.

Figure 30:
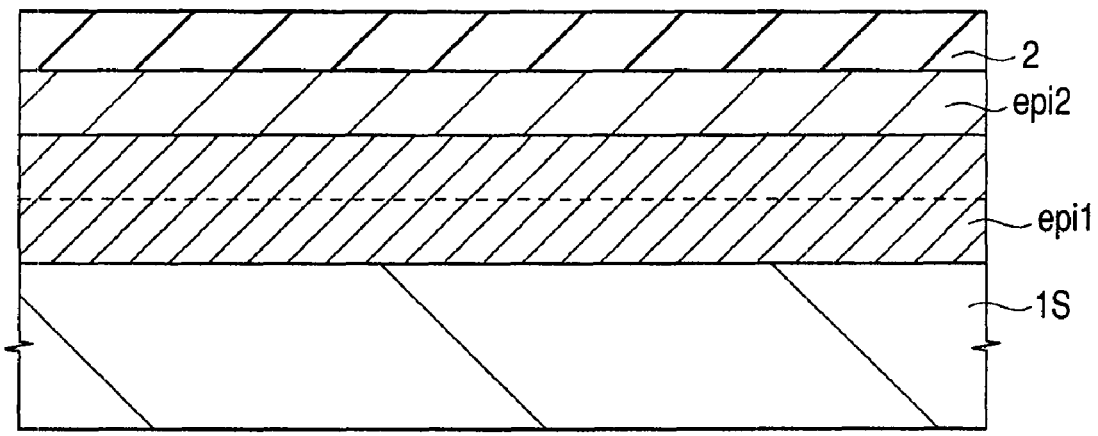
FIG. 30 is a cross-sectional view illustrating a manufacturing step of the semiconductor device following that of FIG. 29.

Steps after the formation of the multilayer substrate will hereinafter be described. As illustrated in FIG. 30, a silicon oxide film 2 is formed over the epitaxial layer epi2. This silicon oxide film 2 can be formed, for example, by wet oxidation at about 1000° C. By the heat treatment for forming this silicon oxide film 2, impurity diffusion occurs from the heavily doped epitaxial layer epi1 to the lightly doped epitaxial layer epi2. This means that rise of the impurities from the epitaxial layer epi1 leads to a decrease in the thickness of the epitaxial layer epi2. In addition, it flattens the concentration gradient of the impurities at the boundary between the epitaxial layer epi1 and the epitaxial layer epi2. In Embodiment 1, by the heat treatment in the step of forming the silicon oxide film 2 illustrated in FIG. 30, impurities are diffused from the epitaxial layer epi1 to the epitaxial layer epi2, but a similar diffusion phenomenon also occurs in another heat treatment step. In Embodiment 1, however, a change of the position of the boundary between the epitaxial layer epi1 and the epitaxial layer epi2 due to the influence of another heat treatment step is omitted.

Figure 31:
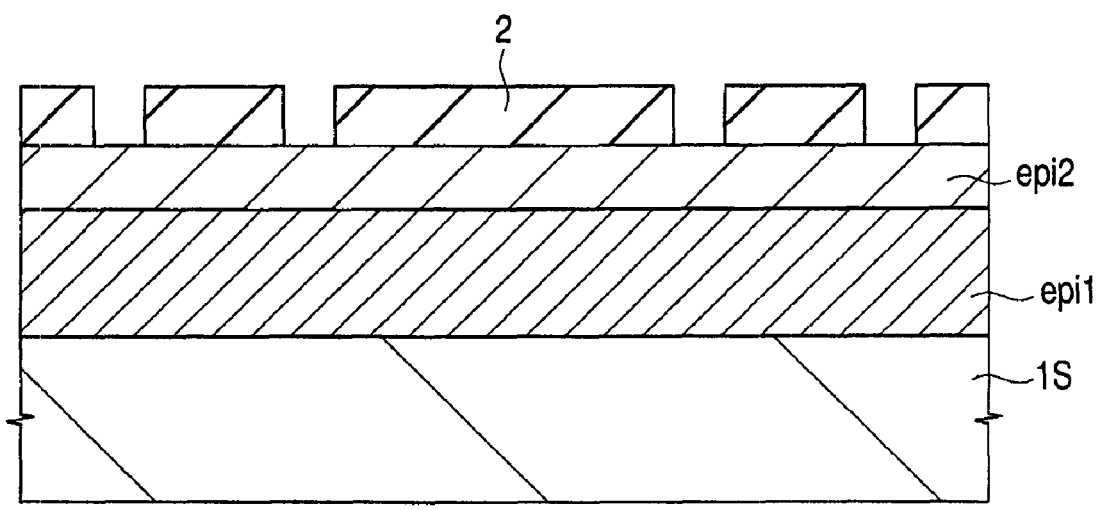
FIG. 31 is a cross-sectional view illustrating a manufacturing step of the semiconductor device following that of FIG. 30.
Figure 32:
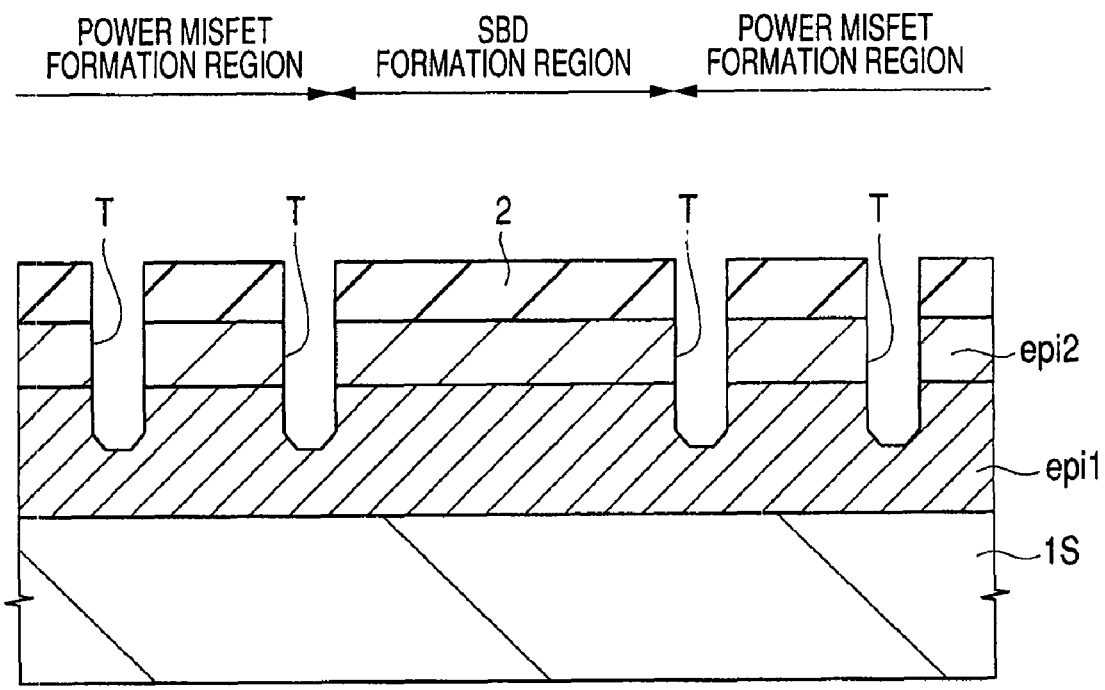
FIG. 32 is a cross-sectional view illustrating a manufacturing step of the semiconductor device following that of FIG. 31.

As illustrated in FIG. 31, the silicon oxide film 2 is then patterned using photolithography and etching. The patterning of the silicon oxide film 2 is performed so as to open therein a trench formation region. By etching with the patterned silicon oxide film 2 as a mask, a trench T is formed in the multilayer substrate. More specifically, the trench T penetrating through the lightly doped epitaxial layer epi2 and reaching the heavily doped epitaxial layer epi1 is formed. As a result, the boundary between the epitaxial layer epi1 and the epitaxial layer epi2 can be located at a position equal to or shallower than the depth of the trench T. FIG. 32 shows that the boundary between the epitaxial layer epi1 and the epitaxial layer epi2 is located at a position shallower than the depth of the trench T.

The trench T is formed in the power MISFET formation regions. The SBD formation region is sandwiched between the trenches T formed in the end portion of the power MISFET formation regions formed on both sides of the SBD formation region.

Figure 33:
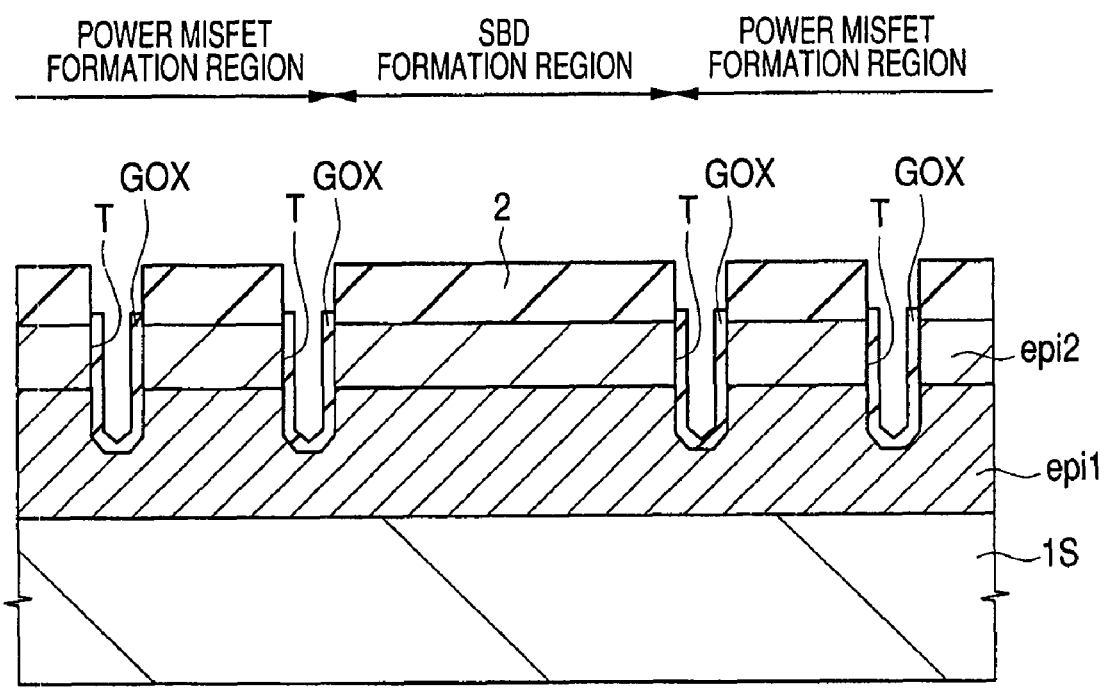
FIG. 33 is a cross-sectional view illustrating a manufacturing step of the semiconductor device following that of FIG. 32.

As illustrated in FIG. 33, a gate insulating film GOX is then formed on the inner wall of the trench T. The gate insulating film GOX is made of, for example, a silicon oxide film and can be formed using, for example, thermal oxidation. The gate insulating film GOX is not limited to a silicon oxide film, but various films may be employed. For example, the gate insulating film GOX may be a silicon oxynitride (SiON) film. This means that nitrogen may be segregated at the interface between the gate insulating film GOX and the trench T. The silicon oxynitride film is more effective than the silicon oxide film in suppressing generation of an interface state in the film or reducing an electron trap. The gate insulating film GOX made of the silicon oxynitride film can therefore have improved hot carrier resistance and improved insulation resistance. In addition, the silicon oxynitride film is more resistant to impurity penetration therethrough than the silicon oxide film. Use of the silicon oxynitride film as the gate insulating film GOX therefore enables to suppress variations in the threshold voltage which may otherwise occur by the diffusion of impurities contained in a gate electrode to the side of the multilayer substrate. The silicon oxynitride film is formed, for example, by heat treating the multilayer substrate in a nitrogenous atmosphere such as NO, $NO_2$ or $NH_3$. Similar effects are available by forming the gate insulating film GOX made of a silicon oxide film on the inner wall of the trench T and then, heat treating the multilayer substrate in a nitrogenous atmosphere to segregate nitrogen at the interface between the gate insulating film GOX and the trench T.

Alternatively, the gate insulating film GOX may be made of a high dielectric film having a higher dielectric constant than that of a silicon oxide film. As the gate insulating film GOX, a silicon oxide film is conventionally used from the standpoint that it has high insulation resistance and excellent electrical/physical stability at a silicon-silicon oxide interface. With the miniaturization of elements, however, the gate insulating film GOX is required to be ultrathin. When a thin silicon oxide film is used as the gate insulating film GOX, however, electrons running through the channel of a MISFET tunnel a barrier formed by the silicon oxide film and flow into the gate electrode. Thus, a so-called tunneling current inevitably occurs.

To overcome the above problem, a high dielectric film using a material having a higher dielectric constant than that of the silicon oxide film and therefore capable of having an increased physical thickness without changing the capacitance has come to be used. Use of such a high dielectric film enables to reduce a leakage current because it can increase the physical film thickness without changing the capacitance.

For example, a hafnium oxide film ($HfO_2$ film), one of hafnium oxides, is used as the high dielectric film. The hafnium oxide film may be replaced by another hafnium insulating film such as hafnium aluminate film, HfON film (hafnium oxynitride film), HfSiO film (hafnium silicate film), HfSiON film (hafnium silicon oxynitride film), or HfAlO film. A hafnium insulating film obtained by introducing, into the above-described hafnium insulating film, tantalum oxide, niobium oxide, titanium oxide, zirconium oxide, lanthanum oxide or yttrium oxide is also usable. These hafnium insulating films have, similar to a hafnium oxide film, a higher dielectric constant than a silicon oxide film or silicon oxynitride film so that they can exhibit a similar effect to the hafnium oxide film.

Figure 34:
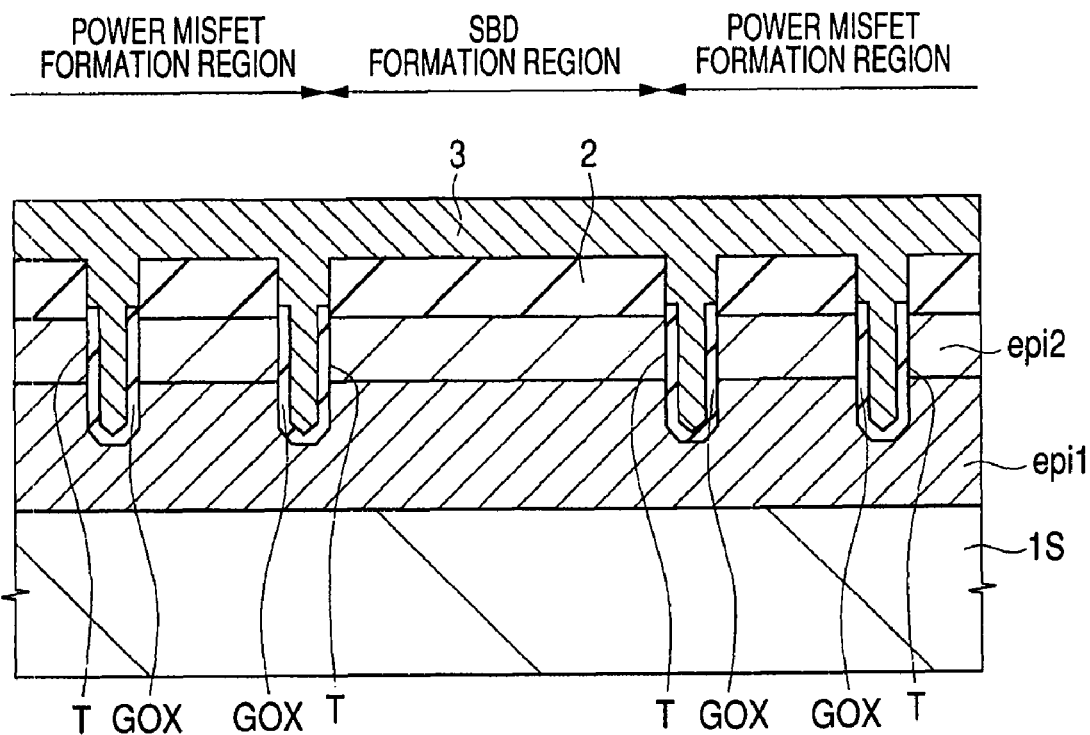
FIG. 34 is a cross-sectional view illustrating a manufacturing step of the semiconductor device following that of FIG. 33.
Figure 35:
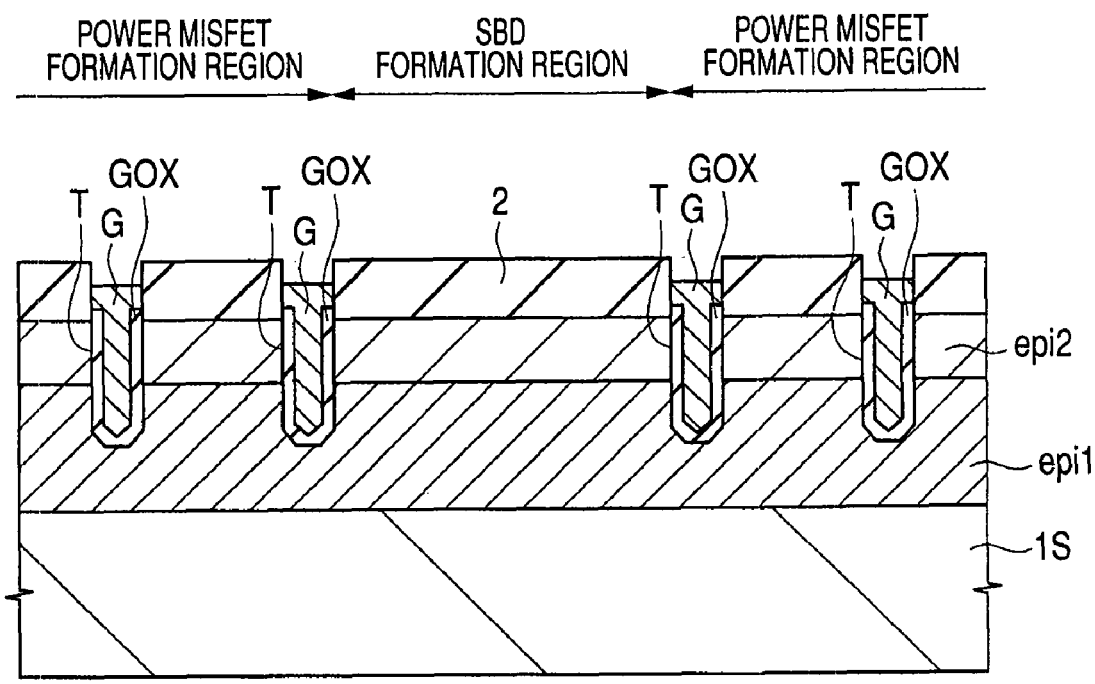
FIG. 35 is a cross-sectional view illustrating a manufacturing step of the semiconductor device following that of FIG. 34.

As illustrated in FIG. 34, a polysilicon film 3 is formed over the silicon oxide film 2. This polysilicon film 3 is formed so as to fill the inside of the trench T therewith. The polysilicon film 3 has been doped with n type impurities such as phosphorus (P) or arsenic (As) and can be formed, for example, by CVD (Chemical Vapor Deposition). Then, as illustrated in FIG. 35, the polysilicon film 3 formed over the silicon oxide film 2 is etched back and removed by overall dry etching, whereby a gate electrode G having a structure in which the polysilicon film 3 has been filled in the trench T is formed.

Figure 36:
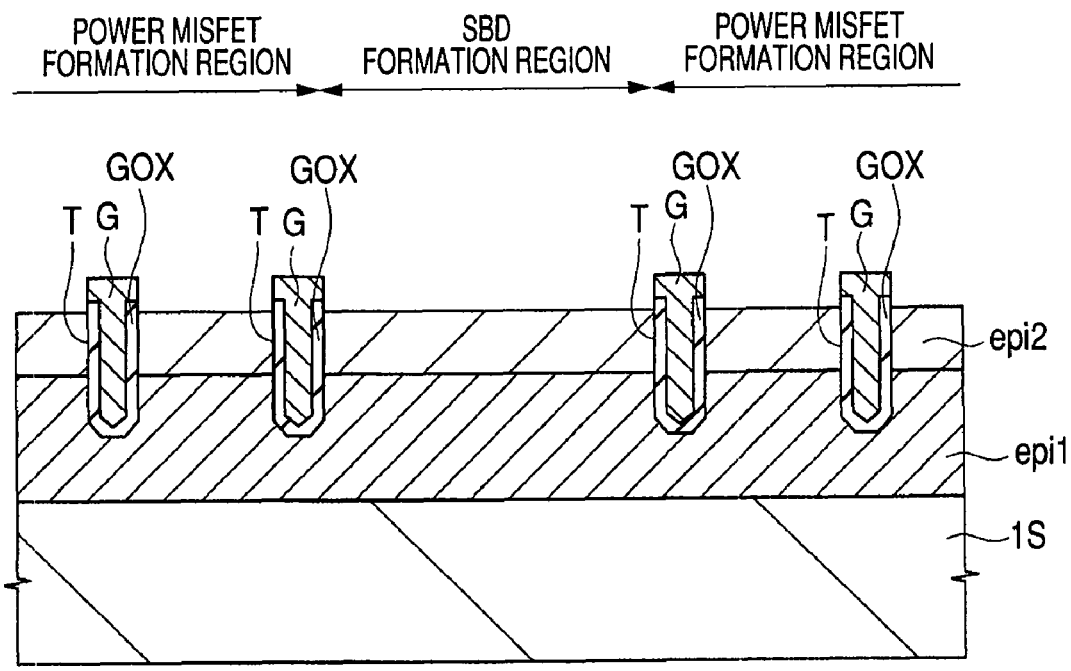
FIG. 36 is a cross-sectional view illustrating a manufacturing step of the semiconductor device following that of FIG. 35.
Figure 37:
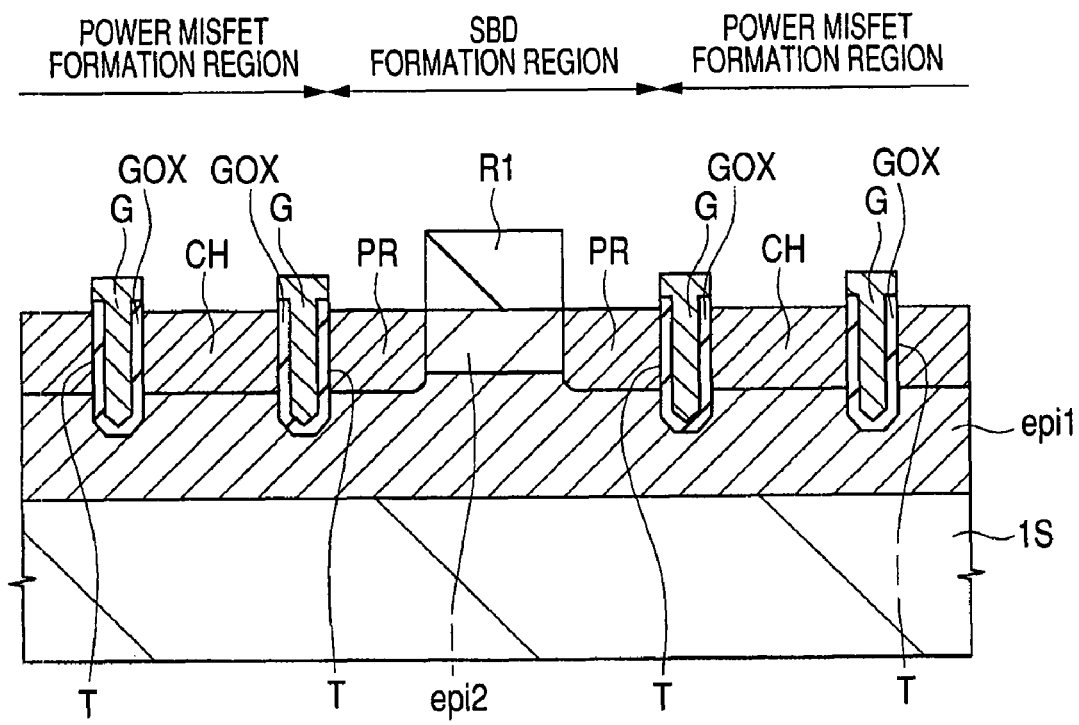
FIG. 37 is a cross-sectional view illustrating a manufacturing step of the semiconductor device following that of FIG. 36.

As illustrated in FIG. 36, the silicon oxide film 2 is then removed, for example, by dry etching. As illustrated in FIG. 37, a resist R1 is formed by application onto the multilayer substrate and the resulting resist film R1 is subjected to exposure/development to pattern the resist film R1. This patterning is performed so as to cover the center portion of the SBD formation region. Then, by ion implantation with the patterned resist film R1 as a mask, p type impurities are introduced into the multilayer substrate, whereby a channel region CH which is a p type semiconductor region is formed in the power MISFET formation region. On the other hand, a p ring PR which is a p type semiconductor region is formed in the end portion of the SBD formation region not covered with the resist R1. Thus, in Embodiment 1, the channel region CH in the power MISFET formation region and the p ring PR in the end portion of the SBD formation region are formed in one step. The channel region CH and the p ring PR region have therefore an equal doping concentration.

The channel region CH and the p ring PR are formed in a region shallower than the depth of the trench T but the p type impurities are introduced to completely offset the epitaxial layer epi2 which is an n type semiconductor region. This means that the channel region CH and the p ring PR are formed so as to reach to a region deeper than the boundary between the epitaxial layer epi1 and the epitaxial layer epi2. As a result, the epitaxial layer epi2 completely disappears in the power MISFET formation region.

Figure 38:
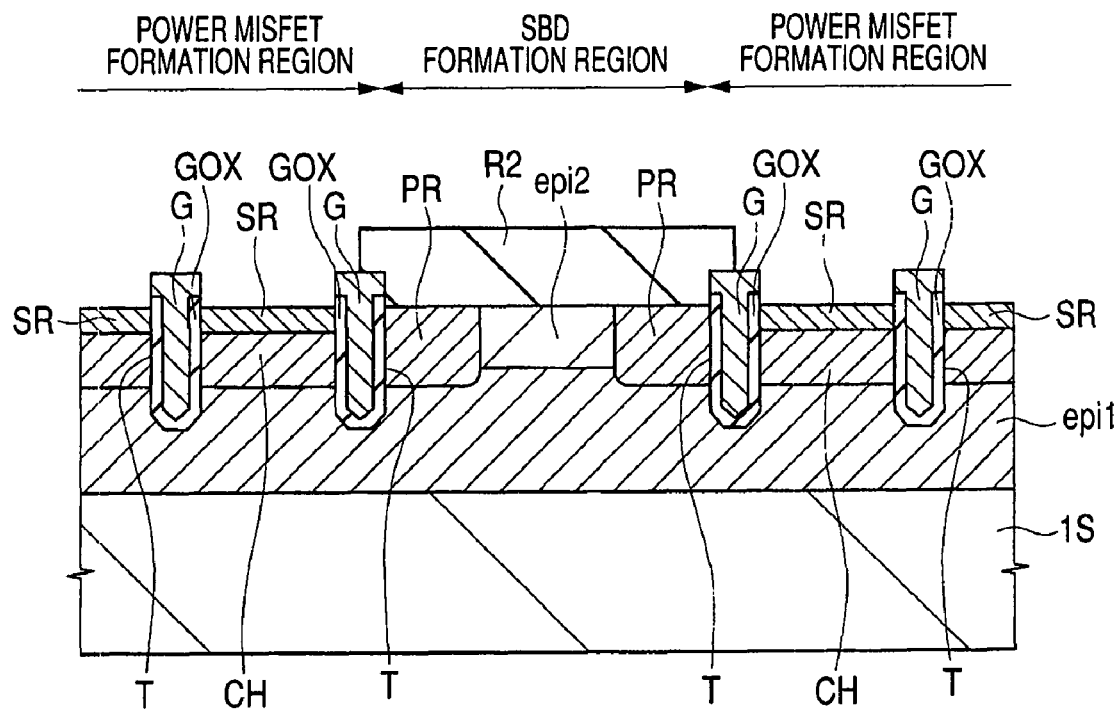
FIG. 38 is a cross-sectional view illustrating a manufacturing step of the semiconductor device following that of FIG. 37.

After removal of the patterned resist film R1, a resist film R2 is formed by application onto the multilayer substrate as illustrated in FIG. 38. The resulting resist film R2 is subjected to exposure/development treatment to pattern the resist film R2. The resist film R2 is patterned so as to cover the SBD formation region therewith. Then, by ion implantation with the patterned resist film R2 as a mask, a source region SR which is an n type semiconductor region is formed over the channel region CH of the power MISFET formation region. This source region SR is contiguous to the trench T.

Figure 39:
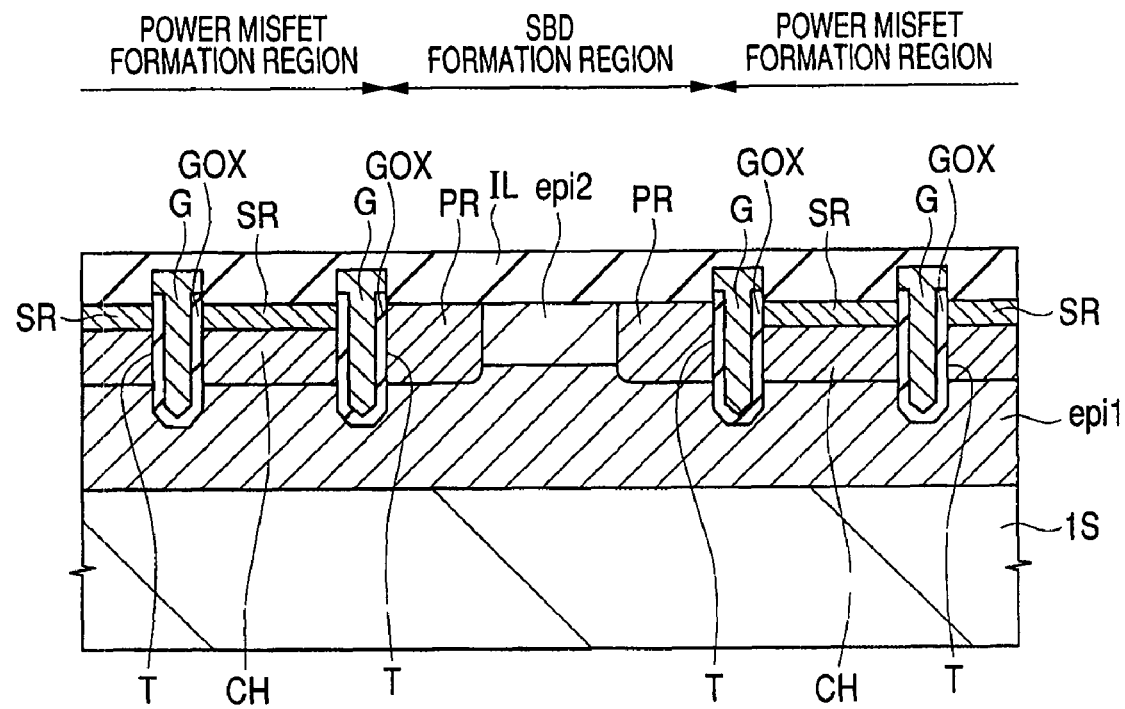
FIG. 39 is a cross-sectional view illustrating a manufacturing step of the semiconductor device following that of FIG. 38.
Figure 40:
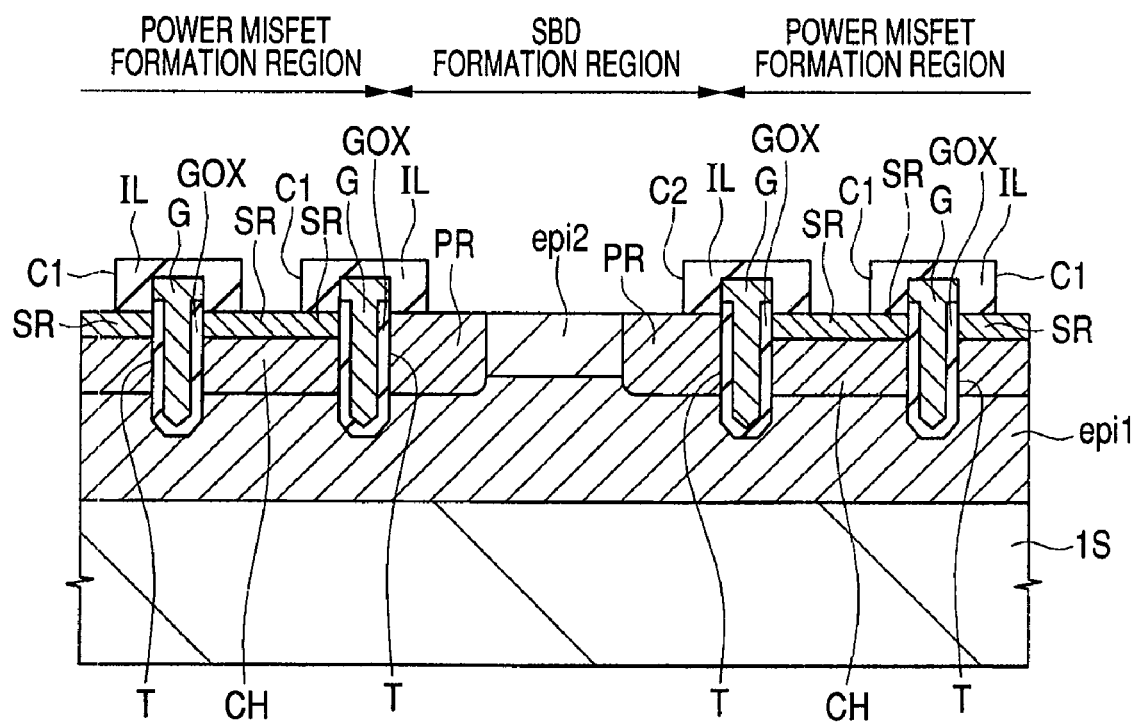
FIG. 40 is a cross-sectional view illustrating a manufacturing step of the semiconductor device following that of FIG. 39.

As illustrated in FIG. 39, after removal of the patterned resist film R2, an interlayer insulating film IL is formed over the multilayer substrate. The interlayer insulating film IL is made of, for example, a PSG (Phospho Silicate Glass) film. As illustrated in FIG. 40, a contact hole C1 and a contact hole C2 are formed in the interlayer insulating film IL by using photolithography and etching. The contact hole C1 is formed in the power MISFET formation region, while the contact hole C2 is formed in the SBD formation region.

Figure 41:
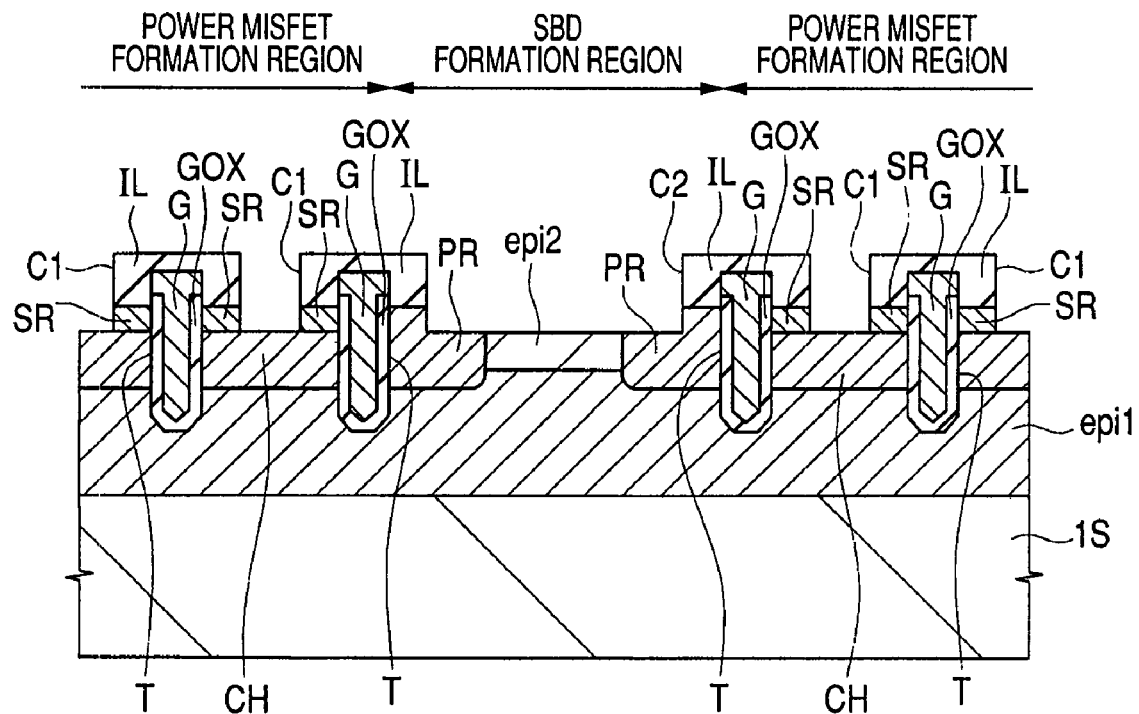
FIG. 41 is a cross-sectional view illustrating a manufacturing step of the semiconductor device following that of FIG. 40.

As illustrated in FIG. 41, the contact hole C1 and the contact hole C2 formed in the interlayer insulating film IL are extended to the inside of the multilayer substrate. Described specifically, in the power MISFET formation region, the contact hole C1 is formed so that it penetrates through the source region SR and reaches the channel region CH. The contact hole C2 is formed simultaneously with the contact hole C1 so that the surface of the epitaxial layer epi2 is etched also in the SBD formation region.

As a result, in the SBD formation region, phosphorus or the like segregated on the surface of the epitaxial layer epi2 due to heat treatment can be removed. When the epitaxial layer epi2 is not opened to a predetermined depth by the contact hole C2, a Schottky junction is formed in a region of the epitaxial layer epi2 where phosphorus has been segregated. In this case, due to the phosphorus thus segregated, the doping concentration of the semiconductor layer forming a Schottky junction becomes high. This inconveniently leads to a reduction in the avalanche breakdown voltage of the Schottky barrier diode SBD. By removing the region of the epitaxial layer epi2 where phosphorus has been segregated by forming the contact hole C2, reduction in the avalanche breakdown voltage of the Schottky barrier diode SBD can be suppressed.

Figure 42:
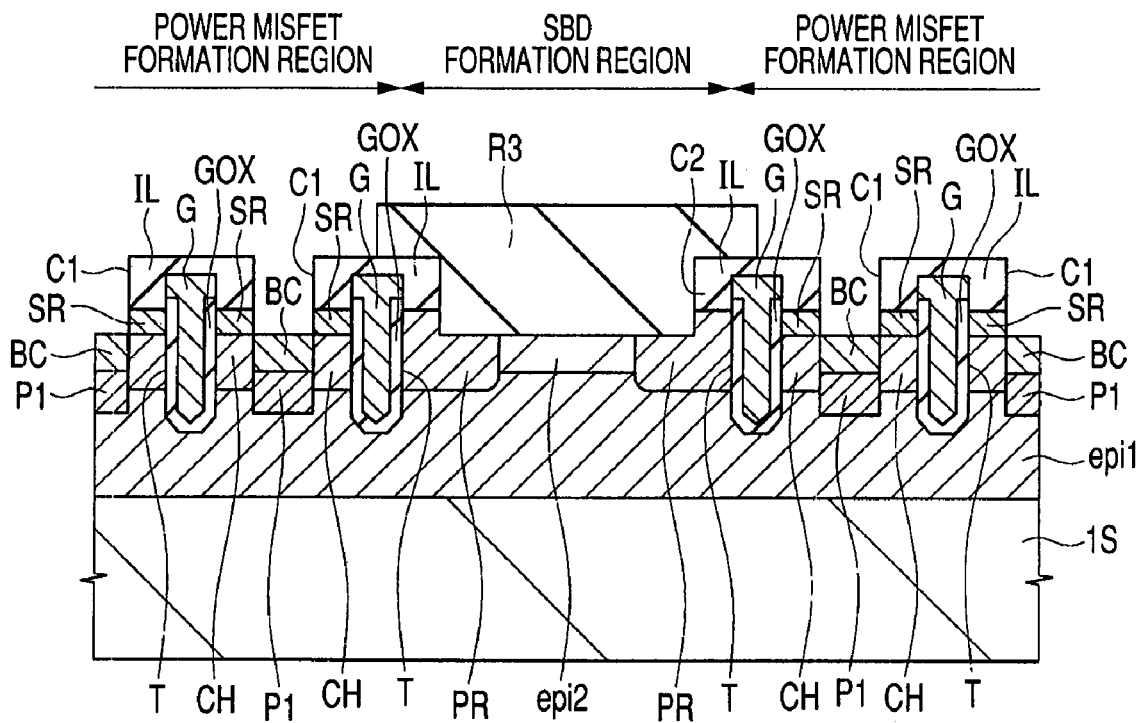
FIG. 42 is a cross-sectional view illustrating a manufacturing step of the semiconductor device following that of FIG. 41.

As illustrated in FIG. 42, a resist film R3 is formed over the interlayer insulating film IL in which the contact hole C1 and the contact hole C2 have been formed. The resulting resist film R3 is subjected to exposure/development treatment to pattern the resist film R3. The patterning of the resist film R3 is performed by exposing the power MISFET formation region while covering the SBD formation region with the resist film R3.

By ion implantation with the patterned resist film R3 as a mask, p type impurities are introduced into the channel region CH exposed from the bottom portion of the contact hole C1. As a result, in the channel region CH at the bottom of the contact hole C1 in the power MISFET formation region, a body contact region BC which is a p type semiconductor region and a first semiconductor region P1 lying therebelow are formed. At this time, the doping concentration of the body contact region BC is higher than the doping concentration of the first semiconductor region P1.

Figure 43:
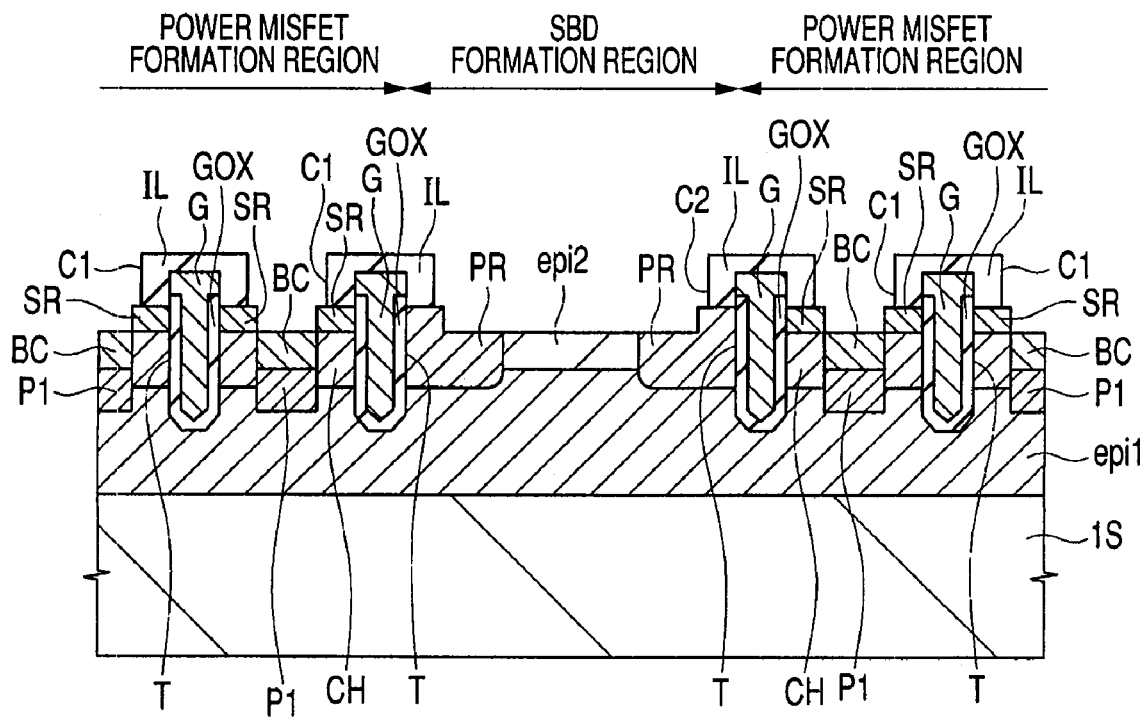
FIG. 43 is a cross-sectional view illustrating a manufacturing step of the semiconductor device following that of FIG. 42.

As illustrated in FIG. 43, after removal of the patterned resist film R3, the multilayer substrate is subjected to sputter pre-cleaning. By this treatment, the surface of the interlayer insulating film IL is etched and the opening diameter of each of the contact hole C1 and the contact hole C2 formed in the interlayer insulating film IL is increased. As a result, the area of the source region SR exposed from the contact hole C1 can be increased.

Figure 44:
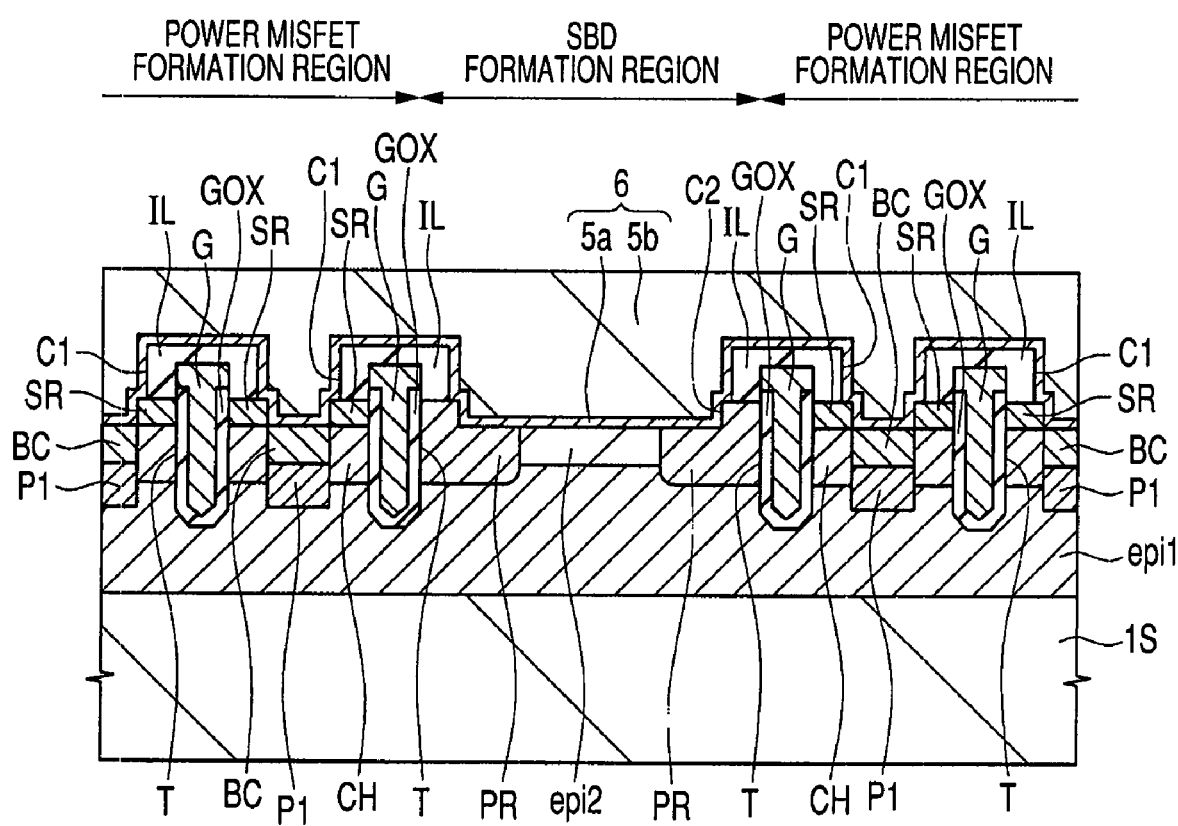
FIG. 44 is a cross-sectional view illustrating a manufacturing step of the semiconductor device following that of FIG. 43.

As illustrated in FIG. 44, a titanium tungsten film 5a is then formed over the interlayer insulating film IL having therein the contact hole C1 and the contact hole C2, followed by the formation of an aluminum film 5b over the titanium tungsten film 5a. The titanium tungsten film 5a can be formed, for example, by using sputtering and it functions as a barrier conductor film. The barrier conductor film is a film for preventing diffusion of, for example, aluminum configuring the aluminum film into silicon. It is a film having a so-called barrier property. The aluminum film 5b is formed over the titanium tungsten film 5a, whereby a first metal film 6 composed of the titanium tungsten film 5a and the aluminum film 5b can be formed.

In the power MISFET formation region, the first metal film 6 is electrically coupled to the source region SR and the body contact region BC and therefore functions as a source electrode. In the SBD formation region, on the other hand, since the titanium tungsten film 5a configuring the first metal film 6 is brought into direct contact with the epitaxial layer epi2, a Schottky junction is formed. This suggests that the first metal film 6 including the titanium tungsten film 5a functions as an anode electrode of the Schottky barrier diode in the SBD formation region.

As illustrated in FIG. 6, after grinding the back side of the semiconductor substrate 1S, a second metal film 7 is formed over the back side of the resulting semiconductor substrate 1S. The second metal film 7 is made of, for example, a gold film and it functions as a drain electrode in the power MISFET formation region, while functions as a cathode electrode in the SBD formation region. In such a manner, the semiconductor device according to Embodiment 1 can be manufactured.

In Embodiment 1, the epitaxial layer formed over the semiconductor substrate 1S is composed of two layers, that is, the epitaxial layer epi1 having a high doping concentration and the epitaxial layer epi2 having a low doping concentration. The boundary between the epitaxial layer epi1 and the epitaxial layer epi2 is formed in a region as deep as the bottom portion of the trench T or shallower than the bottom portion of the trench T. Embodiment 1 is therefore remarkably effective for simultaneously realizing reduction of the on-resistance of the power MISFET and improvement in the avalanche breakdown voltage of the Schottky barrier diode SBD which are in a trade-off relationship.

Embodiment 2

Figure 45:
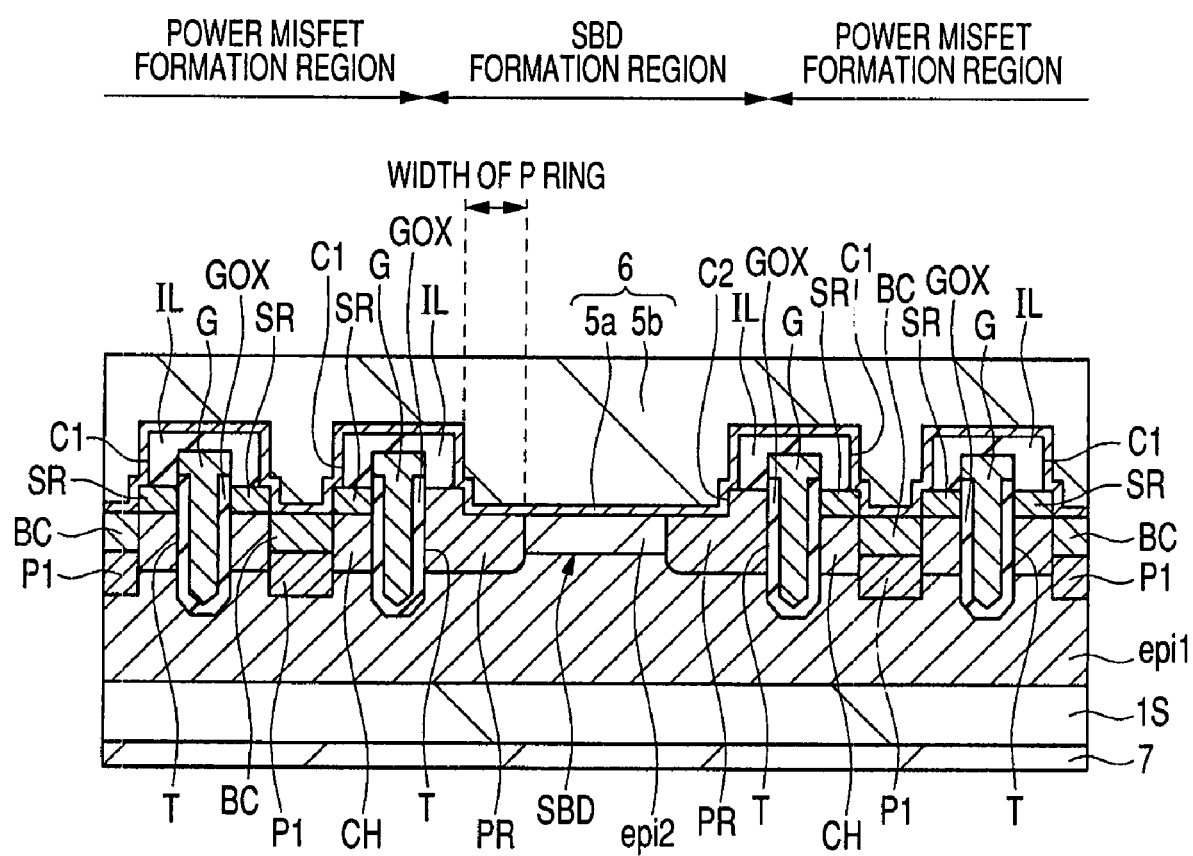
FIG. 45 is a cross-sectional view illustrating a semiconductor device according to Embodiment 2.

In Embodiment 2, a p ring (well layer) formed in end portions of a Schottky barrier diode SBD will be described. FIG. 45 is a cross-sectional view illustrating a semiconductor device according to Embodiment 2. It has a similar configuration to that of the semiconductor device of Embodiment 1 illustrated in FIG. 6 except that the width of the p ring is shown because attention is paid to the p ring PR in this Embodiment.

As illustrated in FIG. 45, also in Embodiment 2, a power MISFET and a Schottky barrier diode SBD are formed over the same semiconductor substrate 1S. The Schottky barrier diode SBD has a Schottky junction obtained by bringing an epitaxial layer epi2 having a low doping concentration into direct contact with a titanium tungsten film 5a configuring a first metal film 6. The Schottky barrier diode SBD is formed in a Schottky barrier diode SBD formation region. The p ring PR is formed in the end portions of the Schottky barrier diode SBD formation region so as to surround the Schottky barrier diode SBD with the p ring.

The p ring PR is arranged in such a manner because of the following reasons. For example, when the p ring PR is not formed, the epitaxial layer epi2 which is an n type semiconductor region is brought into direct contact with the trench T in the Schottky barrier diode SBD formation region. In this case, by a reverse bias voltage applied to the Schottky barrier diode SBD, a depletion layer extends in the end portions of the Schottky barrier diode SBD and a leakage-current increasing phenomenon occurs.

The end portions of the Schottky barrier diode SBD is therefore surrounded by the p ring PR which is a p type semiconductor region. Formation of this p ring PR enables to reduce the leakage current in the Schottky barrier diode SBD because when a reverse bias voltage is applied to the Schottky barrier diode SBD, the end portions of the Schottky barrier diode SBD can be covered with a depletion-free neutral region. In other words, the p ring PR which is a p type semiconductor region has a function of reducing a leakage current which occurs in the end portions of the Schottky barrier diode SBD when a reverse bias voltage is applied to the Schottky barrier diode SBD.

Figure 46:
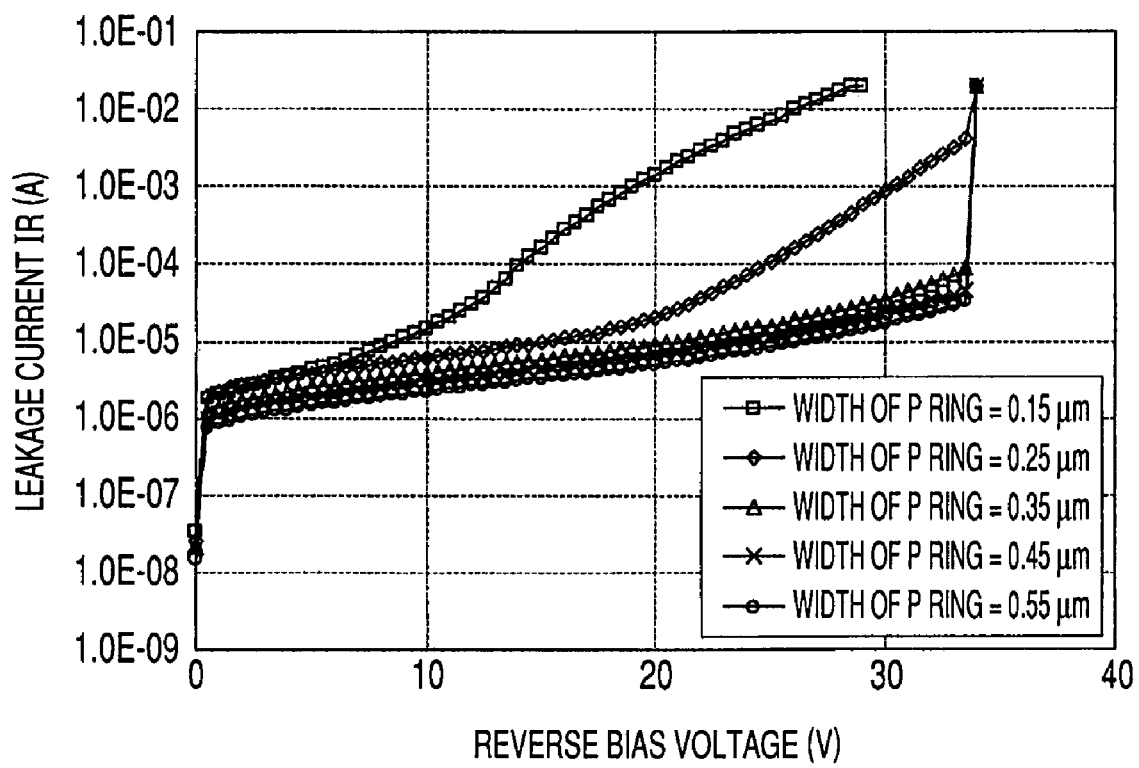
FIG. 46 is a graph showing the relationship between a reverse bias voltage VR to be applied to the Schottky barrier diode and a leakage current flowing through the Schottky barrier diode SBD.

A decrease in the width of the p ring PR however leads to an increase in the leakage current of the Schottky barrier diode SBD. The p ring PR is therefore required to have an appropriate p ring width. Described specifically, FIG. 46 is a graph showing the relationship between a reverse bias voltage VR to be applied to the Schottky barrier diode SBD and a leakage current IR flowing through the Schottky barrier diode SBD. In FIG. 46, the reverse bias voltage is plotted on the abscissa, while the leakage current is plotted on the ordinate. FIG. 46 shows the relationship between a reverse bias voltage and a leakage current when the p ring has a width of 0.15 μm, 0.25 μm, 0.35 μm, 0.45 μm and 0.55 μm.

It is apparent from FIG. 46 that when the width of the p ring is 0.35 μm or greater, the leakage current is 1.0E−04A or less even if the reverse bias voltage increases to 30V; and that when the width of the p ring is 0.35 μm or less, the leakage current increases. From the viewpoint of reducing a leakage current of the Schottky barrier diode SBD, it is therefore preferred to adjust the width of the p ring PR to 0.35 μm or greater.

The p ring described in Embodiment 2 is formed when the channel region CH of the power MISFET is formed. In other words, the p ring PR and the channel region CH are formed in one step. The channel region CH and the p ring PR have the same doping concentration. In the channel region CH, the concentration of impurities to be introduced therein is adjusted so as to form an inversion layer when a predetermined voltage equal to or higher than the threshold voltage is applied to a gate electrode G. The p ring PR having the same doping concentration as that of the channel region CH therefore does not have a doping concentration optimum for reducing the leakage current.

In view of this, the p ring PR can also be formed not in a similar step to that of the channel region CH but in a step different therefrom. In this case, the concentration of impurities to be introduced into the p ring PR can be set at a concentration capable of effectively reducing a leakage current. For example, it is possible to make the concentration of impurities to be introduced into the p ring PR higher than the concentration of impurities introduced into the channel region CH or to make the depth of the p ring PR greater than that of the channel region CH. Thus, when the doping concentration or depth of the p ring is set different from that of the channel region CH from the standpoint of reducing a leakage current, narrowing of the width of the p ring compared with that when the p ring PR and the channel region CH are formed in one step is also effective for reducing the leakage current sufficiently.

Figure 47:
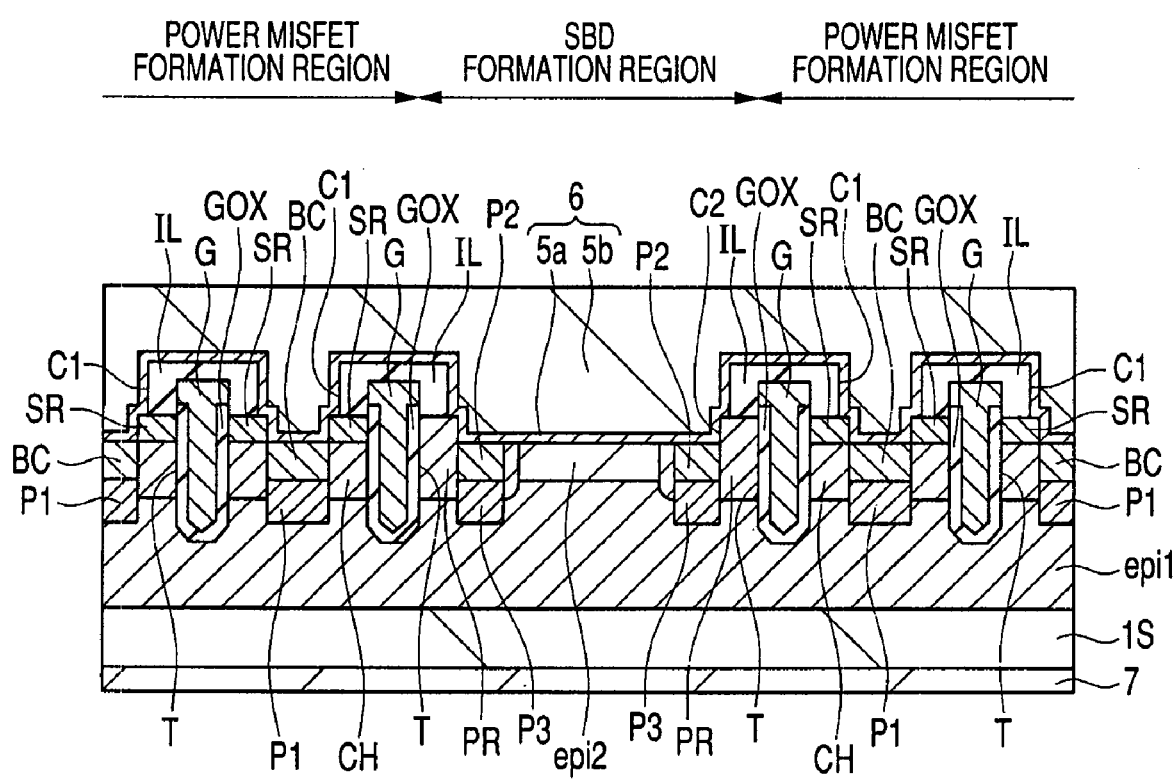
FIG. 47 is a cross-sectional view illustrating the configuration of a semiconductor device which is a modification example of Embodiment 2.

Moreover, the p ring PR preferably has a similar structure to that of the body structure of the power MISFET in order to satisfactorily prevent the avalanche breakdown of the Schottky barrier diode SBD. FIG. 47 is a cross-sectional view illustrating the p ring PR having a similar structure to the body structure of the power MISFET. As illustrated in FIG. 47, the p ring PR has a second semiconductor region P2 and a third semiconductor region P3, which are p type semiconductor regions. The second semiconductor region P2 has a similar structure (doping concentration and depth) to that of the body contact region BC of the power MISFET formation region and this region and the body contact region BC are formed in one step. Similarly, the third semiconductor region P3 has a similar structure (doping concentration and depth) to the first semiconductor region P1 of the power MISFET formation region and this third semiconductor region P3 and the first semiconductor region P1 are formed in one step. Thus the p ring PR having the semiconductor region P2 and the third semiconductor region P3 can have improved avalanche breakdown voltage. In particular, due to the effect of equipping the p ring PR with the second semiconductor region P2 and the third semiconductor region P3 and the effect of placing the body structure of the MISFET and the structure of the p ring PR symmetrical relative to the trench, the avalanche breakdown in the end portions of the Schottky barrier diode can be suppressed sufficiently.

The invention made by the present inventors has so far been described specifically based on embodiments. It should however be borne in mind that the invention is not limited to or by them. It is needless to say that various modifications or changes are possible without departing from the gist thereof.

The present invention can be used widely in the manufacturing industry of semiconductor devices.

What is claimed is:

1. A semiconductor device including a first region having a Schottky barrier diode formed therein and a second region having a power MISFET formed therein,
the first region comprising:
(a1) a semiconductor substrate of a first conductivity type having an upper surface and a lower surface on a side opposite to the upper surface;
(a2) a first semiconductor layer of the first conductivity type formed over the upper surface of the semiconductor substrate;
(a3) a second semiconductor layer of the first conductivity type formed over the first semiconductor layer;
(a4) a first metal film formed over the second semiconductor layer, the first metal film and the second semiconductor layer forming a Schottky junction; and
(a5) a second metal film formed over the lower surface of the semiconductor substrate,
the second region comprising:
(b1) the semiconductor substrate;
(b2) the first semiconductor layer formed over the semiconductor substrate;
(b3) a channel region formed in the first semiconductor layer and having a second conductivity type opposite to the first conductivity type;
(b4) a trench penetrating through the channel region and reaching the first semiconductor layer;
(b5) a gate insulating film formed over an inner wall of the trench;
(b6) a gate electrode formed over the gate insulating film and filled in the trench;
(b7) a source region of the first conductivity type contiguous to the trench and formed over the channel region;
(b8) the first metal film formed over the source region and electrically coupled to the source region; and
(b9) the second metal film formed over the lower surface of the semiconductor substrate,
wherein the first metal film functions as an anode electrode of the Schottky barrier diode in the first region and as a source electrode of the power MISFET in the second region,
wherein the second metal film functions as a cathode electrode of the Schottky barrier diode in the first region and as a drain electrode of the power MISFET in the second region,
wherein the second semiconductor layer has a doping concentration lower than that of the first semiconductor layer, and
wherein a boundary between the first semiconductor layer and the second semiconductor layer is formed in a region as deep as the bottom portion of the trench or in a region shallower than the bottom portion of the trench, and
wherein the second region further comprises:
(b10) a contact hole arranged apart from the trench and having a depth greater than that of the source region;
(b11) a body contact region formed below the bottom portion of the contact hole and comprising a semiconductor region of the second conductivity type; and
(b12) a first semiconductor region contiguous to the body contact region and comprising a semiconductor region of the second conductivity type formed in a region deeper than the body contact region, and
wherein the contact hole is filled with the first metal film.

2. The semiconductor device according to claim 1, wherein the doping concentration of the second semiconductor layer becomes higher with the depth from the surface of the second semiconductor layer in which the Schottky junction has been formed.

3. The semiconductor device according to claim 2, wherein the doping concentration in the surface of the second semiconductor layer in which the Schottky junction has been formed is $8.0 \times 10^{15}/cm^3$ or less.

4. The semiconductor device according to claim 1, wherein the doping concentration of the second semiconductor layer is constant from the surface of the second semiconductor layer where the Schottky junction has been formed to a predetermined depth, and the doping concentration increases as the depth becomes greater than the predetermined depth.

5. The semiconductor device according to claim 4, wherein the doping concentration of the second semiconductor layer from the surface to the predetermined depth is $8.0 \times 10^{15}/cm^3$ or less.

6. The semiconductor device according to claim 1, wherein the doping concentration of the first semiconductor layer increases from the boundary between the first semiconductor layer and the second semiconductor layer toward the boundary between the first semiconductor layer and the semiconductor substrate.

7. The semiconductor device according to claim 1, wherein the first semiconductor layer and the second semiconductor layer are epitaxial layers.

8. The semiconductor device according to claim 1, wherein the first metal film comprises a barrier conductor film and a metal film formed over the barrier conductor film.

9. The semiconductor device according to claim 8, wherein the Schottky junction of the Schottky barrier diode is formed by a contact between the second semiconductor layer and the barrier conductor film.

10. The semiconductor device according to claim 9, wherein the barrier conductor film is a titanium tungsten film.

11. The semiconductor device according to claim 9, wherein the barrier conductor film is a titanium nitride/titanium film stack.

12. The semiconductor device according to claim 9, wherein the barrier conductor film is a cobalt film.

13. The semiconductor device according to claim 8, wherein the metal film is an aluminum film.

14. The semiconductor device according to claim 1, wherein the Schottky barrier diode and the power MISFET are parts of a plurality of elements configuring a DC/DC converter for converting a voltage value of a DC current voltage.

15. The semiconductor device according to claim 14,
wherein the power MISFET is a synchronous rectification power MISFET configuring the DC/DC converter, and
wherein the Schottky barrier diode is coupled in parallel to the power MISFET.

16. The semiconductor device according to claim 1, wherein the doping concentration of the body contact region is higher than the doping concentration of the first semiconductor region.

17. The semiconductor device according to claim 16,
wherein the first region is sandwiched between the second regions, and
wherein the first region has, at both ends thereof, well layers comprising a semiconductor layer of the second conductivity type so as to sandwich the Schottky barrier diode formed in the first region between the well layers, and
wherein the doping concentration of the well layers is different from the doping concentration of the channel region formed in the second region.

18. The semiconductor device according to claim 17, wherein the first region further comprises:
- (a6) a second semiconductor region of the second conductivity type which is contiguous to the first metal film and arranged in the well layer; and
- (a7) a third semiconductor layer of the second conductivity type which is contiguous to the second semiconductor region and formed in a region deeper than the second semiconductor region, wherein the second semiconductor region formed in the first region has a similar structure to that of the body contact region formed in the second region, and wherein the third semiconductor region formed in the first region has a similar structure to that of the first semiconductor region formed in the second region.

19. A manufacturing method of a semiconductor device, comprising the steps of:
- (a) preparing a multilayer substrate having a semiconductor substrate of a first conductivity type, a first semiconductor layer of the first conductivity type formed over the semiconductor substrate, and a second semiconductor layer of the first conductivity type formed over the first semiconductor layer and having a doping concentration lower than that of the first semiconductor layer;
- (b) forming a trench in a second region of the multilayer substrate in which a power MISFET is to be formed;
- (c) forming a gate insulating film over an inner wall of the trench;
- (d) forming a gate electrode over the gate insulating film so as to fill the trench with the gate electrode;
- (e) forming a channel region of a second conductivity type opposite to the first conductivity type in the second region of the multilayer substrate;
- (f) forming, in the second region of the multilayer substrate, a source region contiguous to the trench and comprising a semiconductor region of the first conductivity type;
- (g) forming a contact hole in the second region of the multilayer substrate, wherein the contact hole is arranged apart from the trench and has a depth greater than that of the source region;
- (h) forming a body contact region of the second conductivity type under a bottom portion of the contact hole;
- (i) forming a first semiconductor region of the second conductivity type under the body contact region, wherein the first semiconductor region is contiguous to the body contact region;
- (j) forming a first metal film which is contiguous to the source region and the body contact region in the second region of the multilayer substrate and which is contiguous to the second semiconductor layer to form a Schottky junction in a first region of the multilayer substrate in which a Schottky barrier diode is to be formed; and
- (k) forming a second metal film over a lower surface of the semiconductor substrate included in the multilayer substrate, wherein the first metal film serves as a source electrode of the power MISFET in the second region and serves as an anode electrode of the Schottky barrier diode in the first region, wherein the second metal film serves as a drain electrode of the power MISFET in the second region and serves as a cathode electrode of the Schottky barrier diode in the first region, and wherein, after completion of the power MISFET and the Schottky barrier diode, a boundary between the first semiconductor layer and the second semiconductor layer is present in a region as deep as or shallower than the bottom portion of the trench.

20. The manufacturing method of a semiconductor device according to claim 19, wherein the second semiconductor layer after completion of the power MISFET and the Schottky barrier diode includes a residual region having a doping concentration equal to that of the second semiconductor layer during the step (a).

21. The manufacturing method of a semiconductor device according to claim 20, wherein the steps until the completion of the power MISFET and the Schottky barrier diode comprise a step of heat treating the multilayer substrate.

22. The manufacturing method of a semiconductor device according to claim 21, wherein the heat treatment step decreases the thickness of the second semiconductor layer.

23. The manufacturing method of a semiconductor device according to claim 21, wherein the boundary between the second semiconductor layer and the first semiconductor layer becomes shallower by the heat treatment step.

24. The manufacturing method of a semiconductor device according to claim 23, wherein the doping concentration of the first semiconductor layer increases from a shallow region in which the upper surface of the first semiconductor layer has been formed toward a deep region in which the lower surface of the first semiconductor layer has been formed.

* * * * *